(12) United States Patent
Iwao et al.

(10) Patent No.: US 10,741,422 B2
(45) Date of Patent: Aug. 11, 2020

(54) SUBSTRATE PROCESSING DEVICE AND SUBSTRATE PROCESSING METHOD

(71) Applicant: SCREEN Holdings Co., Ltd., Kyoto (JP)

(72) Inventors: Michinori Iwao, Kyoto (JP); Noriyuki Kikumoto, Kyoto (JP); Shuichi Yasuda, Kyoto (JP); Kazuhiro Fujita, Kyoto (JP); Mizuki Osawa, Kyoto (JP); Hiroshi Ebisui, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 16/320,127

(22) PCT Filed: Sep. 7, 2017

(86) PCT No.: PCT/JP2017/032332
§ 371 (c)(1),
(2) Date: Jan. 24, 2019

(87) PCT Pub. No.: WO2018/056067
PCT Pub. Date: Mar. 29, 2018

(65) Prior Publication Data
US 2019/0262851 A1    Aug. 29, 2019

(30) Foreign Application Priority Data

Sep. 21, 2016  (JP) ................................. 2016-184085
Jun. 30, 2017  (JP) ................................. 2017-129559

(51) Int. Cl.
*H01L 21/67* (2006.01)
*B05B 14/00* (2018.01)
(Continued)

(52) U.S. Cl.
CPC ........ *H01L 21/67023* (2013.01); *B05B 14/00* (2018.02); *B08B 3/022* (2013.01);
(Continued)

(58) Field of Classification Search
None
See application file for complete search history.

(56) References Cited

U.S. PATENT DOCUMENTS

2003/0226577 A1  12/2003  Orll et al. .................... 134/1.3
2006/0219264 A1* 10/2006  Miya ................. H01L 21/67051
                                                              134/21

FOREIGN PATENT DOCUMENTS

JP    H09-007993 A    1/1997
JP    2003-309102 A   10/2003
(Continued)

OTHER PUBLICATIONS

International Search Report dated Dec. 5, 2017 in corresponding PCT International Application No. PCT/JP2017/032332.
(Continued)

*Primary Examiner* — Jiong-Ping Lu
(74) *Attorney, Agent, or Firm* — Ostrolenk Faber LLP

(57) ABSTRACT

A substrate processing apparatus includes a substrate holder that holds a substrate, a processing liquid piping that is communicatively connected with a discharge port for discharging a processing liquid, a processing liquid supplier that supplies the processing liquid to the processing liquid piping, a suction unit for suctioning the processing liquid present inside the processing liquid piping, and a controller which controls the processing liquid supplying unit and the suction unit. The controller executes a processing liquid supplying step that supplies the processing liquid to the processing liquid piping and a suctioning step that suctions the processing liquid inside the processing liquid piping by the suction unit. The controller selectively executes a first suctioning step and a second suctioning step of the processing liquid.

9 Claims, 29 Drawing Sheets

(51) Int. Cl.
  *B08B 3/02* (2006.01)
  *H01L 21/02* (2006.01)
  *H01L 21/306* (2006.01)

(52) U.S. Cl.
  CPC .. *H01L 21/02041* (2013.01); *H01L 21/02052* (2013.01); *H01L 21/02057* (2013.01); *H01L 21/306* (2013.01); *H01L 21/67017* (2013.01); *H01L 21/67028* (2013.01); *H01L 21/67051* (2013.01)

(56) References Cited

FOREIGN PATENT DOCUMENTS

| | | |
|---|---|---|
| JP | 2006-278655 A | 10/2006 |
| JP | 2015-070157 A | 4/2015 |
| JP | 2015-135843 A | 7/2015 |
| JP | 2016-111306 A | 6/2016 |

OTHER PUBLICATIONS

Written Opinion dated Dec. 5, 2017 in corresponding PCT International Application No. PCT/JP2017/032332.
International Preliminary Report on Patentability (Chapter I) dated Apr. 4, 2019 with a Notification from the International Bureau (Form PCT/IB/326) in corresponding PCT International Application No. PCT/JP2017/032332 in Japanese.
International Preliminary Report on Patentability (Chapter I) dated Apr. 4, 2019 with a Notification from the International Bureau (Form PCT/IB/338) in corresponding PCT International Application No. PCT/JP2017/032332 in English.
Second and Supplementary Notice Informing the Application to the Application of the International Application dated Jan. 24, 2019 (to designated offices which apply the 30 month time limit under Article 22(1)) (Form PCT/IB/308) in corresponding PCT International Application No. PCT/JP2017/032332.

* cited by examiner

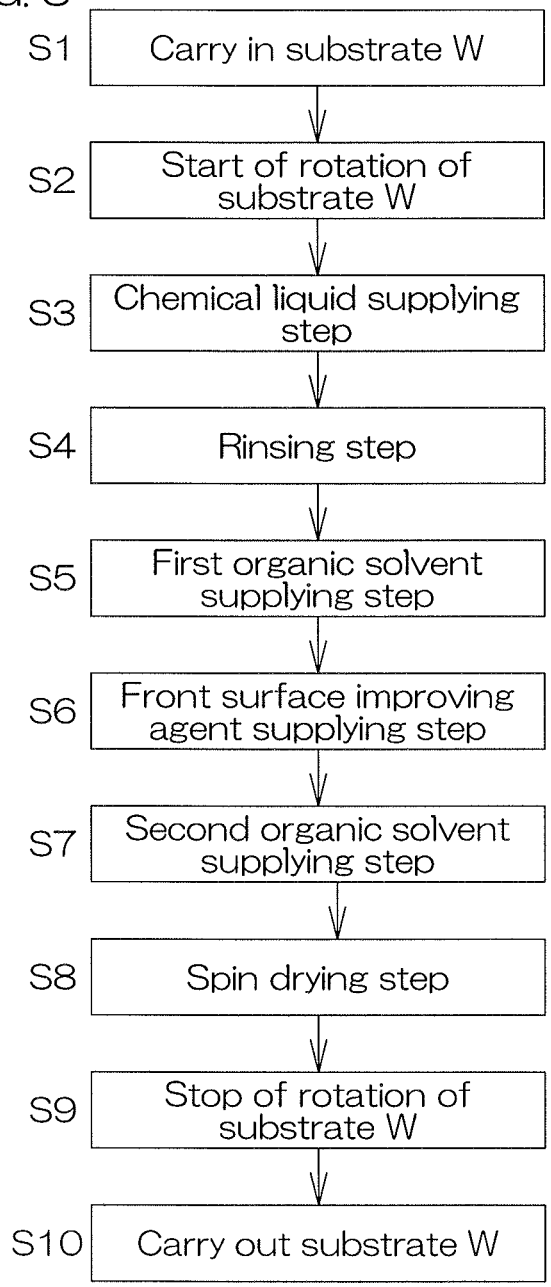

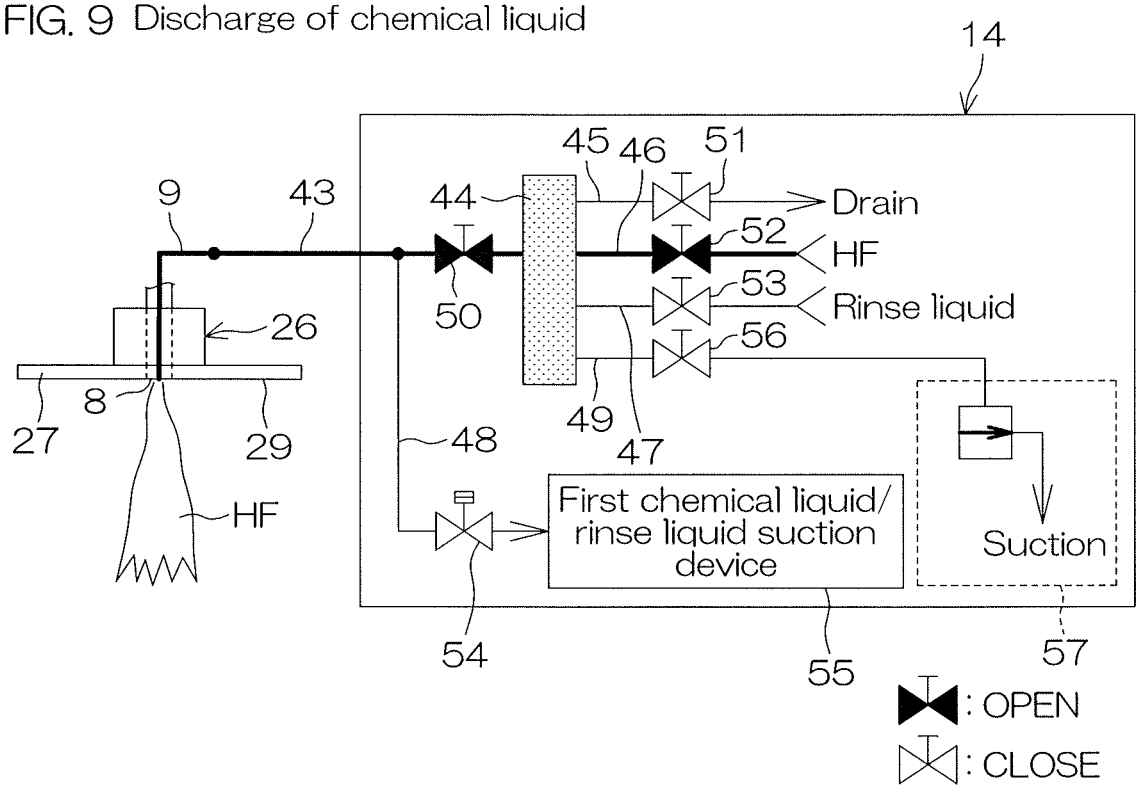
FIG. 9 Discharge of chemical liquid
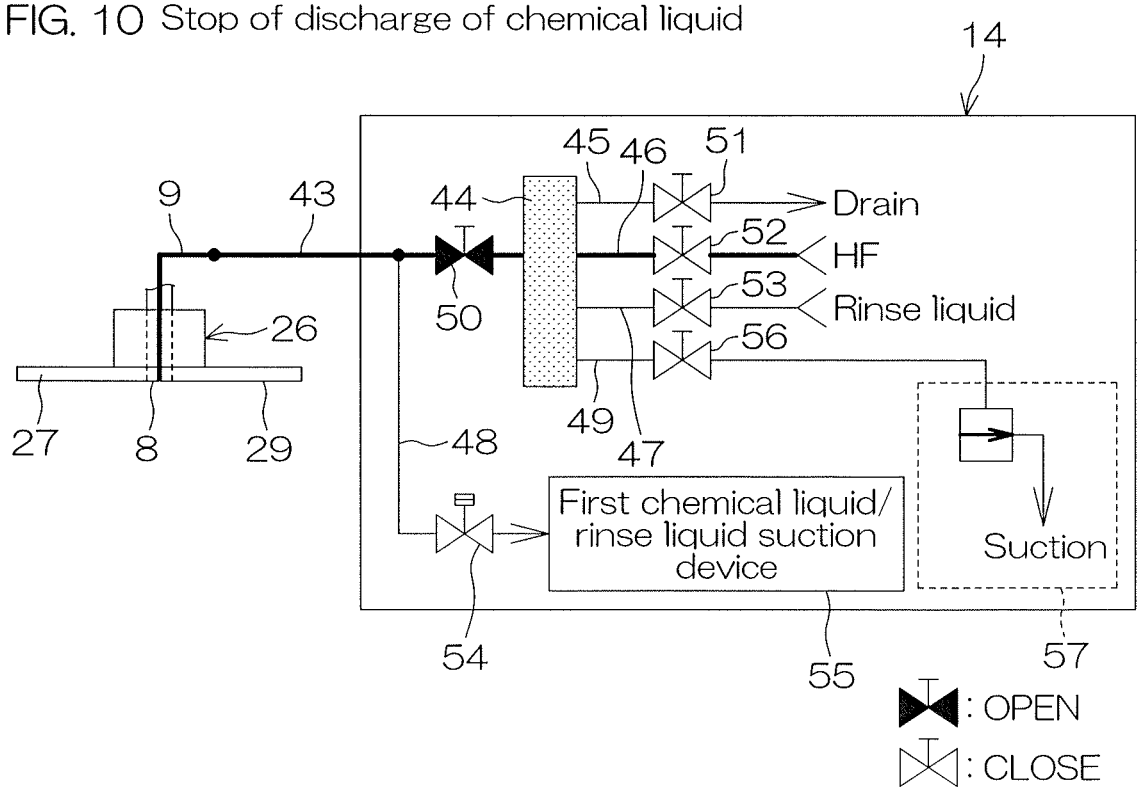
FIG. 10 Stop of discharge of chemical liquid FIG. 11 Suction of chemical liquid (weak)
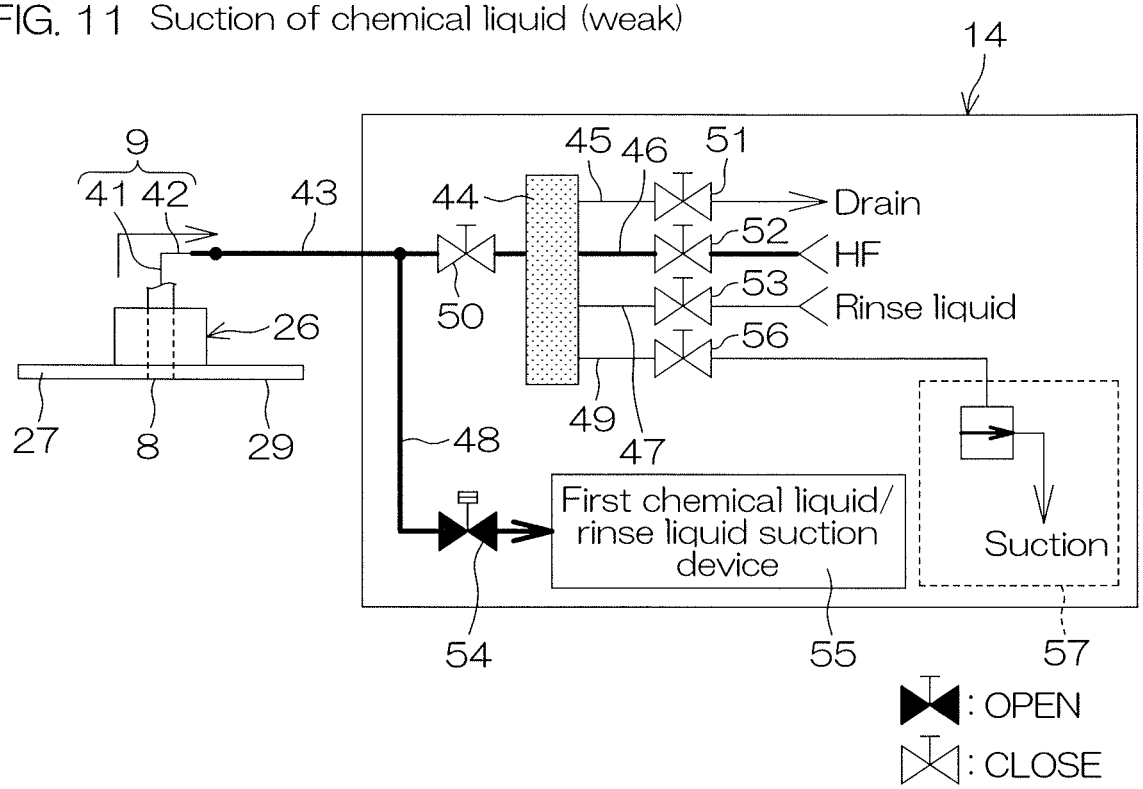
FIG. 12 Suction of chemical liquid (strong)
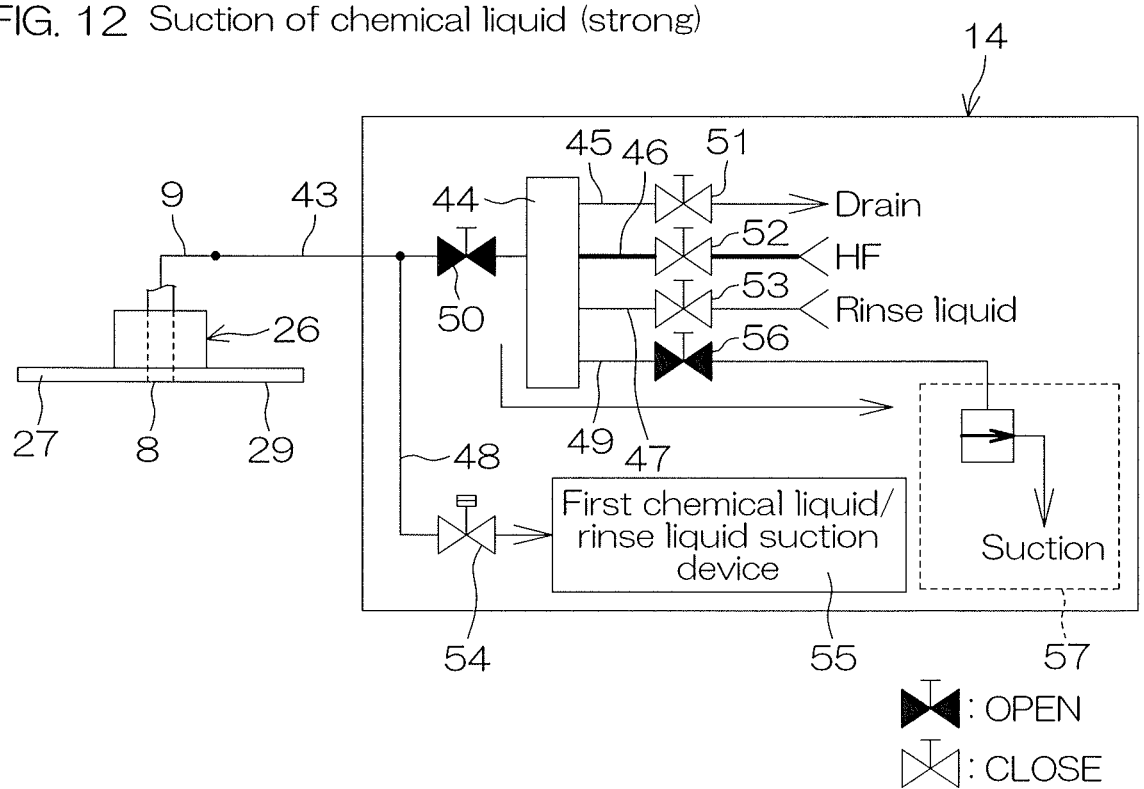

FIG. 13  Discharge of organic solvent
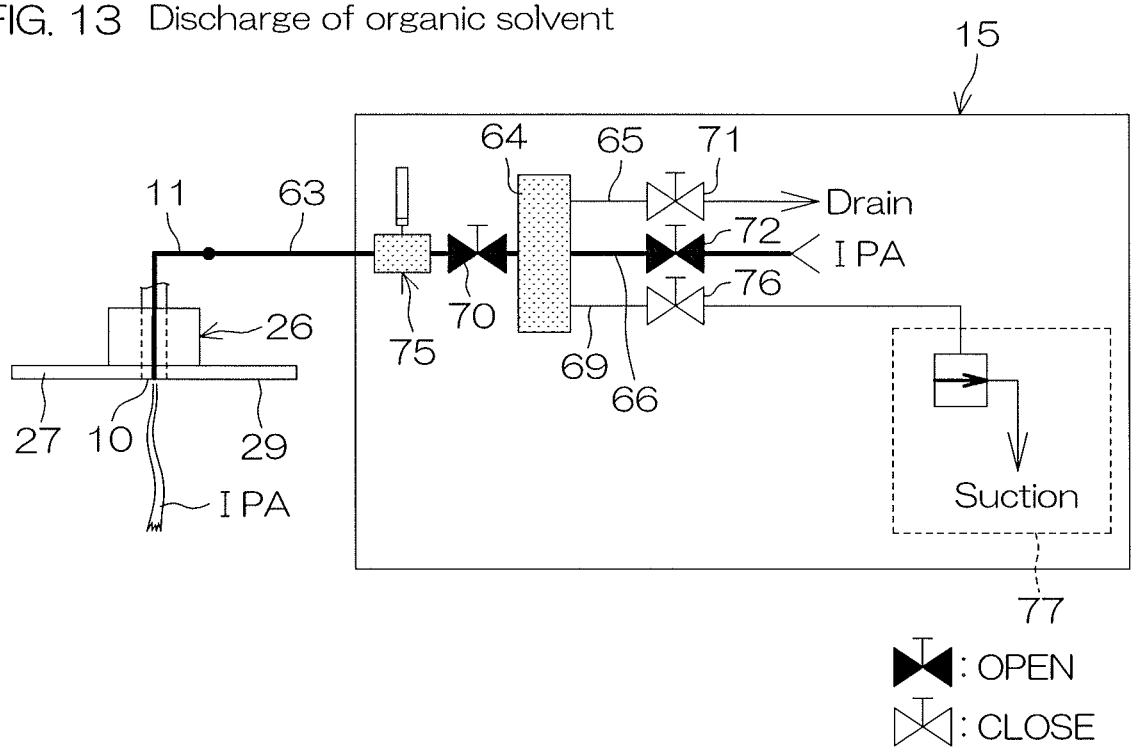
FIG. 14  Stop of discharge of organic solvent
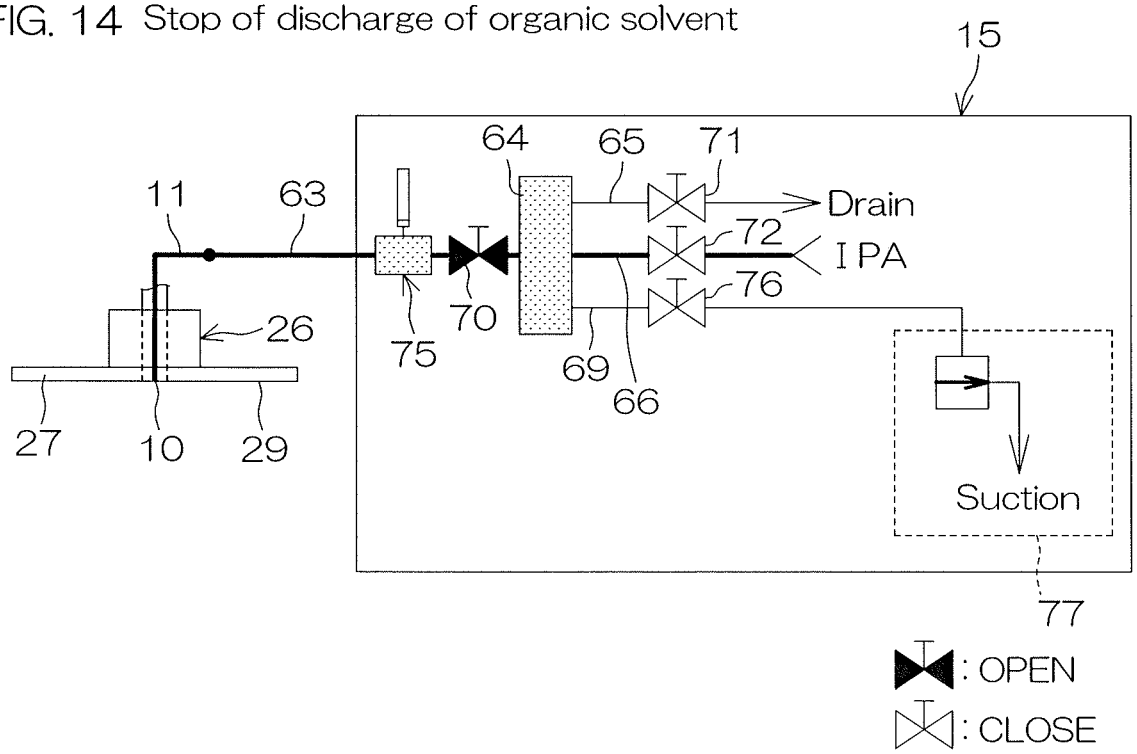

FIG. 15  Suction of organic solvent (weak)
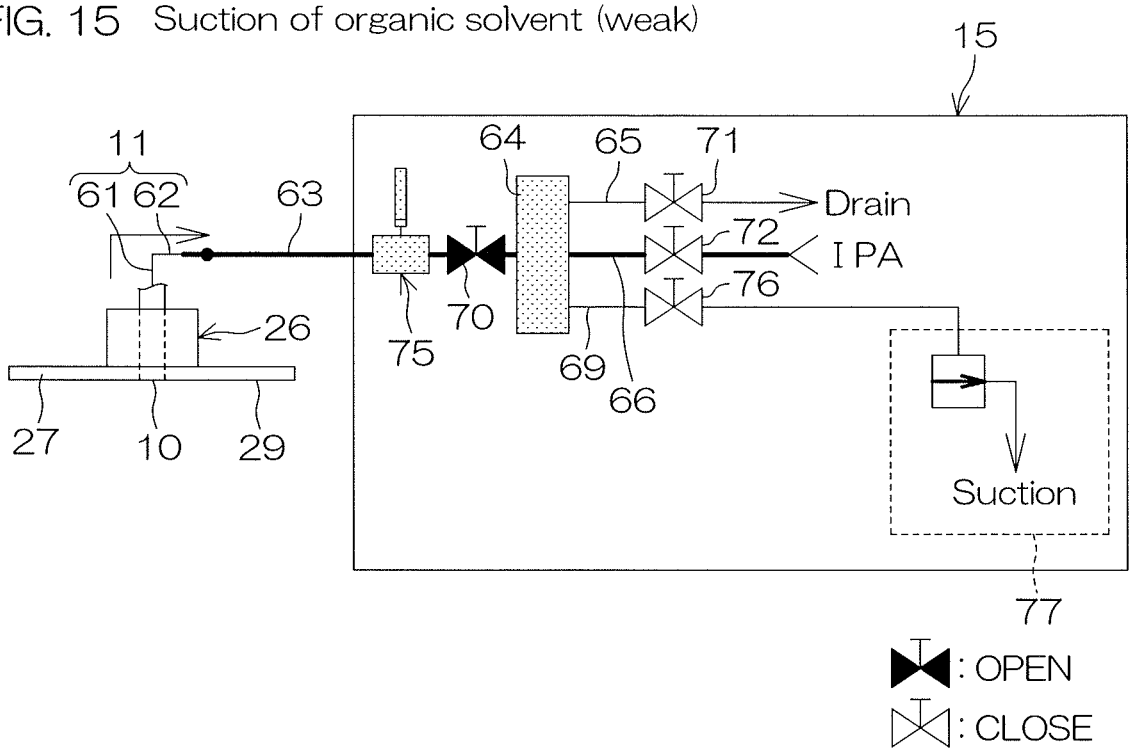
FIG. 16  Suction of organic solvent (strong)
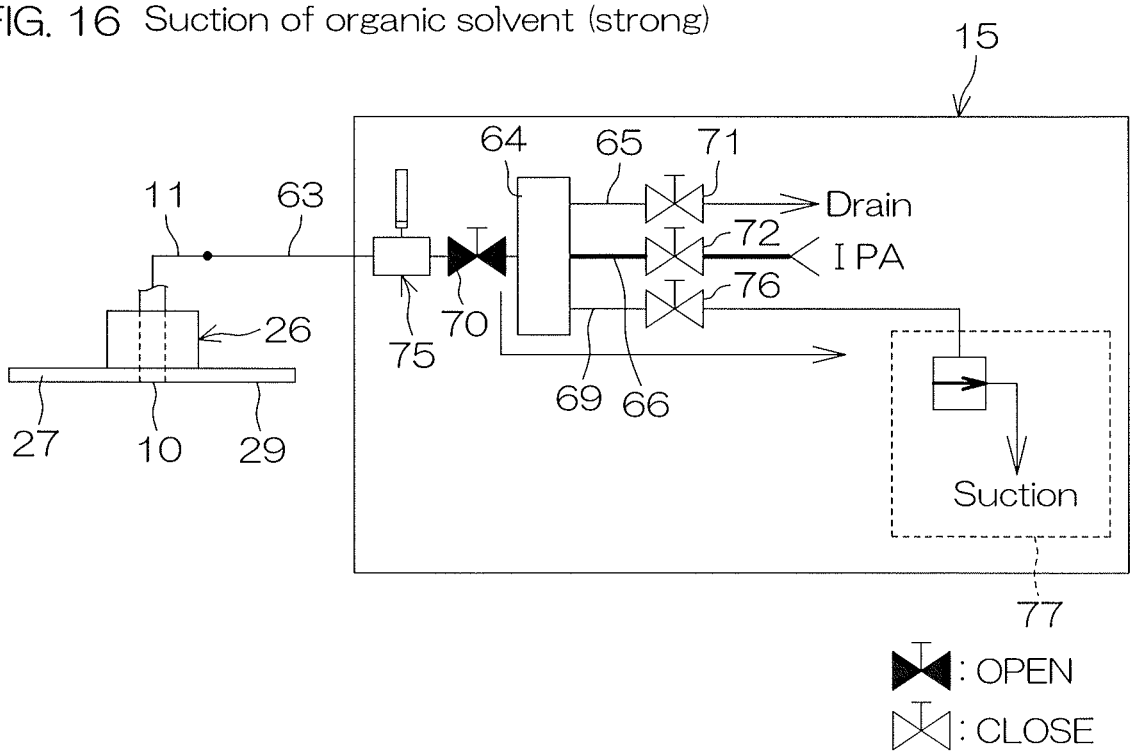

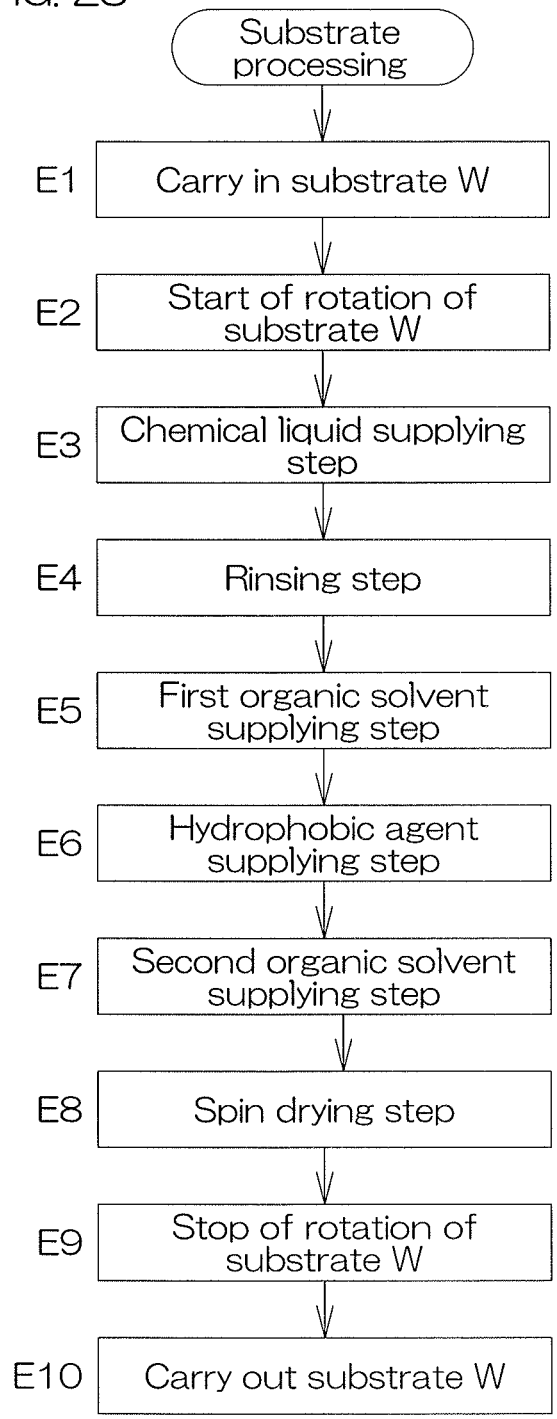

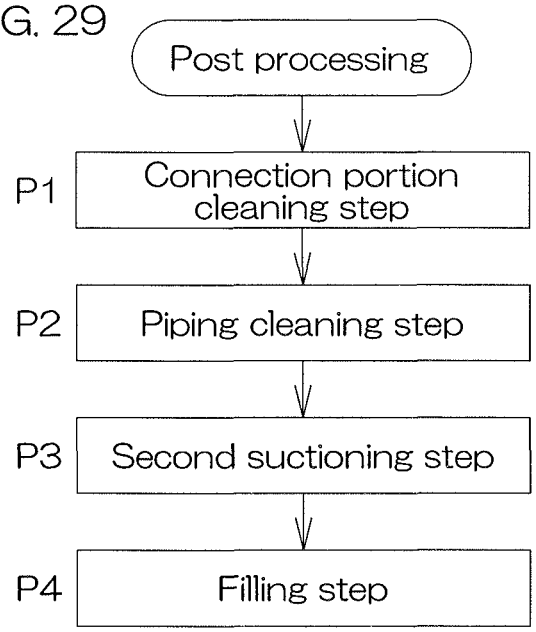

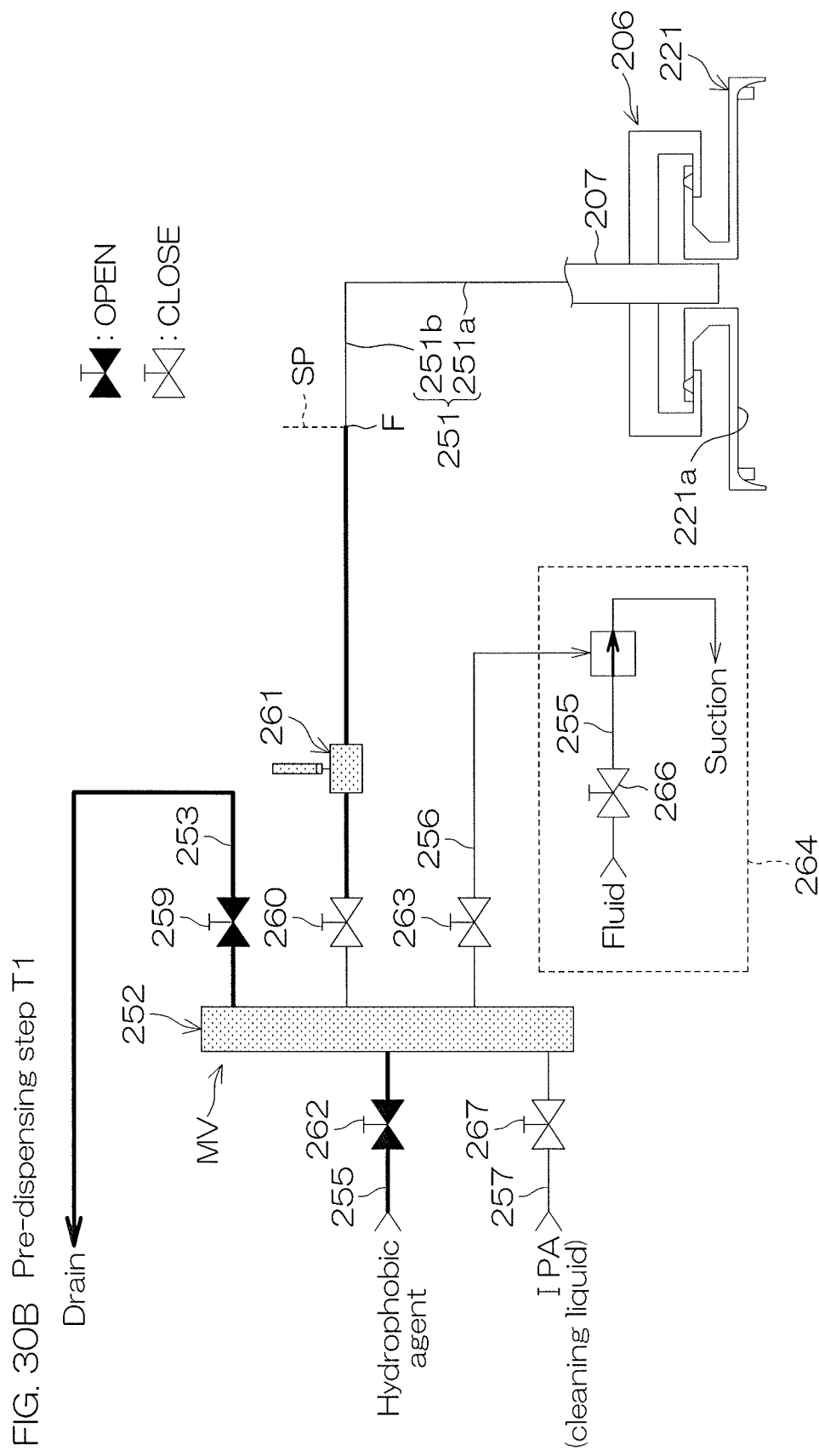

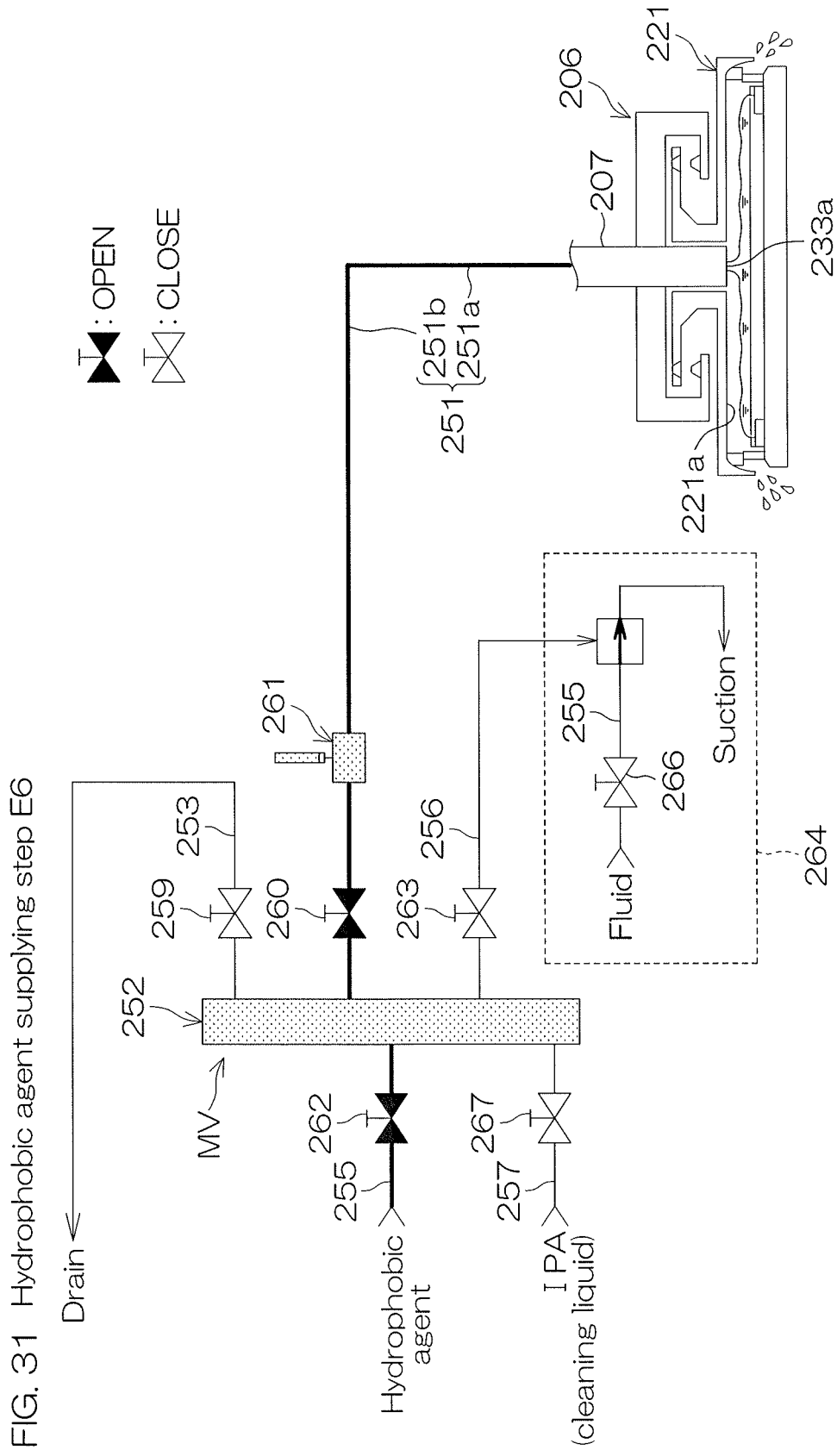
FIG. 31 Hydrophobic agent supplying step E6

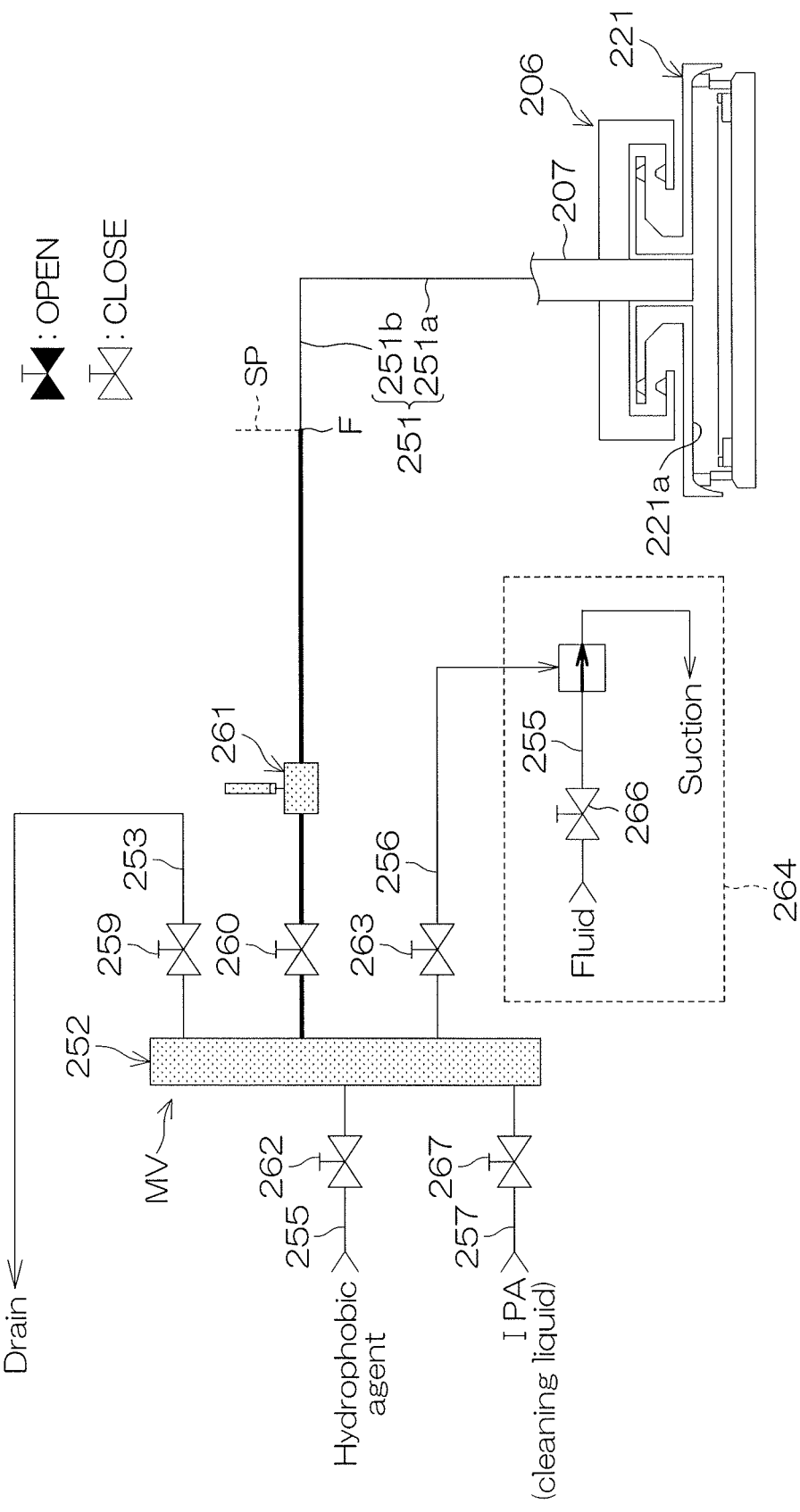
FIG. 32 First suctioning step

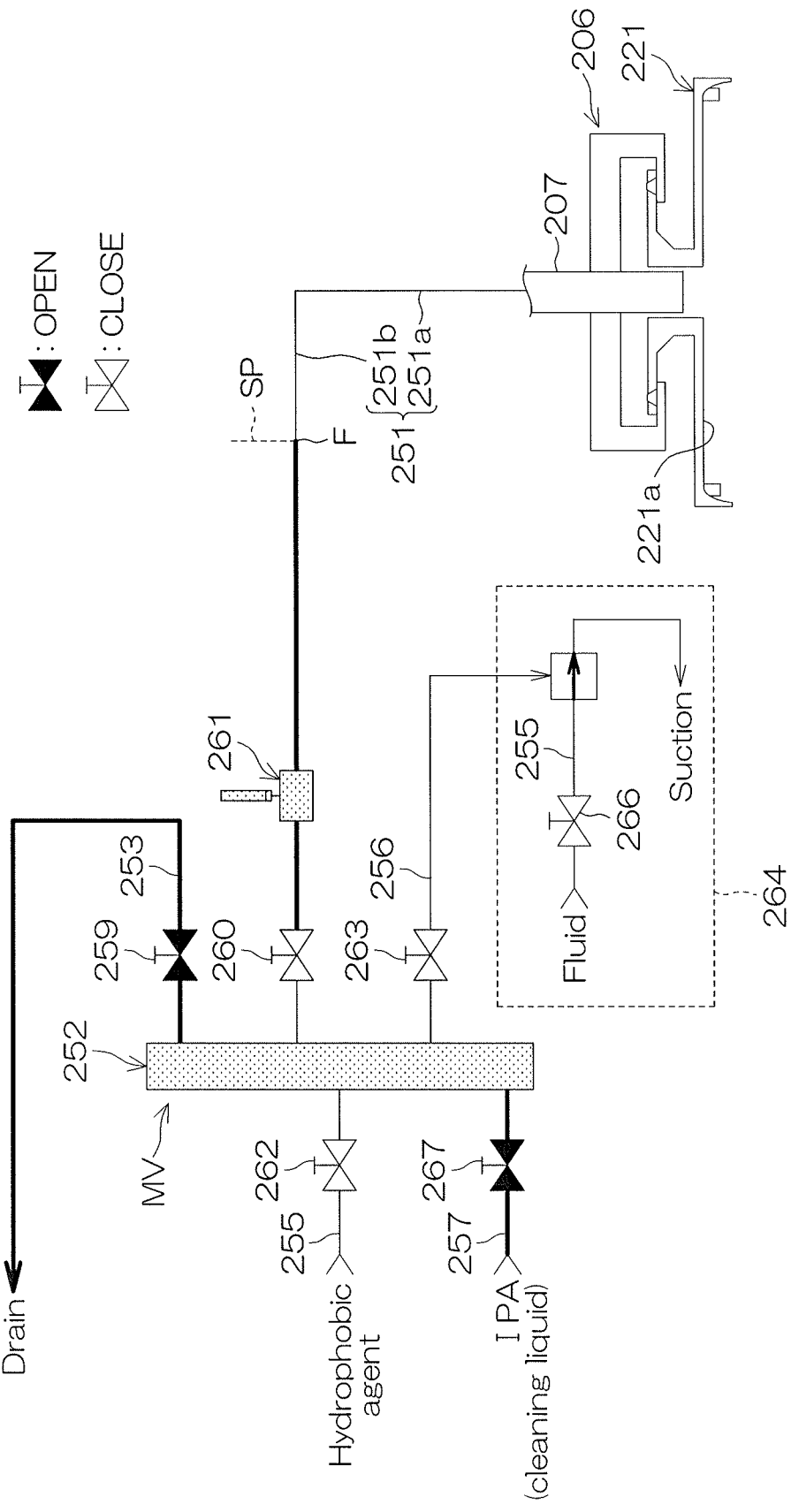
FIG. 33 Connection portion cleaning step P1

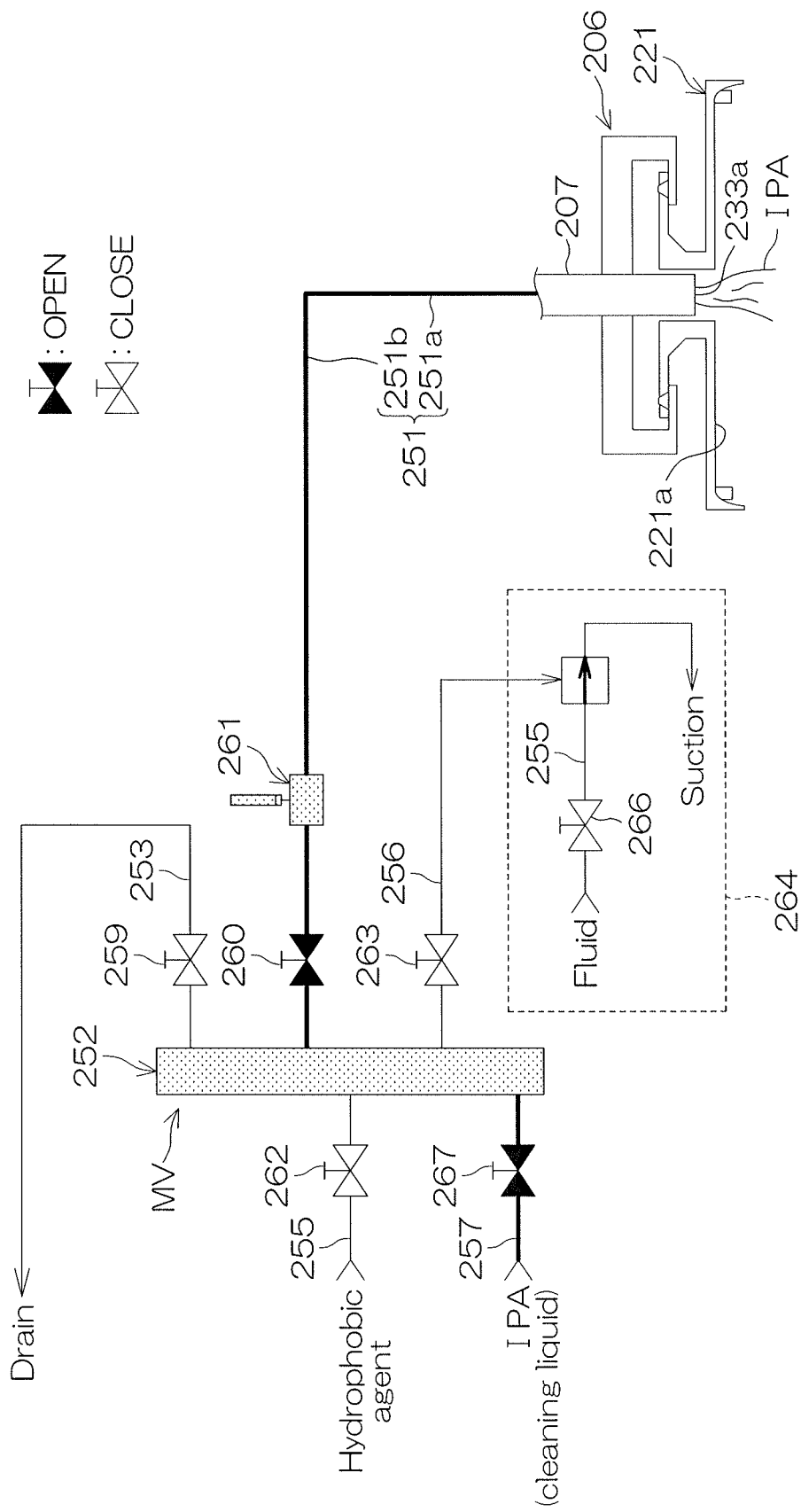
FIG. 34 Piping cleaning step P2

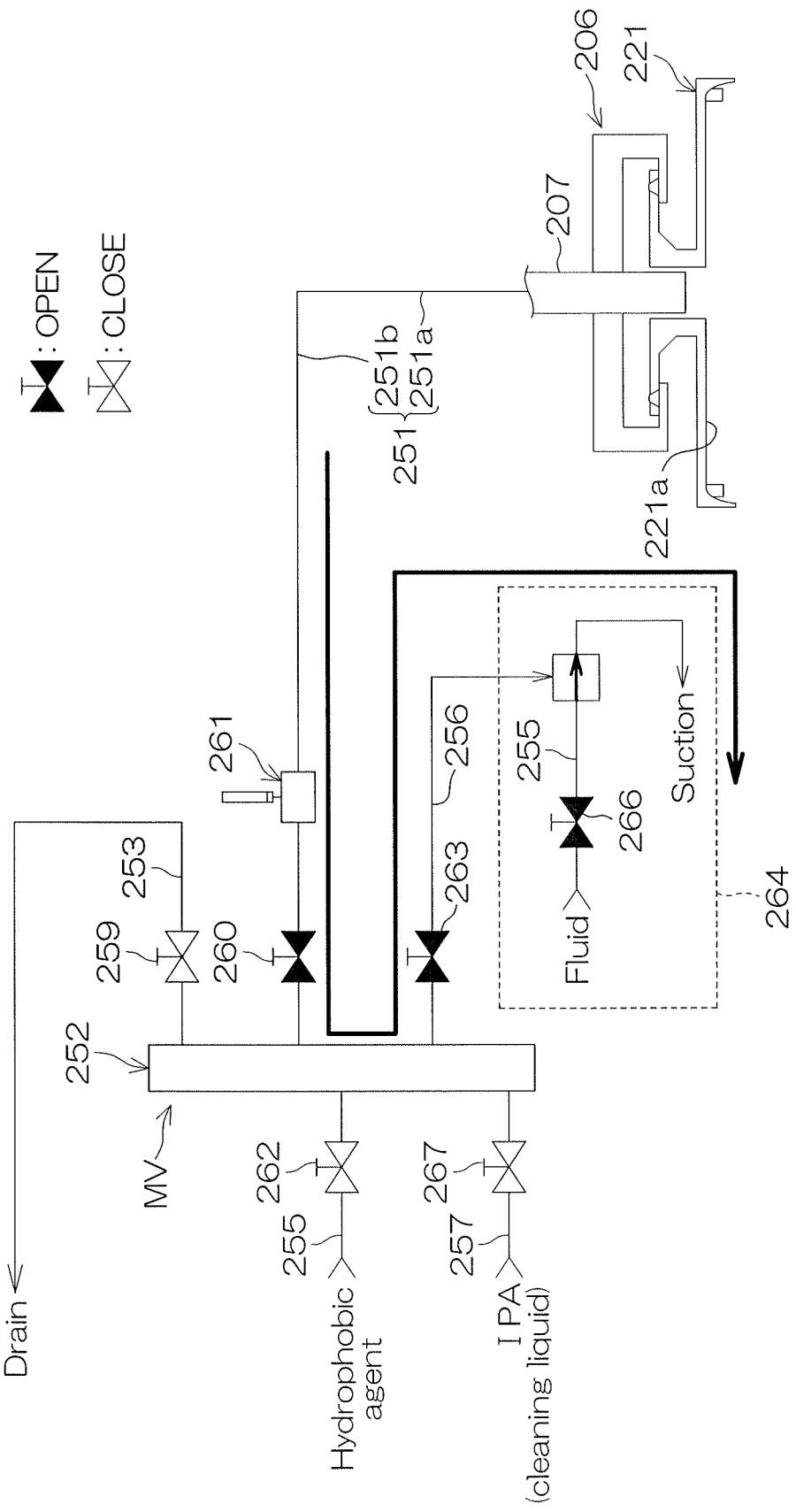
FIG. 35 Second suctioning step P3

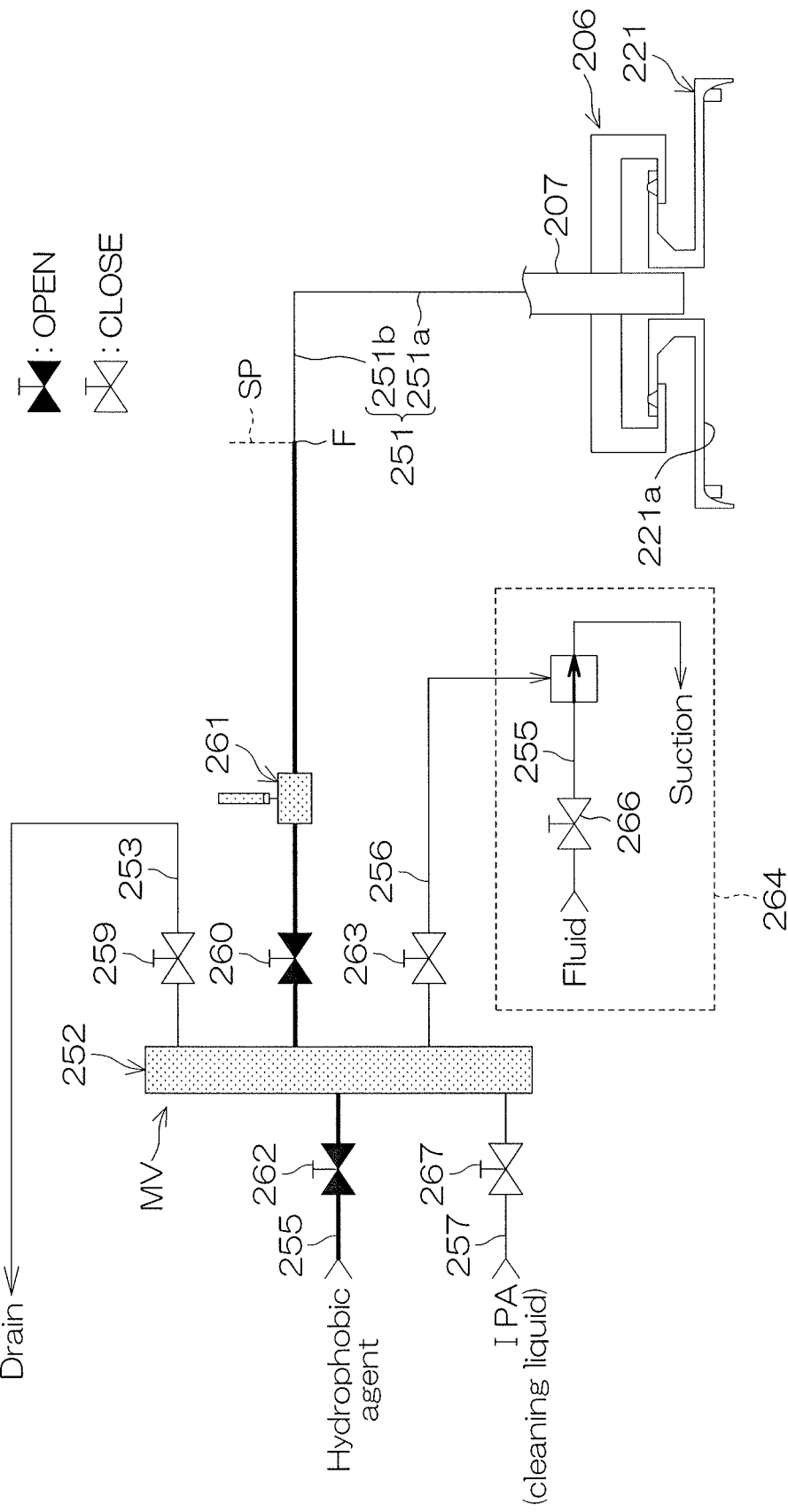
FIG. 36 Filling step P4

SUBSTRATE PROCESSING DEVICE AND SUBSTRATE PROCESSING METHOD

CROSS-REFERENCE TO RELATED APPLICATIONS

The present application is a 35 U.S.C. §§ 371 national phase conversion of PCT/JP2017/032332, filed Sep. 7, 2017, which claims priority to Japanese Patent Application Nos. 2016-184085 and 2017-129559, filed Sep. 21, 2016 and Jun. 30, 2017, respectively, the contents of all of which are incorporated herein by reference. The PCT International Application was published in the Japanese language.

TECHNICAL FIELD

The present invention relates to a substrate processing apparatus and a substrate processing method. Examples of substrates to be processed include substrates such as semiconductor wafers, substrates for liquid crystal displays, substrates for FPDs (flat panel displays) such as organic ELs (electroluminescence), substrates for optical disks, substrates for magnetic disks, substrates for magneto-optical disks, substrates for photomasks, ceramic substrates, substrates for solar cells, etc.

BACKGROUND ART

In a manufacturing process for a semiconductor device or a liquid crystal device, etc., a substrate processing apparatus arranged to process substrates such as semiconductor wafers, glass substrates for liquid crystal display devices, etc., is used. A single substrate processing type substrate processing apparatus that processes substrates one at a time includes, for example, a spin chuck which rotates a substrate while holding it horizontally, a facing member which faces the substrate held by the spin chuck from above, a central axis nozzle which is housed at a central opening formed at a central portion of the facing member, a processing liquid piping which supplies a processing liquid to the central axis nozzle, and a suction device which suctions a processing liquid in an interior of the processing liquid piping. The facing member is a member which comes close to an upper surface of a substrate to shield the upper surface from a space in a periphery thereof. It is known that, after discharge of a processing liquid, the processing liquid is suctioned and a leading end surface of the processing liquid inside the central axis nozzle is allowed to recede.

CITATION LIST

Patent Literature

Patent Literature 1: Japanese Patent Unexamined Application Publication No. 2015-135843

SUMMARY OF INVENTION

Technical Problem

Where a processing liquid inside a processing liquid piping undergoes a change with time (for example, a processing liquid inside a processing liquid piping is changed in composition (deterioration) or decreased in temperature), it is not desirable that the processing liquid is used in the subsequent substrate processing. Thus, prior to the subsequent substrate processing, it is necessary to thoroughly drain the processing liquid inside the processing liquid piping outside the piping. On the other hand, in such a case that the processing liquid inside the processing liquid piping can be used as it is in the subsequent substrate processing, the processing liquid inside the processing liquid piping is suctioned, thereby allowing a leading end surface of the processing liquid to recede so as not to cause dripping of the processing liquid from a discharge port.

However, if a processing liquid inside the processing liquid piping is thoroughly suctioned and drained outside the piping indiscriminately, irrespective of a purpose of the suction, the processing liquid will be increased in consumption. Also, it takes a long time for each suctioning of the processing liquid piping, which may result in a decrease in throughput. It is, therefore, requested that the leading end surface of the processing liquid is allowed to recede by suctioning the processing liquid inside the processing liquid piping, while reducing the consumption of the processing liquid and suppressing a decrease in throughput.

Thus, one object of the present invention is to provide a substrate processing apparatus and a substrate processing method which are capable of suctioning a processing liquid inside a processing liquid piping, while reducing the consumption of the processing liquid. Another object of the present invention is to provide a substrate processing apparatus and a substrate processing method which are capable of suctioning a processing liquid inside a processing liquid piping, with a decrease in throughput suppressed.

Solution to Problem

The present invention provides a substrate processing apparatus which includes a substrate holding unit which holds a substrate, a processing liquid piping which is communicatively connected with a discharge port for discharging a processing liquid to a major surface of the substrate held by the substrate holding unit, a processing liquid supplying unit for supplying the processing liquid to the processing liquid piping, a suction unit for suctioning the processing liquid present in an interior of the processing liquid piping, and a controller which controls the processing liquid supplying unit and the suction unit, in which the controller executes a processing liquid supplying step which supplies the processing liquid to the processing liquid piping in order to discharge the processing liquid from the discharge port by the processing liquid supplying unit and a suctioning step which suctions the processing liquid present inside the processing liquid piping by the suction unit, and also the controller selectively executes, in the suctioning step, a first suctioning step in which the processing liquid is suctioned to dispose a leading end surface of the processing liquid after being suctioned at a predetermined standby position inside the processing liquid piping and a second suctioning step in which the processing liquid is suctioned, thereby allowing the leading end surface of the processing liquid to recede from the standby position.

With this arrangement, in the suctioning step, a processing liquid present inside the processing liquid piping is suctioned and a leading end surface of the processing liquid is allowed to recede. As the suctioning step, there are selectively executed a first suctioning step in which the leading end surface of the processing liquid is disposed at a standby position and a second suctioning step in which the leading end surface of the processing liquid is allowed to recede from the standby position.

Also, the processing liquid which is suctioned is further decreased in amount and made shorter in time in the first suctioning step than in the second suctioning step. Therefore, it is possible to reduce consumption of the processing liquid and also to suppress a decrease in throughput, as compared with a case where the second suctioning step is executed in all the suctioning steps.

As described so far, it is possible to suction the processing liquid inside the processing liquid piping, while reducing the consumption of the processing liquid and suppressing a decrease in throughput.

A preferred embodiment of the present invention further includes a connection portion which is connected to the processing liquid piping and provided internally with a flow space through which a liquid flows. In this case, the controller may execute, in the second suctioning step, a step in which the leading end surface of the processing liquid is allowed to recede from an upstream end of the connection portion.

With this arrangement, in the second suctioning step, the leading end surface of the processing liquid is allowed to recede from the upstream end of the connection portion. That is, in the second suctioning step, it is possible to remove the processing liquid from an interior of the processing liquid piping and an entire region of the flow space at the connection portion. Thereby, where the processing liquid inside the processing liquid piping is changed with time (changed in composition (deterioration) or decreased in temperature), it is possible to reliably prevent the processing liquid from being used in the subsequent substrate processing.

Further, the suction unit may include a first suction device which suctions a processing liquid inside the processing liquid piping by a predetermined suction force and a second suction device which suctions a processing liquid inside the processing liquid piping by a suction force larger than that of the first suction device. In this case, the controller may suction a processing liquid by using the first suction device in the first suctioning step and also may suction a processing liquid by using the second suction device in the second suctioning step.

Further, when a processing liquid is suctioned by a strong suction force in both the first and the second suctioning steps, there is a possibility that the leading end surface of the processing liquid after being suctioned in the first suctioning step may not be accurately controlled. In both the first and the second suctioning steps, when the processing liquid is suctioned by a weak suction force, there is a possibility that a long time may be needed to execute the second suctioning step.

With this arrangement, in the first suctioning step, a processing liquid inside the processing liquid piping is suctioned by a relatively weak suction force and the leading end surface of the processing liquid is allowed to recede. Therefore, it is possible to accurately control the leading end surface of the processing liquid after being suctioned in the first suctioning step and also to execute the second suctioning step in a short time.

The substrate processing apparatus may further include a connection portion which is connected to the processing liquid piping and provided internally with a flow space through which a liquid flows. In this case, the first suction device may be interposed in the processing liquid piping or may be branched and connected to the processing liquid piping. The second suction device may suction a processing liquid via the suction piping connected to the connection portion.

With this arrangement, the first suction device is disposed on a discharge port side in relation to the connection portion, and the second suction device is disposed at a side opposite to the discharge port in relation to the connection portion. That is, this is an arrangement in which the leading end surface of the processing liquid after being suctioned by the first suctioning step can be disposed at a standby position and the leading end surface of the processing liquid is also allowed to recede from an upstream end of the connection portion in the second suctioning step.

Further, the second suction device may include an ejector-type suction device.

Still further, the first suction device may include a diaphragm-type suction device.

The substrate processing apparatus may further include a suction piping which is connected to the processing liquid piping and in which the diaphragm-type suction device is interposed and a processing liquid valve which opens and closes the processing liquid piping. In this case, a first driving source for driving the diaphragm type suction device and a second driving source for driving the processing liquid valve may be mutually independent.

On the assumption that the driving source arranged to drive the diaphragm type suction device and the driving source arranged to drive the processing liquid valve are common, there is a possibility that suction/suction-release of the diaphragm type suction device may be performed in conjunction with opening and closing of the processing liquid valve.

With this arrangement, the driving source for driving the diaphragm type suction device and the driving source for driving the processing liquid valve are mutually independent. Therefore, it is possible to open and close the processing liquid valve and suction and release the suction of the diaphragm type suction device individually at optimal motion timings.

Further, the first suction device may include a siphon type suction device.

Further, the controller may execute the first suctioning step in continuous processing in which substrate processing for processing substrates continues by using a processing liquid discharged from the discharge port. In this case, the controller may execute the second suctioning step before the continuous processing and/or after the continuous processing.

With this arrangement, since substrate processing is executed continuously during the continuous processing, there is no chance that a processing liquid is retained continuously inside the processing liquid piping for a long time. Therefore, in view of reduction in consumption of the processing liquid and/or in view of suppression of a decrease in throughput, during the continuous processing, the first suctioning step in which the leading end surface of the processing liquid after being suctioned is disposed at a standby position is executed as a suctioning step.

On the other hand, before the continuous processing and/or after the continuous processing, a processing liquid is continuously retained inside the processing liquid piping for a long time. Since it is impossible to use the processing liquid which undergoes a change with time in the subsequent substrate processing, before the continuous processing and/or after the continuous processing, there is executed, as a suctioning step, the second suctioning step in which the leading end surface of the processing liquid is allowed to recede from the standby position.

As described so far, it is possible to suction a processing liquid remaining inside the processing liquid piping in a mode suited to the processing liquid.

The controller may execute the first suctioning step during substrate processing in which a processing liquid discharged from the discharge port is used to process a single substrate. In this case, the controller may execute the second suctioning step before the substrate processing and/or after the substrate processing.

With this arrangement, during substrate processing for a single substrate, there is no chance that a processing liquid inside the processing liquid piping is continuously retained for a long period of time. Therefore, in view of reduction in consumption of the processing liquid and/or in view of suppression of a decrease in throughput, during the substrate processing, there is executed, as a suctioning step, the first suctioning step in which the leading end surface of the processing liquid after being suctioned is disposed at the standby position.

On the other hand, depending on contents of the substrate processing, there is a case that, before the substrate processing and/or after the substrate processing, a processing liquid may be continuously retained inside the processing liquid piping for a long period of time. Since it is impossible to use the processing liquid which undergoes a change with time (changed in composition (deterioration) or decreased in temperature) in the subsequent substrate processing, before the continuous processing and/or after the continuous processing, there is executed, as a suctioning step, the second suctioning step in which the leading end surface of the processing liquid is allowed to recede from the standby position.

As described so far, it is possible to suction a processing liquid which is retained inside the processing liquid piping in a mode suited to a state of the processing liquid.

The controller may execute the first suctioning step where a period from the end of discharge of a processing liquid from the discharge port to the start of the following discharge is shorter than a predetermined period. In this case, the controller may execute the second suctioning step where a period from the end of discharge of a processing liquid from the discharge port to the start of the following discharge is longer than a predetermined period.

With this arrangement, where a period from the end of discharge of a processing liquid from the discharge port to the start of the following discharge is not substantially long, the processing liquid retained inside the processing liquid piping does not undergo change with time (changed in composition (deterioration) or not decreased in temperature). Therefore, the processing liquid can be used in the subsequent substrate processing. In this case, in view of reduction in consumption of the processing liquid and/or in view of suppression of a decrease in throughput, there is executed, as a suctioning step, the first suctioning step in which the leading end surface of the processing liquid after being suctioned is disposed at the standby position.

On the other hand, where a long period of time has elapsed from the stop of discharge of a processing liquid, the processing liquid remaining inside the processing liquid piping may undergo a change with time (changed in composition (deterioration) or decreased in temperature). It is not desirable to use the above-described processing liquid as it is for processing. Therefore, prior to the subsequent substrate processing, it is necessary to thoroughly drain the processing liquid inside the processing liquid piping. Therefore, in this case, there is executed, as a suctioning step, the second suctioning step in which the leading end surface of the processing liquid is allowed to recede from the standby position.

As described so far, it is possible to suction a processing liquid remaining inside the processing liquid piping in a mode suited to a state of the processing liquid.

The controller may further execute an elapsed period measurement step which measures an elapsed period from the stop of discharge of a processing liquid from the discharge port. In this case, where the elapsed period is shorter than the predetermined period, the controller may execute the first suctioning step, and where the elapsed period is longer than the predetermined period, the controller may execute the second suctioning step.

With this arrangement, an elapsed period from the stop of discharge of a processing liquid from the discharge port can be measured to determine with high accuracy whether a period from the end of discharge of a processing liquid from the discharge port to the start of the following discharge is longer than the predetermined period or not.

The discharge port may be provided so as to be immovable in a direction along a major surface of a substrate held by the substrate holding unit. With this arrangement, the discharge port is provided so as to be immovable in a direction along a front surface of the substrate held by the substrate holding unit.

Also, where a processing liquid inside the processing liquid piping undergoes a change with time (changed in composition (deterioration) or decreased in temperature), before the start of subsequent substrate processing, it is necessary to thoroughly drain the processing liquid inside the processing liquid piping out of the piping. However, where the discharge port is provided so as to be immovable in a direction along the major surface of the substrate held by the substrate holding unit, it is impossible to drain the processing liquid according to a method of discharge of the processing liquid from the discharge port. Therefore, it is necessary to drain the processing liquid remaining inside the processing liquid piping by suctioning. Also, where the discharge port is provided so as to be immovable in a direction along the major surface of the substrate held by the substrate holding unit and where the discharge port faces the major surface of the substrate, it is necessary to suction an interior of the processing liquid piping after discharge of the processing liquid from the discharge port and allow the leading end surface of the processing liquid to recede in order to prevent the processing liquid from dropping from the discharge port (what is called dripping).

Further, the suctioning step is selectively used depending on a purpose of suctioning inside the processing liquid piping (whether it is for preventing dripping or for draining a processing liquid). Thereby, it is possible to suction the processing liquid inside the processing liquid piping, while reducing the consumption of the processing liquid and suppressing a decrease in throughput.

The substrate processing apparatus may further include a facing member which faces the major surface of the substrate held by the substrate holding unit and is provided with a substrate facing surface which is immovable in a direction along the major surface of the substrate. In this case, the discharge port may be formed on the substrate facing surface.

With this arrangement, it is impossible to move the discharge port in a direction along the front surface of the substrate held by the substrate holding unit. In this case as well, it is possible to suction the processing liquid inside the processing liquid piping, while reducing the consumption of the processing liquid and suppressing a decrease in throughput.

The present invention also provides a substrate processing method which is executed by a substrate processing apparatus that includes a processing liquid piping communicatively connected with a discharge port, and the substrate processing method which includes a processing liquid supplying step of supplying a processing liquid to the processing liquid piping in order to discharge the processing liquid from the discharge port and a suctioning step of suctioning a processing liquid present inside the processing liquid piping, in which the suctioning step includes a first suctioning step in which a leading end surface of the processing liquid is allowed to recede, thereby disposing the leading end surface of the processing liquid after being suctioned at a predetermined standby position inside the processing liquid piping, and a second suctioning step in which the leading end surface of the processing liquid is allowed to recede substantially further than the standby position, and the first and the second suctioning steps are executed selectively.

In this method, in the suctioning step, the processing liquid present inside the processing liquid piping is suctioned and the leading end surface of the processing liquid is allowed to recede. As the suctioning step, there are selectively executed the first suctioning step in which the leading end surface of the processing liquid is disposed at a standby position and the second suctioning step in which the leading end surface of the processing liquid is allowed to recede from the standby position.

Also, the processing liquid which is suctioned is further decreased in amount and made shorter in time in the first suctioning step than in the second suctioning step. Therefore, it is possible to reduce consumption of the processing liquid and also suppress a decrease in throughput, as compared with a case where the second suctioning step is executed in all the suctioning steps.

As described so far, it is possible to suction a processing liquid inside the processing liquid piping, while reducing the consumption of the processing liquid and suppressing a decrease in throughput.

In a preferred embodiment of the present invention, the substrate processing apparatus further includes a connection portion which is connected to the processing liquid piping and provided internally with a flow space through which a liquid flows. Further, the second suctioning step may include a step in which the leading end surface of the processing liquid is allowed to recede from an upstream end of the connection portion.

In this method, in the second suctioning step, the leading end surface of the processing liquid is allowed to recede from the upstream end of the connection portion. That is, in the second suctioning step, it is possible to remove the processing liquid from an interior of the processing liquid piping and an entire region of the flow space at the connection portion. Thereby, where the processing liquid inside the processing liquid piping undergoes a change with time (changed in composition) (deterioration) or decreased in temperature), it is possible to reliably prevent the processing liquid from being used in the subsequent substrate processing.

Further, the first suctioning step may include a step of suctioning a processing liquid inside the processing liquid piping by a predetermined suction force. In this case, the second suctioning step may include a step of suctioning a processing liquid inside the processing liquid piping by a suction force greater than that of the first suctioning step.

Further, when a processing liquid is suctioned by a strong suction force both in the first suctioning step and in the second suctioning step, there is a possibility that the leading end surface of the processing liquid after being suctioned in the first suctioning step may not be accurately controlled. When a processing liquid is suctioned by a weak suction force both in the first suctioning step and in the second suctioning step, there is a possibility that a long time may be needed to execute the second suctioning step.

In this method, in the first suctioning step, a processing liquid inside the processing liquid piping is suctioned by a relatively weak suction force and the leading end surface of the processing liquid is allowed to recede. Therefore, it is possible to accurately control the leading end surface of the processing liquid after being suctioned in the first suctioning step and also to execute the second suctioning step in a short time.

Further, the first suctioning step may be a step executed in continuous processing in which substrate processing for processing substrates continues by using a processing liquid discharged from the discharge port. In this case, the second suctioning step may be a step which is executed before the continuous processing and/or after the continuous processing.

In this method, during the continuous processing, the substrate processing is executed continuously. Therefore, there is no chance that a processing liquid is retained continuously inside the processing liquid piping for a long period of time. Therefore, in view of reduction in consumption of the processing liquid and/or in view of suppression of a decrease in throughput, during the continuous processing, there is executed, as a suctioning step, the first suctioning step in which the leading end surface of the processing liquid after being suctioned is disposed at the standby position.

On the other hand, before the continuous processing and/or after the continuous processing, the processing liquid is continuously retained inside the processing liquid piping for a long period of time. It is impossible to use a processing liquid which undergoes a change with time in the subsequent substrate processing. Therefore, before the continuous processing and/or after the continuous processing, there is executed, as a suctioning step, the second suctioning step in which the leading end surface of the processing liquid is allowed to recede from the standby position.

As described so far, it is possible to suction a processing liquid remaining inside the processing liquid piping in a mode suited to a state of the processing liquid.

Further, the first suctioning step may be a step which is executed during the substrate processing in which a single substrate is processed by using a processing liquid discharged from the discharge port. In this case, the second suctioning step may be a step which is executed before the substrate processing and/or after the substrate processing.

In this method, during the substrate processing for a single substrate, there is no chance that a processing liquid is continuously retained inside the processing liquid piping for a long period of time. Therefore, in view of reduction in consumption of the processing liquid and/or in view of suppression of a decrease in throughput, during the substrate processing, there is executed, as a suctioning step, the first suctioning step in which the leading end surface of the processing liquid after being suctioned is disposed at the standby position.

On the other hand, depending on contents of the substrate processing, there is a case where, before the substrate processing and/or after the substrate processing, the processing liquid may be continuously retained inside the processing liquid piping for a long period of time. It is impossible to use a processing liquid which undergoes a change with time (changed in composition (deterioration) or decreased in temperature) in the subsequent substrate processing. Therefore, before the continuous processing and/or after the continuous processing, there is executed, as a suctioning step, the second suctioning step in which the leading end surface of the processing liquid is allowed to recede from the standby position.

As described so far, it is possible to suction a processing liquid remaining inside the processing liquid piping in a mode suited to a state of the processing liquid.

Further, the first suctioning step may be a step executed in a case where a period from the end of discharge of a processing liquid from the discharge port to the start of the following discharge is shorter than a predetermined period. In this case, the second suctioning step may be a step executed in a case where a period from the end of discharge of a processing liquid from the discharge port to the start of the following discharge is longer than a predetermined period.

In this method, where a period from the end of discharge of a processing liquid from the discharge port to the start of the following discharge is not substantially long, the processing liquid retained inside the processing liquid piping does not undergo a change with time (not changed in composition (deterioration) or not decreased in temperature). Therefore, the liquid can be used in the subsequent substrate processing. In this case, in view of reduction in consumption of the processing liquid and/or in view of suppression of a decrease in throughput, there is executed, as a suctioning step, the first suctioning step in which the leading end surface of the processing liquid after being suctioned is disposed at the standby position.

On the other hand, where a long period of time has elapsed from the stop of discharge of a processing liquid, the processing liquid remaining inside the processing liquid piping may undergo a change with time (changed in composition (deterioration) or decreased in temperature). It is not desirable to use the processing liquid as it is for processing. Then, prior to the subsequent substrate processing, it is necessary to thoroughly drain the processing liquid inside the processing liquid piping out of the piping. Therefore, in this case, there is executed, as a suctioning step, the second suctioning step in which the leading end surface of the processing liquid is allowed to recede from the standby position.

As described so far, it is possible to suction a processing liquid remaining inside the processing liquid piping in a mode suited to a state of the processing liquid.

The substrate processing method further includes an elapsed period measurement step which measures an elapsed period from the stop of discharge of a processing liquid from the discharge port. This is a step executed in a case where the elapsed period is shorter than the predetermined period in the first suctioning step and also a step executed in a case where the elapsed period is longer than the predetermined period in the second suctioning step.

In this method, the elapsed period from the stop of discharge of a processing liquid from the discharge port can be measured to determine with high accuracy whether a period from the end of discharge of a processing liquid from the discharge port to the start of the following discharge is longer than the predetermined period or not.

The above and other objects, features, and effects of the present invention will become more apparent from the following detailed description of the preferred embodiments with reference to the attached drawings.

BRIEF DESCRIPTION OF DRAWINGS

FIG. 8 is a flowchart which describes an example of substrate processing executed by the substrate processing apparatus.

FIG. 9 is a drawing which shows discharge of a chemical liquid by using the first supply/suction unit.

FIG. 10 is a drawing which shows the stop of discharge of a chemical liquid by using the first supply/suction unit.

FIG. 11 is a drawing which shows a first suction of the chemical liquid by using the first supply/suction unit.

FIG. 12 is a drawing which shows a second suction of the chemical liquid by using the first supply/suction unit.

FIG. 13 is a drawing which shows discharge of an organic solvent by using the second supply/suction unit.

FIG. 14 is a drawing which shows the stop of discharge of the organic solvent by using the second supply/suction unit.

FIG. 15 is a drawing which shows a first suction of the organic solvent by using the second supply/suction unit.

FIG. 16 is a drawing which shows a second suction of the organic solvent by using the second supply/suction unit.

FIG. 28 is a flowchart which shows a flow of substrate processing executed by a process recipe in the processing unit.

FIG. 29 is a flowchart which shows a flow of post-processing executed by a post recipe in the processing unit.

FIG. 30B is a drawing which describes a pre-dispensing step shown in FIG. 27.

FIG. 31 is a drawing which describes a hydrophobic agent supplying step shown in FIG. 28.

FIG. 32 is a drawing which describes a first suctioning step executed after the hydrophobic agent supplying step.

FIG. 33 is a drawing which describes a connection portion cleaning step shown in FIG. 29.

FIG. 34 is a drawing which shows a piping cleaning step shown in FIG. 29.

FIG. 35 is a drawing which describes a second suctioning step shown in FIG. 29.

FIG. 36 is a drawing which describes a filling step shown in FIG. 29.

DESCRIPTION OF EMBODIMENTS

Figure 1:
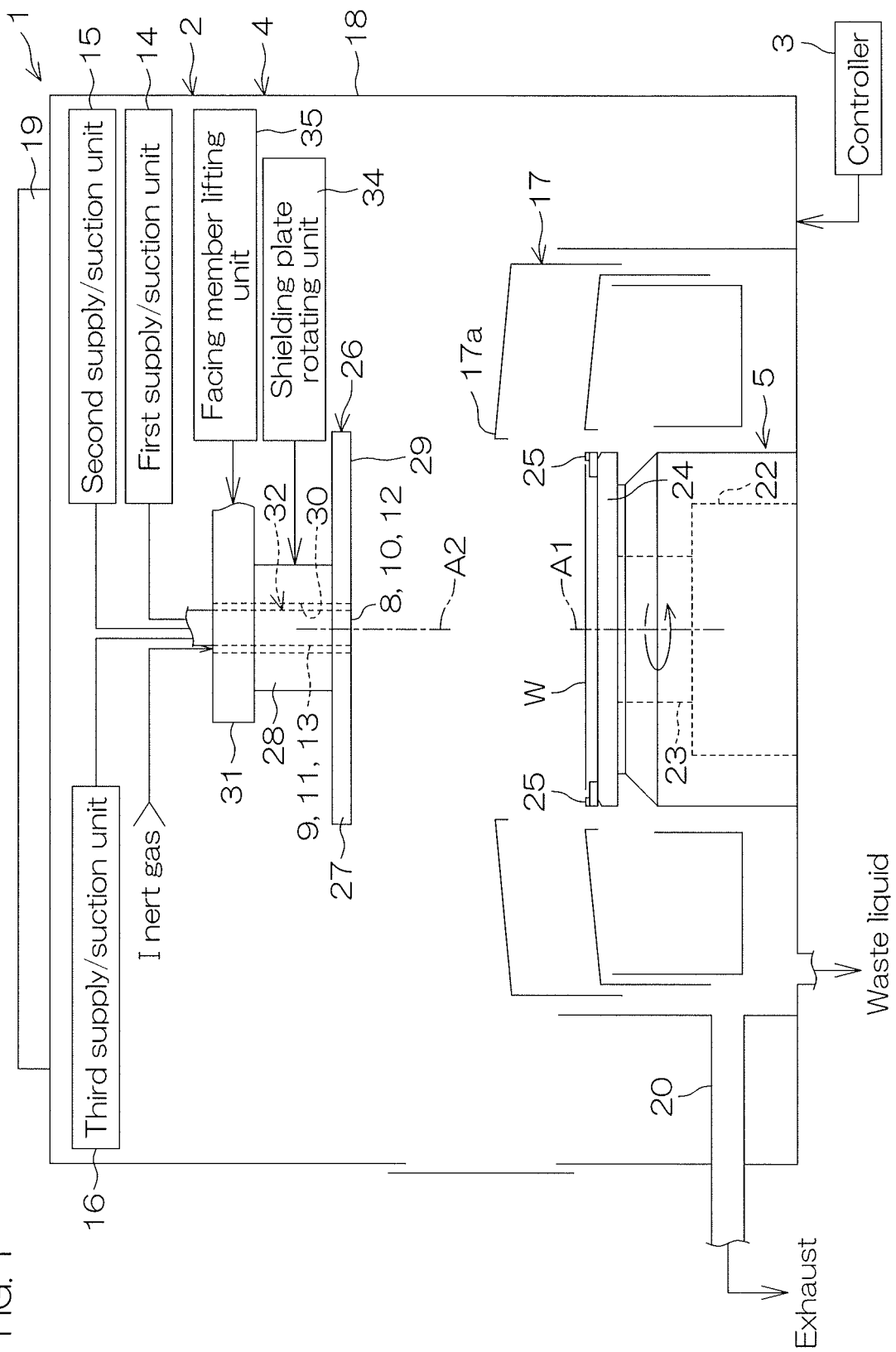
FIG. 1 is a drawing in which a substrate processing apparatus according to a first preferred embodiment of the present invention is viewed in a horizontal direction.

FIG. 1 is a drawing in which a substrate processing apparatus 1 according to a first preferred embodiment of the present invention is viewed in a horizontal direction. The substrate processing apparatus 1 is a single substrate processing type apparatus which processes a semiconductor wafer as an example of a substrate W one at a time. The substrate processing apparatus 1 includes a processing unit 2 which processes a substrate W and a controller 3 which controls devices provided in the substrate processing apparatus 1 and opening and closing of valves.

The processing unit 2 includes a box-shaped chamber 4 having an internal space, a spin chuck (substrate holding unit) 5 which holds a single substrate W in a horizontal posture inside the chamber 4 and rotates the substrate W around a vertical rotation axis passing through a central portion of the substrate W, a first nozzle piping (processing liquid piping) 9 which has a first discharge port (discharge port) 8 for discharging a processing liquid to a central portion of an upper surface (major surface) of the substrate W held by the spin chuck 5, a second nozzle piping (processing liquid piping) 11 which has a second discharge port (discharge port) 10 for discharging a processing liquid to the central portion of the upper surface of the substrate W held by the spin chuck 5, a third nozzle piping (processing liquid piping) 13 which has a third discharge port (discharge port) 12 for discharging a processing liquid to the central portion of the upper surface of the substrate W held by the spin chuck 5, a first supply/suction unit (processing liquid supplying unit, suction unit) 14 for selectively supplying a chemical liquid and a rinse liquid to the first nozzle piping 9 and also suctioning the chemical liquid inside the first nozzle piping 9, a second supply/suction unit (processing liquid supplying unit, suction unit) 15 for supplying a liquid type organic solvent to the second nozzle piping 11 and also suctioning the organic solvent inside the second nozzle piping 11, a third supply/suction unit (processing liquid supplying unit, suction unit) 16 for supplying a liquid type front surface improving agent to the third nozzle piping 13 and also suctioning the front surface improving agent inside the third nozzle piping 13, and a cylindrical cup 17 which surrounds the spin chuck 5.

The chamber 4 includes a box-shaped partition wall 18 which houses the spin chuck 5 and a nozzle, an FFU (fan filter unit) 19 as a blower unit feeding clean air (air filtered by a filter) inside the partition wall 18 from an upper portion of the partition wall 18, and an exhaust duct 20 which exhausts a gas inside the chamber 4 from a lower portion of the partition wall 18. The FFU 19 is disposed above the partition wall 18 and mounted on a ceiling of the partition wall 18. The FFU 19 feeds clean air downward inside the chamber 4 from the ceiling of the partition wall 18. The exhaust duct 20 is connected to a bottom portion of the cup 17 and leads a gas inside the chamber 4 toward exhaust processing equipment provided in a plant in which the substrate processing apparatus 1 is installed. Therefore, a downflow (downward flow) flowing downward inside the chamber 4 is formed by the FFU 19 and the exhaust duct 20. The substrate W is processed in a state that the downflow is formed inside the chamber 4.

As the spin chuck 5, adopted is a clamping type chuck which clamps a substrate W in a horizontal direction to hold the substrate W horizontally. Specifically, the spin chuck 5 includes a spin motor 22, a lower spin shaft 23 which is made integrally with a driving shaft of the spin motor 22 and a disk-shaped spin base 24 which is mounted substantially horizontally on an upper end of the lower spin shaft 23.

A plurality (three or more, for example, six) of clamping members 25 are disposed at a peripheral edge portion of an upper surface of the spin base 24. At the peripheral edge portion of the upper surface of the spin base 24, the plurality of clamping members 25 are disposed at suitable intervals on a circumference corresponding to an outer peripheral shape of the substrate W.

Further, the spin chuck 5 is not limited to a clamping type and, for example, there may be instead adopted a vacuum suction type arrangement (vacuum chuck) that vacuum-suctions a rear surface of the substrate W to hold the substrate W in a horizontal posture and further performs rotation around a vertical rotation axis in this state to rotate the substrate W held by the spin chuck 5.

Figure 2:
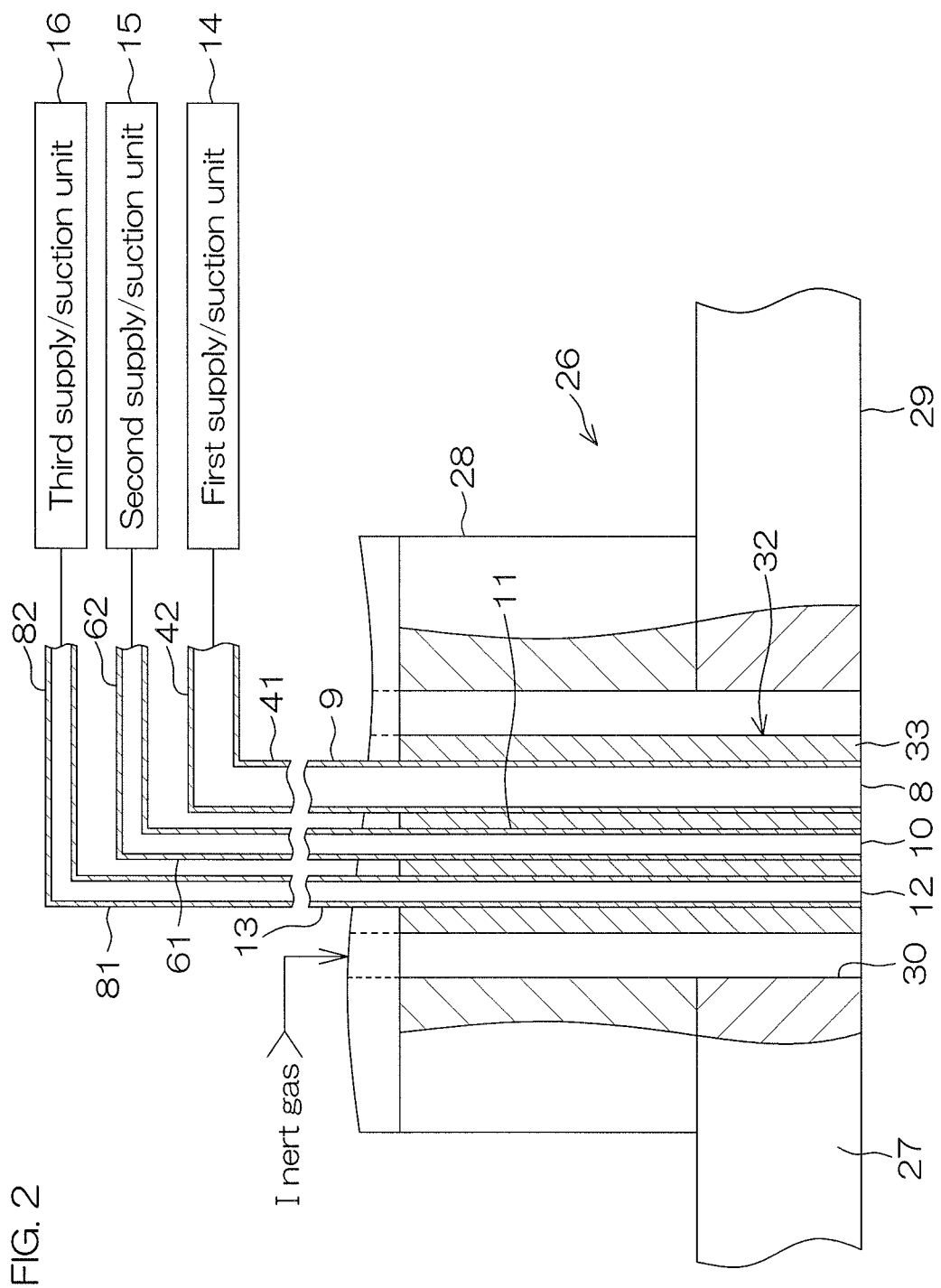
FIG. 2 is a longitudinal sectional view of a facing member provided at the substrate processing apparatus.
Figure 3:
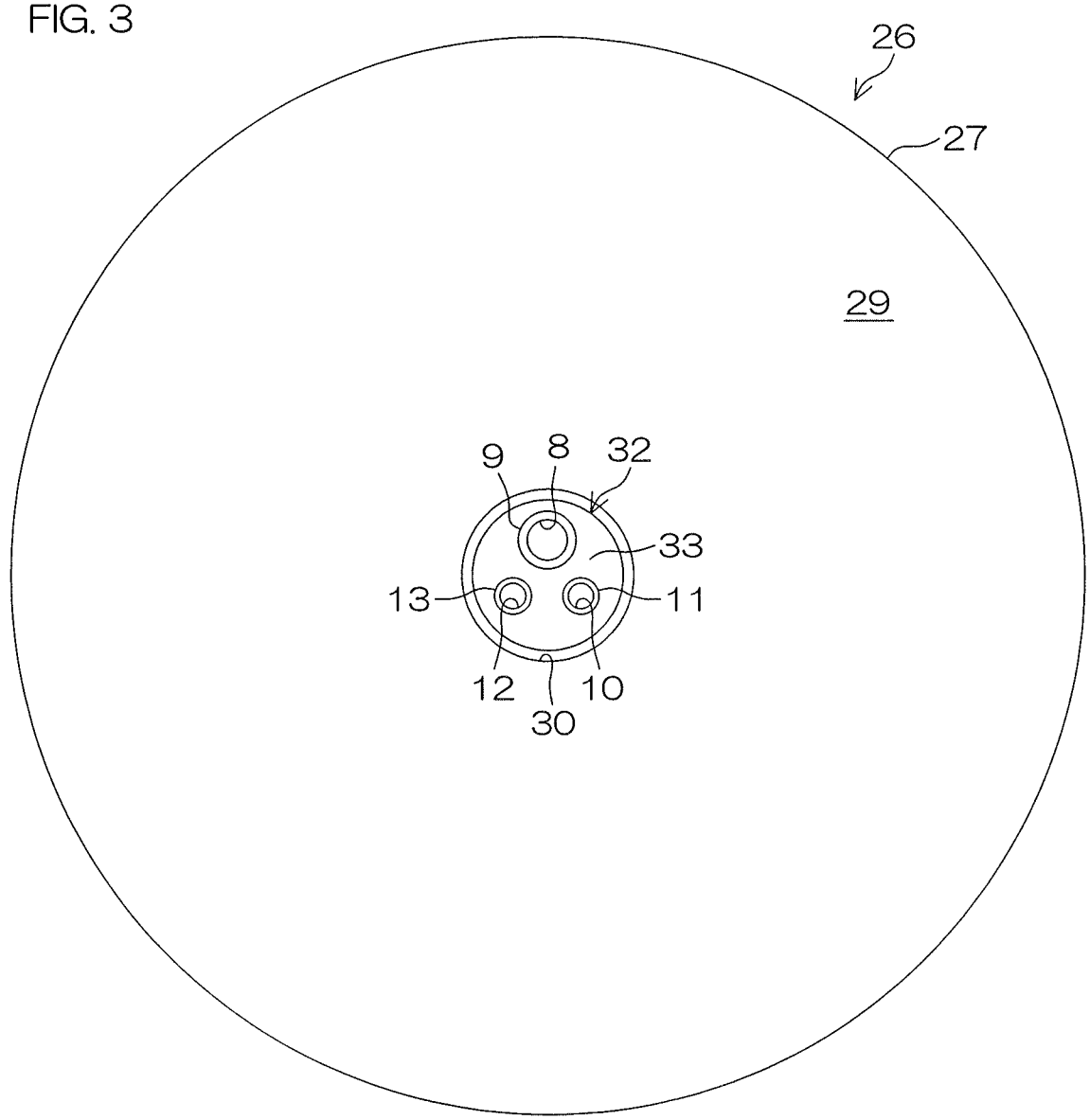
FIG. 3 is a bottom view of the facing member.

The substrate processing apparatus 1 further includes a facing member 26 which faces an upper surface of the substrate W held by the spin chuck 5. FIG. 2 is a longitudinal sectional view of the facing member 26. FIG. 3 is a bottom view of the facing member 26. With reference to FIG. 1 to FIG. 3, a description will be given of the facing member 26.

The facing member 26 includes a shielding plate 27 and a rotation shaft 28 which is provided at the shielding plate 27 so as to rotate integrally. The shielding plate 27 is formed in a disk-shape which is substantially equal in diameter or slightly larger in diameter than a substrate W. The shielding plate 27 is provided at a lower surface with a substrate facing surface 29 composed of a circular horizontal flat surface which faces an entirety of the upper surface of the substrate W. A circular cylindrical penetrating hole 30 which penetrates up and down through the shielding plate 27 is formed in a central portion of the substrate facing surface 29. The penetrating hole 30 is defined by a circular cylindrical inner peripheral surface.

The rotation shaft 28 is provided so as to rotate around a rotation axis A2 (an axis in alignment with the rotation axis A1 of a substrate W) which passes through the center of the shielding plate 27 and extends vertically. The rotation shaft 28 is formed in a circular cylindrical shape. An inner peripheral surface of the rotation shaft 28 is formed to assume a circular cylindrical surface at the center of the rotation axis A2. An internal space of the rotation shaft 28 is communicatively connected with the penetrating hole 30 on the shielding plate 27. The rotation shaft 28 is supported so as to rotate relatively by a supporting arm 31 extending horizontally above the shielding plate 27. In the present preferred embodiment, the supporting arm 31 is allowed to move only in an up/down direction and will not move in a right/left direction (that is, a direction along a front surface of the substrate W). In other words, the substrate facing surface 29 and individual discharge ports 8, 10, 12 are allowed to move only in an up/down direction and immovable in a right/left direction (that is, a direction along the front surface of the substrate W).

A central axis nozzle 32 which extends up and down along the rotation axis A2 of the shielding plate 27 is inserted through an interior of the penetrating hole 30. The central axis nozzle 32 includes a casing as well as a first nozzle piping 9, a second nozzle piping 11 and a third nozzle piping 13 which are inserted up and down through an interior of the casing. In the present preferred embodiment, the first to third nozzle pipings 9, 11 and 13 are each an inner tube. The casing 33 is inserted into an interior of the penetrating hole 30 in a state not in contact with the shielding plate 27 or the rotation shaft 28.

A shielding plate rotating unit 34 arranged to include an electric motor, etc., is connected to the shielding plate 27. The shielding plate rotating unit 34 rotates the shielding plate 27 and the rotation shaft 28 around the rotation axis A2 in relation to the supporting arm 31.

A facing member lifting unit 35 arranged to include an electric motor, a ball screw, etc., is coupled to the supporting arm 31. The facing member lifting unit 35 raises and lowers in a vertical direction the facing member 26 (the shielding plate 27 and the rotation shaft 28) and the first to third nozzle pipings 9, 11 and 13 together with the supporting arm 31. The facing member lifting unit 35 raises and lowers the shielding plate 27 and the nozzle pipings 9, 11 and 13 between a proximity position at which the substrate facing surface 29 of the shielding plate 27 comes close to an upper surface of a substrate W held by the spin chuck 5 and a retracted position which is provided above the proximity position. The facing member lifting unit 35 is able to hold the shielding plate 27 at any position between the proximity position and the retracted position.

As shown in FIG. 1, the cup 17 is disposed further outward (in a direction away from the rotation axis A1) than the substrate W held by the spin chuck 5. The cup 17 surrounds a periphery of the spin base 24. When a processing liquid is supplied to the substrate W in a state that the spin chuck 5 rotates the substrate W, the processing liquid supplied to the substrate W is spun off to a periphery of the substrate W. When the processing liquid is supplied to the substrate W, an upper end portion 17a of the upwardly opened cup 17 is disposed higher than the spin base 24. Therefore, the processing liquid (a chemical liquid, a rinse liquid, an organic solvent, a front surface improving agent, etc.) expelled to a periphery of the substrate W is received by the cup 17. Then, the processing liquid received by the cup 17 is fed to recovery equipment or waste liquid treatment equipment (not shown).

Figure 4:
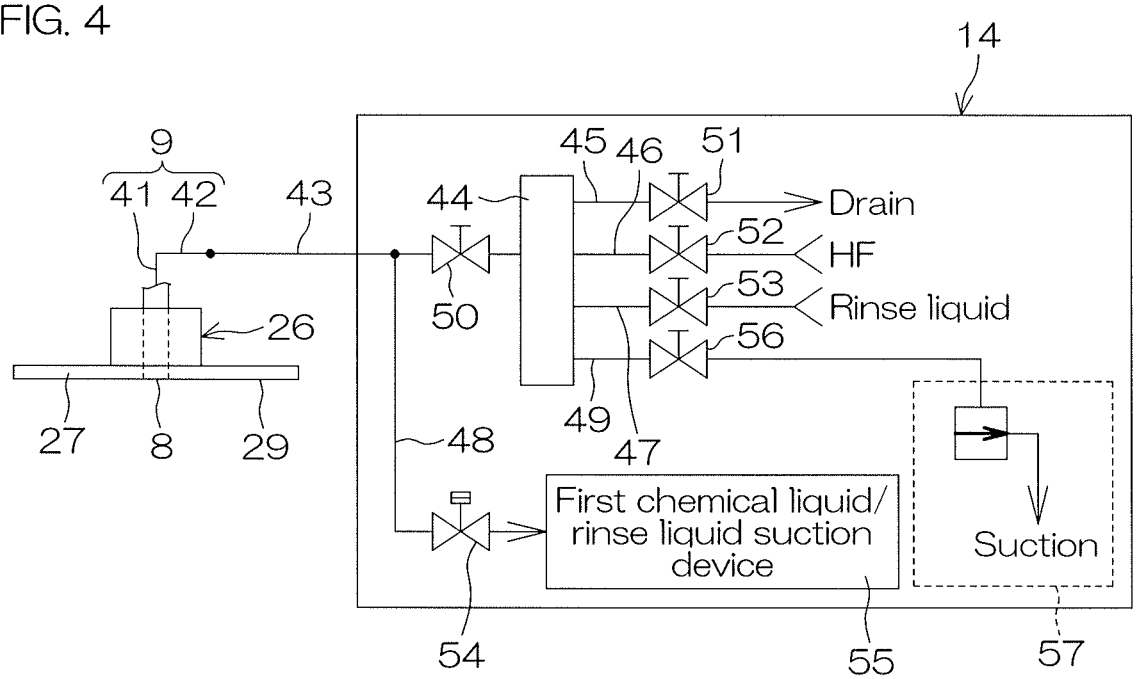
FIG. 4 is a drawing which shows an arrangement of a first supply/suction unit provided at the substrate processing apparatus.

FIG. 4 is a drawing which shows an arrangement of the first supply/suction unit 14.

The first nozzle piping 9 is provided with a first up/down direction portion 41 and a first right/left direction portion 42. A leading end portion of the first right/left direction portion 42 is connected to a base end portion (upper end portion) of the first up/down direction portion 41. The first discharge port 8 is formed at a leading end portion (lower end portion) of the first up/down direction portion 41.

The first supply/suction unit 14 includes a first common piping 43, one end side (the left side in FIG. 4) of which is connected to the first right/left direction portion 42 of the first nozzle piping 9, a first connection portion 44 to which the other end side (the right side in FIG. 4) of the first common piping 43 is connected, a first drain piping 45, one end side (the left side in FIG. 4) of which is connected to the first connection portion 44, a chemical liquid piping 46, one end side (the left side in FIG. 4) of which is connected to the first connection portion 44, a rinse liquid piping 47, one end side (the left side in FIG. 4) of which is connected to the first connection portion 44, a first chemical liquid/rinse liquid suction piping 48, one end side (the left side in FIG. 4) of which is branched and connected to an intermediate portion of the first common piping 43, and a second chemical liquid/rinse liquid suction piping 49, one end side (the left side in FIG. 4) of which is connected to the first connection portion 44.

A first common valve 50 for opening and closing the first common piping 43 is interposed in an upstream portion (a portion on the side of the first discharge port 8) of the first common piping 43 at a branched position of the first chemical liquid/rinse liquid suction piping 48.

A first drain valve 51 for opening and closing the first drain piping 45 is interposed in the first drain piping 45. The other end side of the first drain piping 45 is connected to external waste liquid treatment equipment.

A chemical liquid valve 52 for opening and closing the chemical liquid piping 46 is interposed in the chemical liquid piping 46. A chemical liquid is arranged to be supplied from a chemical liquid supplying source to the other end side of the chemical liquid piping 46. The chemical liquid is, for example, hydrofluoric acid (HF). However, the chemical liquid is not limited to hydrofluoric acid but may be a liquid containing at least one of sulfuric acid, acetic acid, nitric acid, hydrochloric acid, hydrofluoric acid, ammonia water, hydrogen peroxide water, an organic acid (for example, citric acid, oxalic acid, etc.), an organic alkali (for example, TMAH: tetramethylammonium hydroxide, etc.), a surfactant, and a corrosion inhibitor.

A rinse liquid valve 53 for opening and closing the rinse liquid piping 47 is interposed in the rinse liquid piping 47. A rinse liquid is arranged to be supplied from a rinse liquid supplying source to the other end side of the rinse liquid piping 47.

Specifically, the rinse liquid is, for example, deionized water (DIW) but not limited to DIW and may be any one of carbonated water, electrolyzed ion water, hydrogen water, ozone water, and ammonia water of dilute concentration of (for example, approximately 10 ppm to 100 ppm).

The first chemical liquid/rinse liquid suction piping 48 is branched and connected to the first common piping 43. A first chemical liquid/rinse liquid suction valve 54 for opening and closing the first chemical liquid/rinse liquid suction piping 48 is interposed in the first chemical liquid/rinse liquid suction piping 48. A first chemical liquid/rinse liquid suction device (first suction device) 55 is connected to the other end side (leading end) of the first chemical liquid/rinse liquid suction piping 48. The first chemical liquid/rinse liquid suction device 55 is a siphon type suction device.

The siphon-type suction device is a device which fills an interior of the piping (first chemical liquid/rinse liquid suction piping 48) with a liquid to suction (drain) a liquid inside the first common piping 43 by utilizing the principle of a siphon. The siphon type suction device is able to suppress energy consumption for suctioning, as compared with an ejector type suction device such as a vacuum generator and an aspirator.

A second chemical liquid/rinse liquid suction valve 56 for opening and closing the second chemical liquid/rinse liquid suction piping 49 is interposed in the second chemical liquid/rinse liquid suction piping 49. A second chemical liquid/rinse liquid suction device (second suction device) 57 is connected to the other end side (leading end) of the second chemical liquid/rinse liquid suction piping 49. The second chemical liquid/rinse liquid suction device 57 is an ejector type suction device. The ejector type suction device is stronger in suction force (faster in suction speed) and greater in flow rate that can be suctioned as compared with a siphon type suction device.

When the chemical liquid valve 52 and the first common valve 50 are opened in a state that other valves are closed, a chemical liquid is supplied from the chemical liquid piping 46 to the first nozzle piping 9 and the chemical liquid is discharged downward from the first discharge port 8.

Further, when the chemical liquid valve 52 and the first drain valve 51 are opened in a state that other valves are closed, a chemical liquid is supplied from the chemical liquid piping 46 to the first drain piping 45. Thereby, it is possible to drain (discard) the chemical liquid inside the chemical liquid piping 46.

When the rinse liquid valve 53 and the first common valve 50 are opened in a state that other valves are closed, a rinse liquid is supplied from the rinse liquid valve 53 to the first nozzle piping 9 and the rinse liquid is discharged downward from the first discharge port 8.

Further, when the rinse liquid valve 53 and the first drain valve 51 are opened in a state that other valves are closed, a rinse liquid is supplied from the rinse liquid valve 53 to the first drain piping 45. Thereby, it is possible to drain (discard) the rinse liquid inside the rinse liquid piping 47.

The first chemical liquid/rinse liquid suction device 55 is arranged to be made, for example, in a constant operating state. When the first chemical liquid/rinse liquid suction device 55 is in an operating state and the first chemical liquid/rinse liquid suction valve 54 is opened, a function of the first chemical liquid/rinse liquid suction device 55 is enabled and an interior of the first chemical liquid/rinse liquid suction piping 48 is suctioned. Thereby, the processing liquid (a chemical liquid or a rinse liquid) contained in the first chemical liquid/rinse liquid suction piping 48 is drawn into the second chemical liquid/rinse liquid suction piping 49. The first chemical liquid/rinse liquid suction device 55 is relatively weak in suction force and also relatively slow in suction speed thereof.

Further, the second chemical liquid/rinse liquid suction device 57 is arranged to be made, for example, in a constant operating state. When the second chemical liquid/rinse liquid suction device 57 is in an operating state and the second chemical liquid/rinse liquid suction valve 56 is opened, a function of the second chemical liquid/rinse liquid suction device 57 is enabled and an interior of the second chemical liquid/rinse liquid suction piping 49 is suctioned. Thereby, the processing liquid (a chemical liquid or a rinse liquid) which is contained in the second chemical liquid/rinse liquid suction piping 49, the first connection portion 44, the first common piping 43 and the first nozzle piping 9 is drawn into the second chemical liquid/rinse liquid suction piping 49. The second chemical liquid/rinse liquid suction device 57 is stronger in suction force than the first chemical liquid/rinse liquid suction device 55 and also slower in suction speed thereof than the first chemical liquid/rinse liquid suction device 55.

With regard to the first supply/suction unit 14, the processing liquid supplying unit is arranged by the first common piping 43, the first connection portion 44, the chemical liquid piping 46, the chemical liquid valve 52, the rinse liquid piping 47 and the rinse liquid valve 53. Further, with regard to the first supply/suction unit 14, the suction unit is arranged by the first common piping 43, the first chemical liquid/rinse liquid suction piping 48, the first chemical liquid/rinse liquid suction device 55, the first connection portion 44, the second chemical liquid/rinse liquid suction piping 49 and the second chemical liquid/rinse liquid suction device 57.

Figure 5:
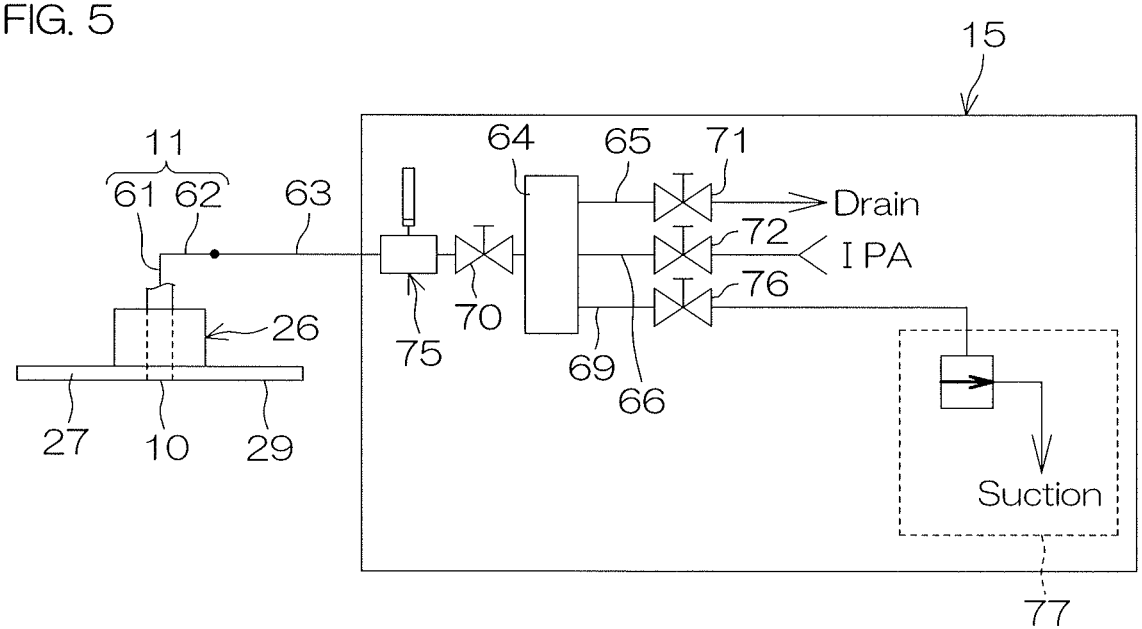
FIG. 5 is a drawing which shows an arrangement of a second supply/suction unit provided at the substrate processing apparatus.

FIG. 5 is a drawing which shows an arrangement of the second supply/suction unit 15.

The second nozzle piping 11 is provided with a second up/down direction portion 61 and a second right/left direction portion 62. A leading end portion of the second right/left direction portion 62 is connected to a base end portion (upper end portion) of the second up/down direction portion 61. The second discharge port 10 is formed at a leading end portion (lower end portion) of the second up/down direction portion 61.

The second supply/suction unit 15 includes a second common piping 63, one end side (the left side in FIG. 5) of which is connected to the second right/left direction portion 62 of the second nozzle piping 11, a second connection portion 64 to which the other end side (the right side in FIG. 5) of the second common piping 63 is connected, a second drain piping 65, one end side (the left side in FIG. 5) of which is connected to the second connection portion 64, an organic solvent piping 66, one end side (the left side in FIG. 5) of which is connected to the second connection portion 64, and an organic solvent suction piping 69, one end side (the left side in FIG. 5) of which is connected to the second connection portion 64.

A second common valve 70 for opening and closing the second common piping 63 is interposed in the second common piping 63.

A second drain valve 71 for opening and closing the second drain piping 65 is interposed in the second drain piping 65. The other end side of the second drain piping 65 is connected to external waste liquid treatment equipment.

An organic solvent valve 72 for opening and closing the organic solvent piping 66 is interposed in the organic solvent piping 66. An organic solvent is arranged to be supplied from an organic solvent supplying source to the other end side of the organic solvent piping 66. The organic solvent is, for example, IPA (isopropyl alcohol).

A first organic solvent suction device (first suction device) 75 is interposed in the second common piping 63 at a portion downstream from a position in which the second common valve 70 is interposed. The first organic solvent suction device 75 is a diaphragm type suction device. The diaphragm type suction device includes a cylindrical head which is interposed in an intermediate portion of the second common piping 63 and a diaphragm housed inside the head. This is a suction device which changes a volume of a flow passage formed inside the head by driving the diaphragm (refer to Japanese Patent Unexamined Application Publication No. 2016-111306, etc.).

An organic solvent suction valve 76 for opening and closing the organic solvent suction piping 69 is interposed in the organic solvent suction piping 69. A second organic solvent suction device (second suction device) 77 is connected to the other end side (leading end) of the organic solvent suction piping 69. The second organic solvent suction device 77 is an ejector type suction device similar to the second chemical liquid/rinse liquid suction device 57. The ejector type suction device is stronger in suction force (faster in suction speed) and greater in flow rate that can be suctioned than a diaphragm type suction device.

When the organic solvent valve 72 and the second common valve 70 are opened in a state that other valves are closed, an organic solvent is supplied from the organic solvent piping 66 to the second nozzle piping 11 and the organic solvent is discharged downward from the second discharge port 10.

Further, when the organic solvent valve 72 and the second drain valve 71 are opened in a state that other valves are closed, an organic solvent is supplied from the organic solvent piping 66 to the second drain piping 65. Thereby, it is possible to drain (discard) the organic solvent inside the organic solvent piping 66.

The first organic solvent suction device 75 is operated by the controller 3 (a function of the first organic solvent suction device 75 is enabled). In the operating state, an organic solvent contained in the second common piping 63 is drawn into the first organic solvent suction device 75. The first organic solvent suction device 75 is relatively weak in suction force and also relatively slow in suction speed.

Further, the second organic solvent suction device 77 is made, for example, in a constant operating state. When the second organic solvent suction device 77 is in an operating state and the organic solvent suction valve 76 is opened, a function of the second organic solvent suction device 77 is enabled, and an interior of the organic solvent suction piping 69 is suctioned. Thereby, the organic solvent which is contained in the organic solvent suction piping 69, the second connection portion 64, the second common piping 63 and the second nozzle piping 11 is drawn into the organic solvent suction piping 69. The second organic solvent suction device 77 is relatively stronger in suction force than the first organic solvent suction device 75 and also relatively slower in suction speed thereof than the first organic solvent suction device 75.

With regard to the second supply/suction unit 15, the processing liquid supplying unit is arranged by the second common piping 63, the second connection portion 64, the organic solvent piping 66 and the organic solvent valve 72. Further, with regard to the second supply/suction unit 15, the suction unit is arranged by the second common piping 63, the first organic solvent suction device 75, the second connection portion 64, the organic solvent suction piping 69 and the second organic solvent suction device 77.

Figure 6:
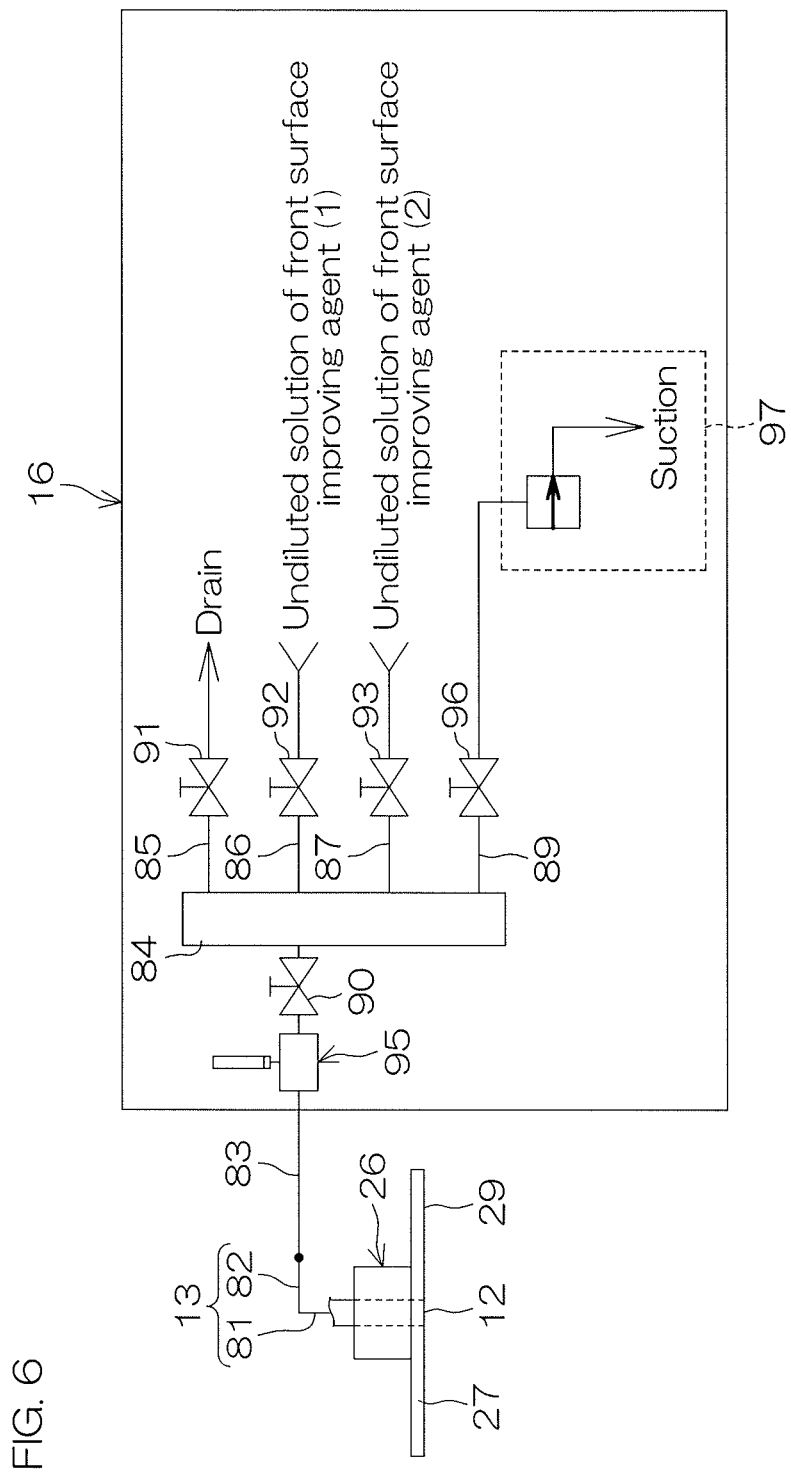
FIG. 6 is a drawing which shows an arrangement of a third supply/suction unit provided at the substrate processing apparatus.

FIG. 6 is a drawing which shows an arrangement of the third supply/suction unit 16.

The third nozzle piping 13 is provided with a third up/down direction portion 81 and a third right/left direction portion 82. A leading end portion of the third right/left direction portion 82 is connected to a base end portion (upper end portion) of the third up/down direction portion 81. The third discharge port 12 is formed at a leading end portion (lower end portion) of the third up/down direction portion 81.

The third supply/suction unit 16 includes a third common piping 83, one end side (the left side in FIG. 6) of which is connected to the third right/left direction portion 82 of the third nozzle piping 13, a third connection portion 84 to which the other end side (the right side in FIG. 6) of the third common piping 83 is connected, a third drain piping 85, one end side (the left side in FIG. 6) of which is connected to the third connection portion 84, a first front surface improving agent piping 86, one end side (the left side in FIG. 6) of which is connected to the third connection portion 84, a second front surface improving agent piping 87, one end side (the left side in FIG. 6) of which is connected to the third connection portion 84, and a front surface improving agent suction piping 89, one end side (the left side in FIG. 6) of which is connected to the third connection portion 84. One example of the front surface improving agent is a hydrophobic agent. The hydrophobic agent may be a silicon-based hydrophobic agent or a metal-based hydrophobic agent.

The silicon-based hydrophobic agent is a hydrophobic agent that hydrophobizes silicon (Si) itself and a compound that contains silicon. The silicon-based hydrophobic agent is, for example, a silane coupling agent. The silane coupling agent includes, for example, at least one of HMDS (hexamethyldisilazane), TMS (tetramethylsilane), fluorinated alkylchlorosilane, alkyldisilazane, and a non-chloro-based hydrophobic agent. The non-chloro-based hydrophobic agent includes, for example, at least one of dimethylsilyldimethylamine, dimethylsilyldiethylamine, hexamethyldisilazane, tetramethyldisilazane, bis (dimethylamino) dimethylsilane, N, N-dimethylaminotrimethylsilane, N-(trimethylsilyl) dimethylamine and an organosilane compound.

The metal-based hydrophobic agent is, for example, a solvent which has a high coordinating property and hydrophobizes a metal mainly by coordination bonds. The hydrophobic agent includes, for example, at least one of amine having a hydrophobic group and an organosilicon compound.

A third common valve 90 for opening and closing the third common piping 83 is interposed in the third common piping 83.

A third drain valve 91 for opening and closing the third drain piping 85 is interposed in the third drain piping 85. The other end side of the third drain piping 85 is connected to external waste liquid treatment equipment.

A first front surface improving agent valve 92 for opening and closing the first front surface improving agent piping 86 is interposed in the first front surface improving agent piping 86. An undiluted solution of first front surface improving agent is arranged to be supplied from a supplying source of the undiluted solution of first front surface improving agent to the other end side of the first front surface improving agent piping 86.

A second front surface improving agent valve 93 for opening and closing the second front surface improving agent piping 87 is interposed in the second front surface improving agent piping 87. An undiluted solution of second front surface improving agent is arranged to be supplied from a supplying source of the undiluted solution of second front surface improving agent to the other end side of the second front surface improving agent piping 87.

A first front surface improving agent suction device (first suction device) 95 is interposed in the third common piping 83 at a portion downstream from a position at which the third common valve 90 is interposed. The first front surface improving agent suction device 95 is a diaphragm type suction device similar to the first organic solvent suction device 75.

A front surface improving agent suction valve 96 for opening and closing the front surface improving agent suction piping 89 is interposed in the front surface improving agent suction piping 89. A second front surface improving agent suction device (second suction device) 97 is connected to the other end side (leading end) of the front surface improving agent suction piping 89. The second front surface improving agent suction device 97 is an ejector type suction device similar to the second chemical liquid/rinse liquid suction device 57.

When the first front surface improving agent valve 92 and the second front surface improving agent valve 93 and the third common valve 90 are opened in a state that other valves are closed, the undiluted solution of first front surface improving agent from the first front surface improving agent piping 86 and the undiluted solution of second front surface improving agent from the second front surface improving agent piping 87 flow into the third connection portion 84 and are mixed in the third connection portion 84 to generate a front surface improving agent. This front surface improving agent is supplied to the third nozzle piping 13 and the front surface improving agent is discharged downward from the third discharge port 12.

Further, when the first front surface improving agent valve 92 and the third drain valve 91 are opened in a state that other valves are closed, the undiluted solution of first front surface improving agent is supplied from the first front surface improving agent piping 86 to the third drain piping 85. Thereby, it is possible to drain (discard) the undiluted solution of first front surface improving agent inside the first front surface improving agent piping 86.

Further, when the second front surface improving agent valve 93 and the third drain valve 91 are opened in a state that other valves are closed, the undiluted solution of second front surface improving agent is supplied from the second front surface improving agent piping 87 to the third drain piping 85. Thereby, it is possible to drain (discard) the undiluted solution of second front surface improving agent inside the second front surface improving agent piping 87.

The first front surface improving agent suction device 95 is operated by the controller 3 (a function of the first front surface improving agent suction device 95 is enabled). In this operating state, the front surface improving agent contained in the third common piping 83 is drawn into the first front surface improving agent suction device 95. The first front surface improving agent suction device 95 is relatively weak in suction force and also relatively slow in suction speed thereof.

Further, the second front surface improving agent suction device 97 is arranged to be made, for example, in a constant operating state. When the second front surface improving agent suction device 97 is in an operating state and the front surface improving agent suction valve 96 is opened, a function of the second front surface improving agent suction device 97 is enabled, and an interior of the front surface improving agent suction piping 89 is suctioned. Thereby, the front surface improving agent which is contained in the front surface improving agent suction piping 89, the third connection portion 84, the third common piping 83 and the third nozzle piping 13 is drawn into the front surface improving agent suction piping 89. The second front surface improving agent suction device 97 is stronger in suction force than the first front surface improving agent suction device 95 and also slower in suction speed thereof than the first front surface improving agent suction device 95.

With regard to the third supply/suction unit 16, the processing liquid supplying unit is arranged by the third common piping 83, the third connection portion 84, the first front surface improving agent piping 86, the first front surface improving agent valve 92 and the second front surface improving agent valve 93. Further, with regard to the third supply/suction unit 16, the suction unit is arranged by the third common piping 83, the first front surface improving agent suction device 95, the third connection portion 84, the front surface improving agent suction piping 89, and the second front surface improving agent suction device 97.

Figure 7:
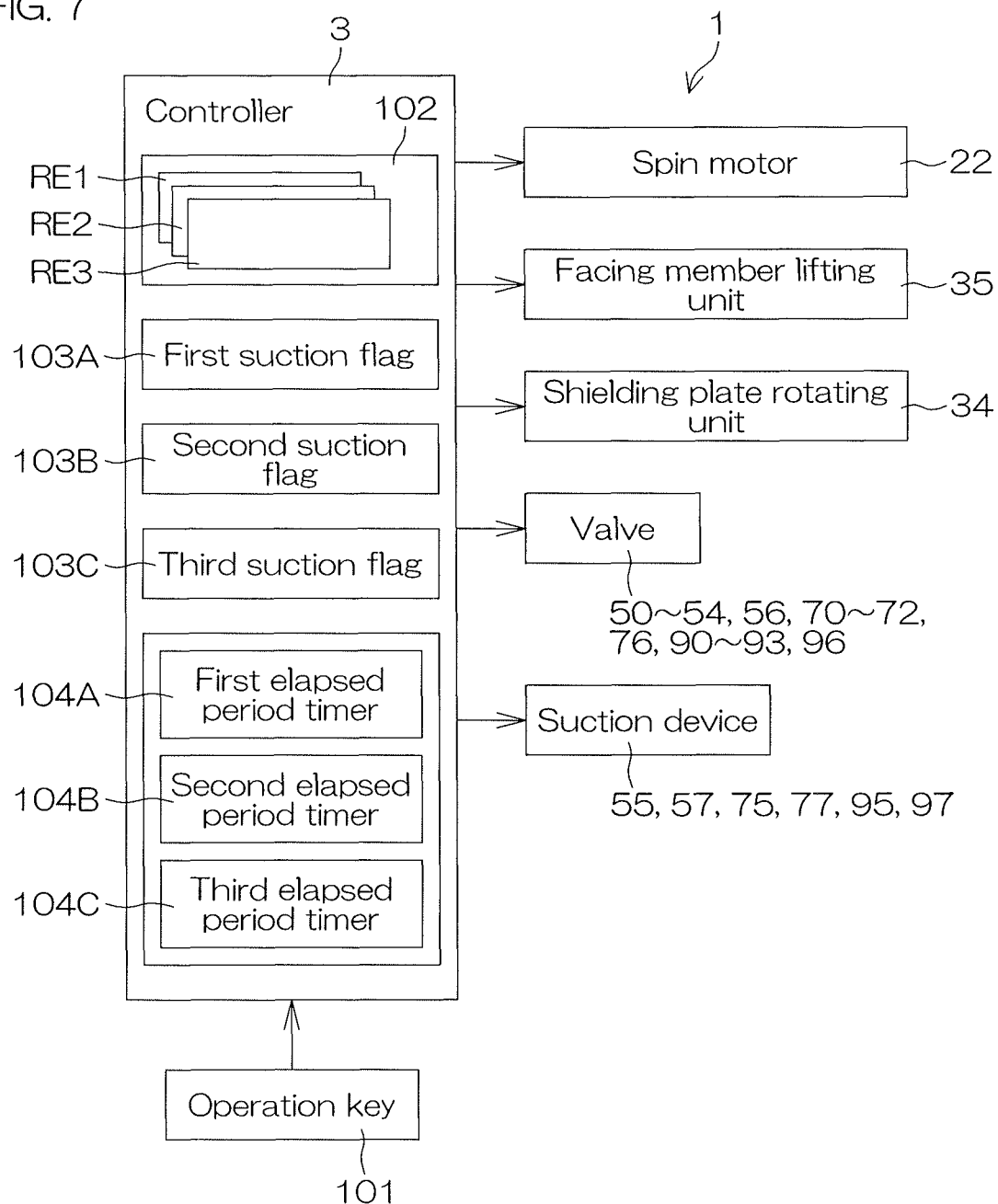
FIG. 7 is a block diagram which describes an electrical arrangement of main portions of the substrate processing apparatus.

FIG. 7 is a block diagram for describing an electrical arrangement of main portions of the substrate processing apparatus 1.

The controller 3 is, for example, arranged by using a microcomputer. An operation key 101 which is operated by a user of the substrate processing apparatus 1, etc., is connected to the controller 3. The controller 3 has a computing unit such as CPU, etc., a storage unit such as a fixed memory device, a hard disk drive, etc., and an input/output unit (not shown). A program executed by the computing unit is stored in the storage unit.

The storage unit includes a recipe storage portion 102 which stores recipes for storing contents of various types of processing given to a substrate W. The recipe storage portion 102 is arranged by a nonvolatile memory by which data is electrically rewritable. A user is able to create recipes by operating the operation key 101 to input execution contents such as the number of rotations of a substrate W in various processing steps. The recipes created by operating the operation key 101 are stored (saved) in the recipe storage portion 102.

The recipes stored (saved) at the recipe storage portion 102 (refer to FIG. 7) include a chemical liquid supply recipe RE1 to be used to execute the chemical liquid supplying step (S3 in FIG. 8), an organic solvent supply recipe RE2 to be used to execute the organic solvent supplying step (S5, S7 in FIG. 8) and a front surface improving agent supply recipe RE3 to be used to execute the front surface improving agent supplying step (S6 in FIG. 8).

Processing conditions of the chemical liquid supplying step (S3 in FIG. 8) are determined in the chemical liquid supply recipe RE1. Specifically, there are determined processing conditions such as a rotational speed, a processing period, etc., of a substrate W in the chemical liquid supplying step (S3 in FIG. 8). Further, the chemical liquid supply recipe RE1 is designated to perform suction motions by using the first chemical liquid/rinse liquid suction device 55 (refer to FIG. 4) after discharge of a chemical liquid. On the basis of the above-described chemical liquid supply recipe RE1, the chemical liquid supplying step (S3 in FIG. 8) is executed.

Processing conditions of the first organic solvent supplying step (S5 in FIG. 8) and processing conditions of the second organic solvent supplying step (S7 in FIG. 8) are determined in the organic solvent supply recipe RE2. Specifically, there are determined processing conditions such as a rotational speed, a processing period, etc., of a substrate W in the first organic solvent supplying step (S5 in FIG. 8) and in the second organic solvent supplying step (S7 in FIG. 8). Further, the organic solvent supply recipe RE2 is designated to perform suction motions by using the first organic solvent suction device 75 (refer to FIG. 5) after discharge of an organic solvent. On the basis of the above-described organic solvent supply recipe RE2, the first organic solvent supplying step (S5 in FIG. 8) and the second organic solvent supplying step (S7 in FIG. 8) are executed.

Processing conditions of the front surface improving agent supplying step (S6 in FIG. 8) are determined in the front surface improving agent supply recipe RE3. Specifically, there are determined processing conditions of a rotational speed, a processing period, etc., of a substrate W in the front surface improving agent supplying step (S6 in FIG. 8). Further, the front surface improving agent supply recipe RE3 is designated to perform suction motions by using the first front surface improving agent suction device 95 (refer to FIG. 6) after discharge of a front surface improving agent. On the basis of the above-described front surface improving agent supply recipe RE3, the front surface improving agent supplying step (S6 in FIG. 8) is executed.

Further, the storage unit includes a first suction flag 103A to be used for setting a mode of suction in the chemical liquid supplying step (S3 in FIG. 8), a second suction flag 103B to be used for setting a mode of suction in the first organic solvent supplying step (S5 in FIG. 8) and in the second organic solvent supplying step (S7 in FIG. 8), and a third suction flag 103C to be used for setting a mode of suction in the front surface improving agent supplying step (S6 in FIG. 8).

A predetermined value (5A [H] or 00 [H]) is selected and loaded in each of the suction flags 103A, 103B, 103C. And, 00 [H] is loaded, as an initial, in the suction flags 103A, 103B, 103C. Where a predetermined period has elapsed from the end of a previous chemical liquid supplying step (S3 in FIG. 8), 5A [H] is loaded in the first suction flag 103A. Where a predetermined period has elapsed from the end of a previous first organic solvent supplying step (S5 in FIG. 8) or from the end of a previous second organic solvent supplying step (S7 in FIG. 8), 5A [H] is loaded in the second suction flag 103B. Where a predetermined period has elapsed from the end of a previous front surface improving agent supplying step (S6 in FIG. 8), 5A [H] is loaded in the third suction flag 103C. Where 5A [H] is loaded in the suction flags 103A, 103B and 103C, the suction flag concerned is in an on state. On the other hand, where 00 [H] is loaded in the suction flags 103A, 103B, 103C, the suction flag concerned is in an off state.

The controller 3 also has a built-in timer. The timer includes a first elapsed period timer 104A which checks (measures) an elapsed period after the end of a previous chemical liquid supplying step (S3 in FIG. 8) (that is, after the end of discharge of a previous chemical liquid from the first discharge port 8), a second elapsed period timer 104B which checks (measures) an elapsed period after the end of a previous first organic solvent supplying step (S5 in FIG. 8) or after the end of a previous second organic solvent supplying step (S7 in FIG. 8) (that is, after the end of discharge of a previous organic solvent from the second discharge port 10), and a third elapsed period timer 104C which checks (measures) an elapsed period from after the end of a previous front surface improving agent supplying step (S6 in FIG. 8) (that is, after the end of discharge of a previous front surface improving agent from the third discharge port 12).

Further, the controller 3 controls motions of the spin motor 22, the facing member lifting unit 35, the shielding plate rotating unit 34, the first chemical liquid/rinse liquid suction device 55, the second chemical liquid/rinse liquid suction device 57, the first organic solvent suction device 75, the second organic solvent suction device 77, the first front surface improving agent suction device 95, and the second front surface improving agent suction device 97, etc. The controller 3 also opens and closes the first common valve 50, the first drain valve 51, the chemical liquid valve 52, the rinse liquid valve 53, the first chemical liquid/rinse liquid suction valve 54, the second chemical liquid/rinse liquid suction valve 56, the second common valve 70, the second drain valve 71, the organic solvent valve 72, the organic solvent suction valve 76, the third common valve 90, the third drain valve 91, the first front surface improving agent valve 92, the second front surface improving agent valve 93, and the front surface improving agent suction valve 96, etc.

A substrate W is carried in the processing unit 2 in a state of being held by a hand (not shown) of a substrate transfer robot (not shown). When the substrate W is carried in the processing unit 2, the computing unit of the controller 3 reads out a recipe corresponding to the substrate W from the recipe storage portion 102. Control parameters for sequentially executing each of the steps described below are set in the recipe. Then, the controller 3 controls the processing unit 2, thereby executing a series of processing defined by the read-out recipe.

FIG. 8 is a flowchart for describing an example of the substrate processing by the processing unit 2. FIG. 9 to FIG. 12 are each a drawing for showing discharge motions and suction motions of a chemical liquid in the chemical liquid supplying step (S3 in FIG. 8). FIG. 13 to FIG. 16 are each a drawing for showing discharge motions and suction motions of an organic solvent in the first organic solvent supplying step (S5 in FIG. 8) and in the second organic solvent supplying step (S7 in FIG. 8). With reference to FIG. 1 to FIG. 8, a description will be given of an example of the substrate processing. FIG. 9 to FIG. 16 will be referred whenever necessary. The example of the substrate processing may include etching processing or cleaning processing. With regard to execution of the example of the substrate processing, the recipe read out from the recipe storage portion 102 is always referred to.

Upon execution of the example of the substrate processing, a substrate W which is not yet processed is carried in the chamber 4 (Step 1 in FIG. 8).

Specifically, the hand of the substrate transfer robot which holds a substrate W is allowed to enter into an interior of the chamber 4, and the substrate W is delivered to the spin chuck 5 in a state that a front surface thereof (a surface to be processed by a chemical liquid) is directed upward. Thereafter, the substrate W is held by the spin chuck 5.

Thereafter, the controller 3 starts rotation of the substrate W by using the spin motor 22 (Step S2 in FIG. 8). The substrate W is increased in speed up to a predetermined liquid processing speed (in a range of about 10 to 1200 rpm, for example, about 1000 rpm) and kept at the liquid processing speed.

Then, the controller 3 executes the chemical liquid supplying step (Step S3 in FIG. 8) in which a chemical liquid is supplied to an upper surface of the substrate W. The controller 3 opens the chemical liquid valve 52 and the first common valve 50, while closing other valves. Thereby, as shown in FIG. 9, the chemical liquid is discharged to a central portion of the upper surface of the substrate W from the first discharge port 8 formed on the substrate facing surface 29 of the shielding plate 27. The chemical liquid supplied to the upper surface of the substrate W moves to a peripheral edge portion of the substrate W upon receipt of a centrifugal force resulting from rotation of the substrate W. Thereby, the upper surface of the substrate W is entirely processed by using the chemical liquid.

When a predetermined period has elapsed from the start of discharge of the chemical liquid, the controller 3 closes the chemical liquid valve 52. Thereby, as shown in FIG. 10, discharge of the chemical liquid from the first discharge port 8 is stopped. At this time, in the first nozzle piping 9, the chemical liquid remains inside the first common piping 43 and the first connection portion 44.

Thereafter, the controller 3 enables only one of a function of the first chemical liquid/rinse liquid suction device 55 and that of the second chemical liquid/rinse liquid suction device 57 to suction a chemical liquid inside the first nozzle piping 9. Whether the function of the first chemical liquid/rinse liquid suction device 55 or that of the second chemical liquid/rinse liquid suction device 57 is enabled will be determined by referring to a value of the first suction flag 103A corresponding to the first supply/suction unit 14.

Where the suction flag 103 is in an off state, the controller 3 closes the first common valve 50 and also opens the first chemical liquid/rinse liquid suction valve 54, thereby enabling the function of the first chemical liquid/rinse liquid suction device 55. Accordingly, there is suctioned an interior of a portion of the first common piping 43 upstream from a branched portion of the first chemical liquid/rinse liquid suction piping 48. As shown in FIG. 11, the chemical liquid remaining inside the upstream portion thereof is drawn into the first chemical liquid/rinse liquid suction piping 48 by a relatively weak suction force. The chemical liquid is suctioned until a leading end surface of the chemical liquid is allowed to recede to a predetermined standby position set inside the first right/left direction portion 42. When the leading end surface of the chemical liquid has receded to the standby position, the controller 3 closes the first chemical liquid/rinse liquid suction valve 54 and the first common valve 50.

On the other hand, where the suction flag 103 is in an on state, the controller 3 opens the second chemical liquid/rinse liquid suction valve 56 in a state that the first common valve 50 is closed, thereby enabling the function of the second chemical liquid/rinse liquid suction device 57. Thereby, as shown in FIG. 12, an interior of the first connection portion 44 is suctioned and a chemical liquid remaining inside the first nozzle piping 9 and the first common piping 43 passes through the first connection portion 44 and is drawn into the second chemical liquid/rinse liquid suction piping 49 by a relatively strong suction force. When the chemical liquid is thoroughly drained from each interior of the first nozzle piping 9, the first common piping 43, the first connection portion 44 and the second chemical liquid/rinse liquid suction piping 49, the controller 3 closes the second chemical liquid/rinse liquid suction valve 56 and the first common valve 50.

The chemical liquid supplying step S3 is ended by closing of the first common valve 50.

Then, the controller 3 executes a rinsing step in which a rinse liquid is supplied to the upper surface of the substrate W (Step S4 in FIG. 8). The controller 3 opens the rinse liquid valve 53 and the first common valve 50, while closing other valves. Thereby, the rinse liquid is discharged from the first discharge port 8 formed on the substrate facing surface 29 of the shielding plate 27 to a central portion of the upper surface of the substrate W. The rinse liquid supplied to the upper surface of the substrate W moves to a peripheral edge portion of the substrate W upon receipt of a centrifugal force resulting from rotation of the substrate W. Thereby, the chemical liquid on the upper surface of the substrate W is replaced by the rinse liquid.

When a predetermined period has elapsed from the start of discharge of the rinse liquid, in a state that the upper surface of the substrate W is entirely covered with the rinse liquid, the controller 3 controls the spin motor 22, thereby decelerating in a stepwise manner a rotational speed of the substrate W from a liquid processing speed to a paddle speed (zero or a low rotational speed of about 40 rpm or lower, in an example of the first substrate processing, for example, about 10 rpm). Thereafter, the rotational speed of the substrate W is kept at the paddle speed. Thereby, a liquid film of the rinse liquid which covers the upper surface of the substrate W in its entirety is supported in a paddle shape on the upper surface of the substrate W. In this state, a centrifugal force which acts on the liquid film of the rinse liquid on the upper surface of the substrate W is smaller than a surface tension acting between the rinse liquid and the upper surface of the substrate W. Alternatively, the centrifugal force substantially competes with the above-described surface tension. Due to deceleration of the substrate W, the centrifugal force acting on the rinse liquid on the substrate W is decreased to reduce an amount of the rinse liquid drained from the substrate W.

When a predetermined period has elapsed from deceleration of the substrate W to the paddle speed, the controller 3 closes the rinse liquid valve 53 and the first common valve 50. Thereby, discharge of the rinse liquid from the first discharge port 8 is stopped. At this time, the rinse liquid remains inside the first nozzle piping 9, the first common piping 43 and the first connection portion 44.

Thereafter, in a state that the first common valve 50 is closed, the controller 3 enables only the function of the first chemical liquid/rinse liquid suction device 55 to suction the rinse liquid inside the first nozzle piping 9. Thereby, there is suctioned an interior of a portion of the first common piping 43 upstream from a branched portion of the first chemical liquid/rinse liquid suction piping 48. The rinse liquid remaining inside the upstream portion thereof is then drawn into the first chemical liquid/rinse liquid suction piping 48 by a relatively weak suction force. The rinse liquid is suctioned until the leading end surface of the rinse liquid has receded to a predetermined standby position set inside the first right/left direction portion 42. When the leading end surface of the rinse liquid has receded up to a standby position, the controller 3 closes the first chemical liquid/rinse liquid suction valve 54. Thereby, the rinsing step S4 is ended.

Then, the controller 3 executes a first organic solvent supplying step (Step S5 in FIG. 8) in which the rinse liquid present on the upper surface of the substrate W is replaced by the organic solvent (for example, IPA). Specifically, the controller 3 controls the facing member lifting unit 35 to dispose the shielding plate 27 at a processing position between the proximity position and the retracted position.

Further, the controller 3 opens the organic solvent valve 72 and the second common valve 70, while closing other valves, with rotation of the substrate W kept at the paddle speed. Thereby, as shown in FIG. 13, an organic solvent is discharged from the second discharge port 10 formed on the substrate facing surface 29 of the shielding plate 27 to a central portion of the upper surface of the substrate W. The organic solvent supplied to the upper surface of the substrate W moves to a peripheral edge portion of the substrate W upon receipt of a centrifugal force resulting from rotation of the substrate W. Thereby, the rinse liquid on the upper surface of the substrate W is replaced by the organic solvent.

When a predetermined period has elapsed from the start of discharge of the organic solvent, the controller 3 closes the organic solvent valve 72 and the second common valve 70. Thereby, as shown in FIG. 14, discharge of the organic solvent from the second discharge port 10 is stopped. At this time, the organic solvent remains inside the second nozzle piping 11, the second common piping 63 and the second connection portion 64.

Thereafter, in a state that the second common valve 70 is closed, the controller 3 enables only one of the function of the first organic solvent suction device 75 and that of the second organic solvent suction device 77 to suction the organic solvent inside the second nozzle piping 11. Whether the function of the first organic solvent suction device 75 or that of the second organic solvent suction device 77 is enabled is determined by referring to a value of the second suction flag 103B corresponding to the second supply/suction unit 15.

Where the second suction flag 103B is in an off state, the controller 3 operates the first organic solvent suction device 75 to enable the function of the first organic solvent suction device 75. Thereby, there is suctioned an interior of a portion of the second common piping 63 (a portion on the side of the second discharge port 10) downstream from a portion in which the first organic solvent suction device 75 is interposed. And, as shown in FIG. 15, the organic solvent remaining inside the downstream portion is drawn into an interior (a region expanded by actuation of a diaphragm) of the first organic solvent suction device 75 by a relatively weak suction force. The organic solvent is suctioned until a leading end surface of the organic solvent has receded to a predetermined standby position set inside the second right/left direction portion 62. At this time, an amount of the organic solvent which has been suctioned is about 0.1 to 1 milliliter. When the leading end surface of the organic solvent has receded to the standby position, the controller 3 closes the second common valve 70.

On the other hand, where the second suction flag 103B is in an on state, the controller 3 opens the organic solvent suction valve 76 to enable the function of the second organic solvent suction device 77. Thereby, an interior of the second connection portion 64 is suctioned and, as shown in FIG. 16, the organic solvent remaining inside the second nozzle piping 11 and the second common piping 63 passes through the second connection portion 64 and is drawn into the organic solvent suction piping 69 by a relatively strong suction force. When the organic solvent is thoroughly drained from each interior of the second nozzle piping 11, the second common piping 63, the second connection portion 64 and the organic solvent suction piping 69, the controller 3 closes the organic solvent suction valve 76 and the second common valve 70.

The first organic solvent supplying step S5 is ended by closing of the second common valve 70.

Then, the controller 3 executes a front surface improving agent supplying step (Step S6 in FIG. 8) in which the rinse liquid present on the upper surface of the substrate W is replaced by a liquid type front surface improving agent. Specifically, the controller 3 opens the first front surface improving agent valve 92, the second front surface improving agent valve 93 and the third common valve 90 while closing other valves, with the shielding plate 27 kept at a processing position. Thereby, the front surface improving agent is discharged from the third discharge port 12 formed on the substrate facing surface 29 of the shielding plate 27 to a central portion of the upper surface of the substrate W. The front surface improving agent supplied to the upper surface of the substrate W moves to a peripheral edge portion of the substrate W upon receipt of a centrifugal force resulting from rotation of the substrate W. Thereby, the organic solvent on the upper surface of the substrate W is replaced by the front surface improving agent.

When a predetermined period has elapsed from the start of discharge of the front surface improving agent, the controller 3 closes the first front surface improving agent valve 92, the second front surface improving agent valve 93 and the third common valve 90. Thereby, discharge of the front surface improving agent from the third discharge port 12 is stopped. At this time, the front surface improving agent remains inside the third nozzle piping 13, the third common piping 83 and the third connection portion 84.

Thereafter, in a state that the third common valve 90 is closed, the controller 3 enables only one of the function of the first front surface improving agent suction device 95 and that of the second front surface improving agent suction device 97 to suction the front surface improving agent inside the third nozzle piping 13. Whether the function of the first front surface improving agent suction device 95 or that of the second front surface improving agent suction device 97 is enabled is determined by referring to a value of the third suction flag 103C corresponding to the third supply/suction unit 16.

Where the third suction flag 103C is in an off state, the controller 3 operates the first front surface improving agent suction device 95 to enable the function of the first front surface improving agent suction device 95. Thereby, there is suctioned an interior of a portion of the third common piping 83 (a portion on the side of the third discharge port 12) downstream from a portion in which the first front surface improving agent suction device 95 is interposed. The front surface improving agent remaining inside the downstream portion is drawn into an interior (a region expanded by actuation of a diaphragm) of the first front surface improving agent suction device 95 by a relatively weak suction force. The front surface improving agent is suctioned until a leading end surface of the front surface improving agent has receded to a predetermined standby position set inside the second right/left direction portion 62. At this time, an amount of the front surface improving agent which has been suctioned is about 0.1 to 1 milliliter. When the leading end surface of the front surface improving agent has receded to a standby position, the controller 3 closes the third common valve 90.

On the other hand, where the third suction flag 103C is in an on state, the controller 3 opens the front surface improving agent suction valve 96 to enable the function of the second front surface improving agent suction device 97. Thereby, an interior of the third connection portion 84 is suctioned, and the front surface improving agent remaining inside the third nozzle piping 13 and the third common piping 83 passes through the third connection portion 84 and is drawn into the front surface improving agent suction piping 89 by a relatively strong suction force. When the front surface improving agent is thoroughly drained from each interior of the third nozzle piping 13, the third common piping 83, the third connection portion 84 and the front surface improving agent suction piping 89, the controller 3 closes the front surface improving agent suction valve 96 and the third common valve 90.

The front surface improving agent supplying step S6 is ended by closing of the third common valve 90.

Then, the controller 3 executes a second organic solvent supplying step (Step S7 in FIG. 8) in which the rinse liquid present on the upper surface of the substrate W is replaced by an organic solvent (for example, IPA). Specifically, the controller 3 opens the organic solvent valve 72 and the second common valve 70 while closing other valves, with the shielding plate 27 kept at a processing position and also rotation of the substrate W kept at a spin dry speed. Thereby, as shown in FIG. 13, the organic solvent is discharged from the second discharge port 10 to a central portion of the upper surface of the substrate W. The organic solvent supplied to the upper surface of the substrate W moves to a peripheral edge portion of the substrate W upon receipt of a centrifugal force resulting from rotation of the substrate W. Thereby, the front surface improving agent on the upper surface of the substrate W is replaced by the organic solvent.

When a predetermined period has elapsed from the start of discharge of the organic solvent, the controller 3 closes the organic solvent valve 72 and the second common valve 70. Thereby, as shown in FIG. 14, discharge of the organic solvent from the second discharge port 10 is stopped. At this time, the organic solvent remains inside the second nozzle piping 11, the second common piping 63 and the second connection portion 64.

Thereafter, in a state that the second common valve 70 is closed, the controller 3 enables only one of the function of the first organic solvent suction device 75 and that of the second organic solvent suction device 77 to suction the organic solvent inside the second nozzle piping 11. Whether the function of the first organic solvent suction device 75 or that of the second organic solvent suction device 77 is enabled is determined by referring to a value of the second suction flag 103B corresponding to the second supply/suction unit 15.

Where the second suction flag 103B is in an off state, the controller 3 operates the first organic solvent suction device 75 to enable the function of the first organic solvent suction device 75. Thereby, there is suctioned an interior of a portion of the second common piping 63 upstream from a portion in which the first organic solvent suction device 75 is interposed. And, as shown in FIG. 15, the organic solvent remaining inside the upstream portion is drawn into an interior of the first organic solvent suction device 75 (a region expanded by actuation of a diaphragm) by a relatively weak suction force. The organic solvent is suctioned until a leading end surface of the organic solvent has receded to a predetermined standby position set inside the second right/left direction portion 62. At this time, an amount of the organic solvent which has been suctioned is about 0.1 to 1 milliliter. When the leading end surface of the organic solvent has receded to the standby position, the controller 3 closes the second common valve 70.

On the other hand, where the second suction flag 103B is in an on state, the controller 3 opens the organic solvent suction valve 76 to enable the function of the second organic solvent suction device 77, thereby suctioning an interior of the second connection portion 64. As shown in FIG. 16, the organic solvent remaining inside the second nozzle piping 11 and the second common piping 63 passes through the second connection portion 64 and is drawn into the organic solvent suction piping 69 by a relatively strong suction force. When the organic solvent is thoroughly drained from each interior of the second nozzle piping 11, the second common piping 63, the second connection portion 64 and the organic solvent suction piping 69, the controller 3 closes the organic solvent suction valve 76 and the second common valve 70.

The second organic solvent supplying step S7 is ended by closing of the second common valve 70.

Then, there is executed a spin drying step (Step S8 in FIG. 8) in which a substrate W is dried. Specifically, the controller 3 controls the facing member lifting unit 35 to dispose the shielding plate 27 at a proximity position. When the shielding plate 27 is at a processing position, the shielding plate 27 shields the upper surface of the substrate W from a peripheral space thereof. The controller 3 also controls the spin motor 22 to accelerate the substrate W up to a drying rotational speed (for example, several thousand rpm) greater than a rotational speed at each of the steps from the chemical liquid supplying step S3 to the second organic solvent supplying step S7, thereby rotating the substrate W at the drying rotational speed. Thereby, a greater centrifugal force is applied to a liquid on the substrate W and the liquid adhered to the substrate W is spun off to a periphery of the substrate W. Thus, the liquid is removed from the substrate W to dry the substrate W.

When a predetermined period has elapsed from acceleration of the substrate W, the controller 3 controls the spin motor 22 to stop rotation of the substrate W by the spin chuck 5 (Step S9 in FIG. 8). Thereafter, the controller 3 controls the facing member lifting unit 35 so that the shielding plate 27 can be raised and disposed at a retracted position.

Next, the substrate W is carried out from an interior of the chamber 4 (Step S10 in FIG. 8). Specifically, the controller 3 allows a hand (not shown) of the substrate transfer robot (not shown) to enter into the chamber 4. Then, the controller 3 holds the substrate W on the spin chuck 5 by using the hand of the substrate transfer robot. Thereafter, the controller 3 allows the hand of the substrate transfer robot to retract from an interior of the chamber 4. Thereby, the substrate W after cleaning is carried out from the chamber 4.

Figure 17:
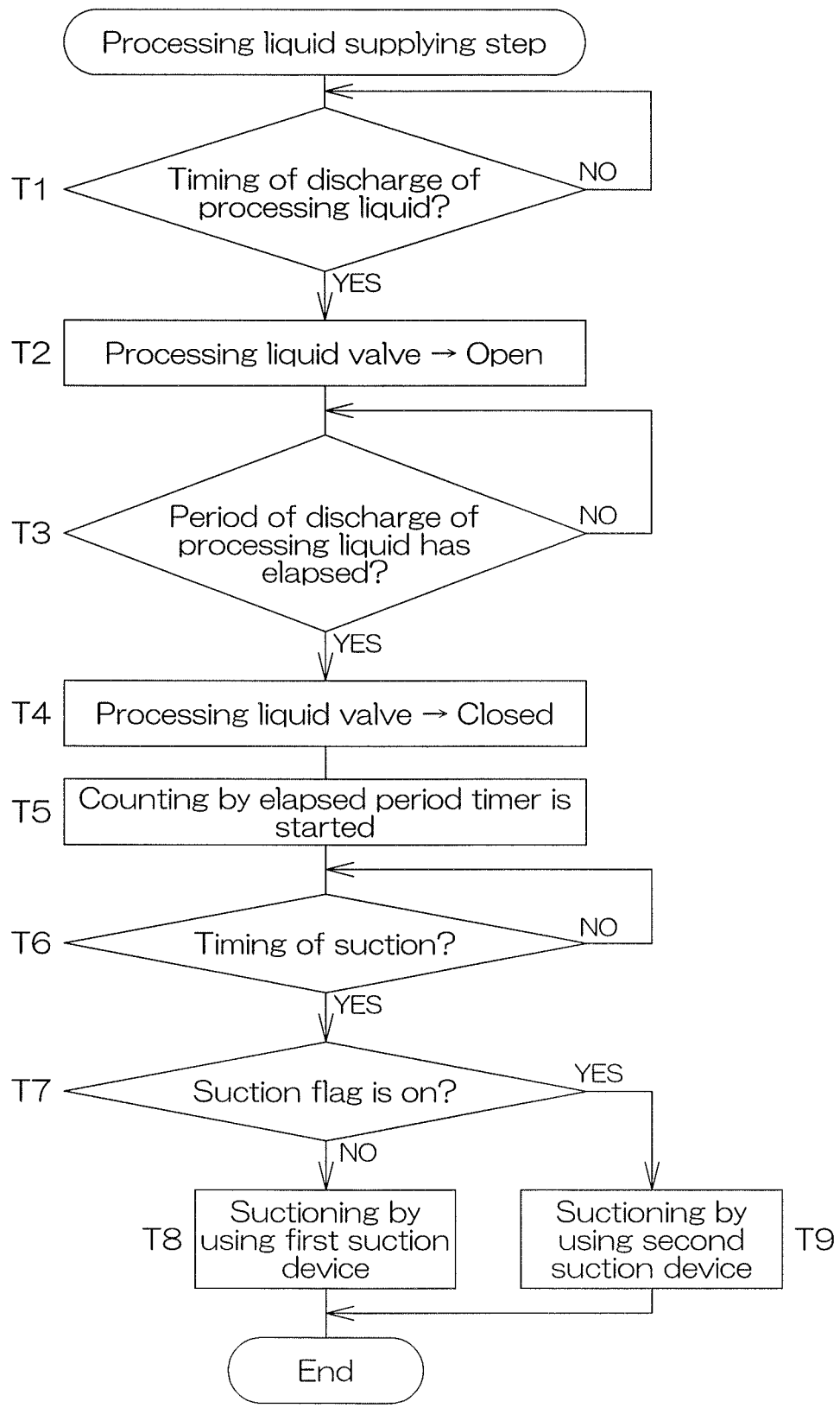
FIG. 17 is a flowchart for describing in detail each of processing liquid supplying steps included in the example of substrate processing.

FIG. 17 is a flowchart for describing in detail discharge motions and suction motions of a processing liquid in each of the processing liquid supplying steps (Steps S3, S5 to S7 in FIG. 8).

In each of the processing liquid supplying steps (S3, S5 to S7 in FIG. 8), when a predetermined timing for the start of discharge of the processing liquid is reached (YES in Step T1), the controller 3 closes other valves and opens the processing liquid valve (the chemical liquid valve 52, the organic solvent valve 72 or the front surface improving agent valves 92, 93) to be used in the processing concerned (Step T2) and also opens the common valve (the first common valve 50, the second common valve 70 or the third common valve 90) corresponding to the processing liquid valve concerned. Thereby, the processing liquid (a chemical liquid, an organic solvent or a front surface improving agent) is discharged from the discharge port (the first discharge port 8, the second discharge port 10 or the third discharge port 12).

When a period of discharge of the processing liquid designated by the supply recipe RE1, RE2 or RE3 has elapsed from the start of discharge of the processing liquid (YES in Step T3), the controller 3 closes the processing liquid valve to be used in the processing (Step T4). Thereby, discharge of the processing liquid from the discharge port is stopped.

Further, when the period of discharge of the processing liquid has elapsed from the start of discharge of the processing liquid (YES in Step T3), time counting is started by the elapsed period timer (a first elapsed period timer 104A, a second elapsed period timer 104B or a third elapsed period timer 104C) (the start of an elapsed time measuring step, Step T5). Thereafter, there is reached a predetermined timing for the start of discharge of the processing liquid.

In the processing liquid supplying steps (S3, S5 to S7 in FIG. 8), when the predetermined suction timing is reached (YES in Step T6), the controller 3 refers to a value of the corresponding suction flag (the first suction flag 103A, the second suction flag 103B or the third suction flag 103C). Where the value of the corresponding suction flag is 00 [H] (the suction flag is off), the computing unit of the controller 3 enables the function of the corresponding first suction device (the first chemical liquid/rinse liquid suction device 55, the first organic solvent suction device 75 or the first front surface improving agent suction device 95) to perform suction motions of the processing liquid. On the other hand, where the value of the corresponding suction flag is 5A [H] (the suction flag is on), the computing unit of the controller 3 enables the corresponding second suction device (the second chemical liquid/rinse liquid suction device 57, the second organic solvent suction device 77 or the second front surface improving agent suction device 97) to perform suction motions of the processing liquid.

As described so far, according to the present preferred embodiment, in suctioning performed at the end of each of the processing liquid supplying steps (S3, S5 to S7 in FIG. 8), where an elapsed period from the end of stop of discharge of the processing liquid is shorter than a reference period, the processing liquid is suctioned by a relatively weak suction force. On the other hand, where an elapsed period is longer than the reference period, the processing liquid is suctioned by a relatively strong suction force.

Where a period from the stop of discharge of the processing liquid has not elapsed, the processing liquid (a chemical liquid, an organic solvent, a front surface improving agent, etc.) remaining inside the nozzle pipings 9, 11, 13 is used again in the subsequent processing liquid supplying step. In this case, the processing liquid is suctioned so that a leading end surface of the processing liquid can recede to a predetermined position. Therefore, where an elapsed period from the end of stop of discharge of the processing liquid is shorter than a reference period, the processing liquid is suctioned by a relatively weak suction force. Thereby, the leading end surface of the processing liquid is allowed to recede to a predetermined position accurately. As a result, it is possible to eliminate dripping of the processing liquid.

On the other hand, where a long period of time has elapsed from the stop of discharge of the processing liquid, the processing liquid (a chemical liquid, an organic solvent, a front surface improving agent, etc.) remaining inside the nozzle pipings 9, 11, 13 and the common pipings 43, 63, 83 may be changed with time (changed in temperature or changed in composition). It is not desirable to use the above-described processing liquid for processing as it is and, therefore, it is necessary to drain the liquid outside the apparatus prior to execution of the subsequent processing liquid suction supplying step (what is called pre-dispensing). Where an elapsed period from the stop of discharge of the processing liquid is longer than a reference period, the processing liquid is suctioned by a strong suction force. Thereby, the processing liquid undergoes a change with time can be drained from each interior of the nozzle pipings 9, 11, 13 and the common pipings 43, 63, 83.

As described so far, it is possible to suction the processing liquid remaining inside the nozzle pipings 9, 11, 13 and the common pipings 43, 63, 83 in a mode suited to a state of the processing liquid.

Figure 18:
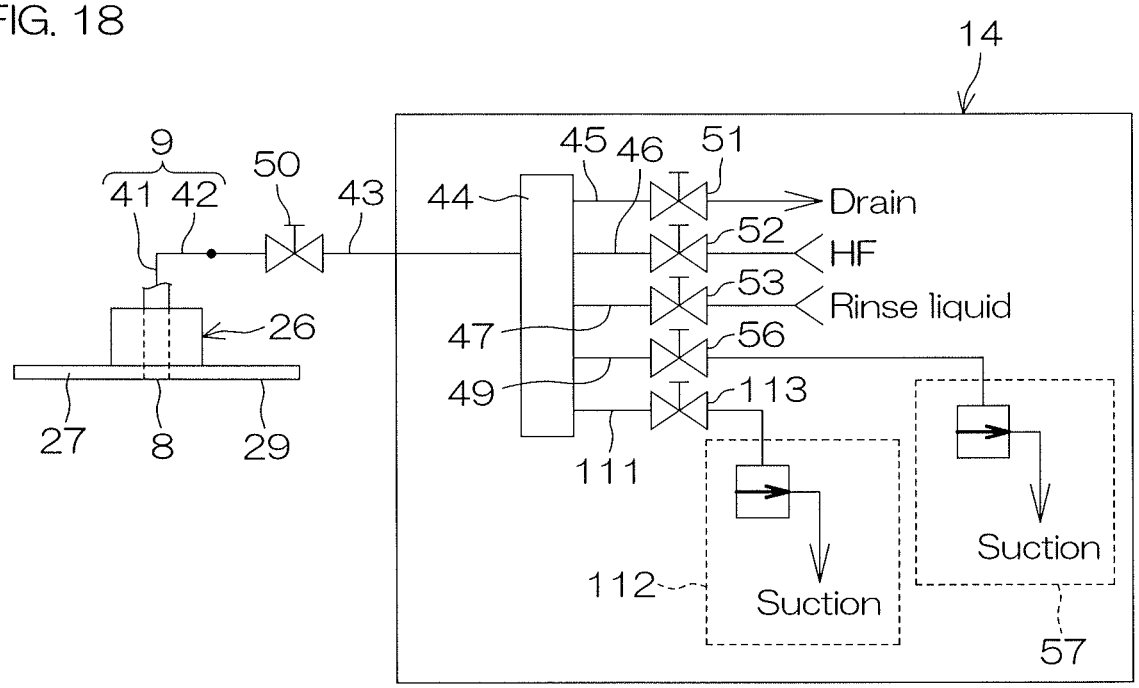
FIG. 18 is a drawing which describes a first modified example of the present invention.

For example, as the first suction device provided at the first supply/suction unit 14, as shown in FIG. 18, there may be provided a first chemical liquid/rinse liquid suction device 112 which is an ejector type suction device similar to the second chemical liquid/rinse liquid suction device 57. Specifically, the first supply/suction unit 14 is provided with a first chemical liquid/rinse liquid suction piping 111, one end side (the left side in FIG. 18) of which is connected to the first connection portion 44, a first chemical liquid/rinse liquid suction device 112 which is connected to the other end side (leading end) of the first chemical liquid/rinse liquid suction piping 111 and a suction valve 113 for opening and closing the first chemical liquid/rinse liquid suction piping 111. As described above, where an ejector type suction device is adopted as the first suction device, the first chemical liquid/rinse liquid suction device 112 is set so as to be weaker (slower) in suction force (suction speed) than the second chemical liquid/rinse liquid suction device 57 by differing an air pressure and a pressure loss.

Further, the second supply/suction unit 15 or the third supply/suction unit 16 may be provided with the ejector type first chemical liquid/rinse liquid suction device 112, as with the modified example shown in FIG. 18.

Figure 19:
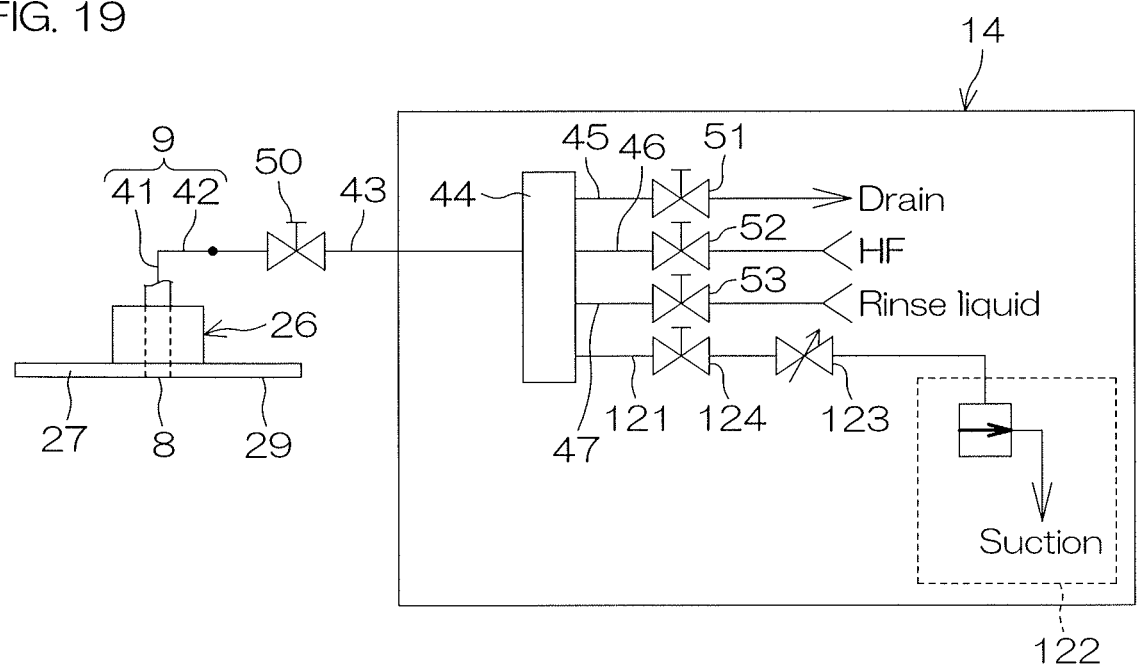
FIG. 19 is a drawing which describes a second modified example of the present invention.

Further, the first supply/suction unit 14 may be arranged so as to have only one suction device. As shown in FIG. 19, the first supply/suction unit 14 may include a suction piping 121, one end side (the left side in FIG. 19) of which is connected to the first connection portion 44, a chemical liquid/rinse liquid suction device (suction device) 122 which is connected to the other end side (leading end) of the suction piping 121, a flow-rate adjusting valve (suction force adjusting unit) 123 which is interposed in the suction piping 121 and adjusts a suction force (suction speed) by adjusting the degree of opening of the suction piping 121 and a suction valve 124 which opens and closes the suction piping 121. The chemical liquid/rinse liquid suction device (suction device) 122 is, for example, an ejector type suction device similar to the second chemical liquid/rinse liquid suction device 57. The flow-rate adjusting valve 123 includes a valve body which has internally a valve seat, a valve body for opening and closing the valve seat and an actuator for moving the valve body between an open position and a closed position. Other flow-rate adjusting valves are also similar in arrangement. The flow-rate adjusting valve 123 may be interposed in the first common piping 43 instead of the suction piping 121.

Figure 20:
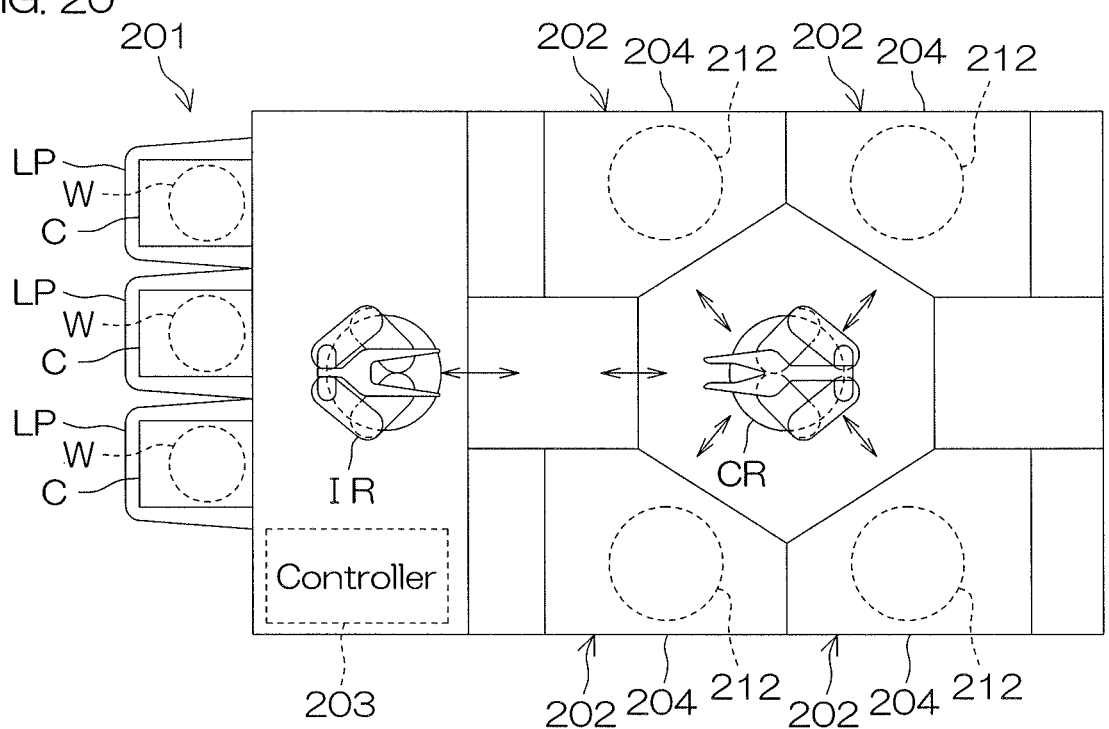
FIG. 20 is an illustrative plan view which describes a layout inside a substrate processing apparatus according to a second preferred embodiment of the present invention.

FIG. 20 is an illustrative plan view which describes an internal layout of a substrate processing apparatus 201 according to a second preferred embodiment of the present invention. The substrate processing apparatus 201 is a single substrate processing type apparatus for processing a substrate W such as silicon wafer one at a time. In the present preferred embodiment, a substrate W is a disk-shaped substrate. The substrate processing apparatus 201 includes a plurality of processing units 202 which processes a substrate W by a processing liquid, a load port LP which places a substrate housing container C for housing a plurality of substrates W processed by the processing units 202, transfer robots IR and CR which transfer a substrate W between the load port LP and the processing unit 202, and a controller 203 which controls the substrate processing apparatus 201. The transfer robot IR transfers the substrate W between the substrate housing container C and the transfer robot CR. The transfer robot CR transfers the substrate W between the transfer robot IR and the processing unit 202. The plurality of processing units 202 are, for example, similar to each other in arrangement.

Figure 21:
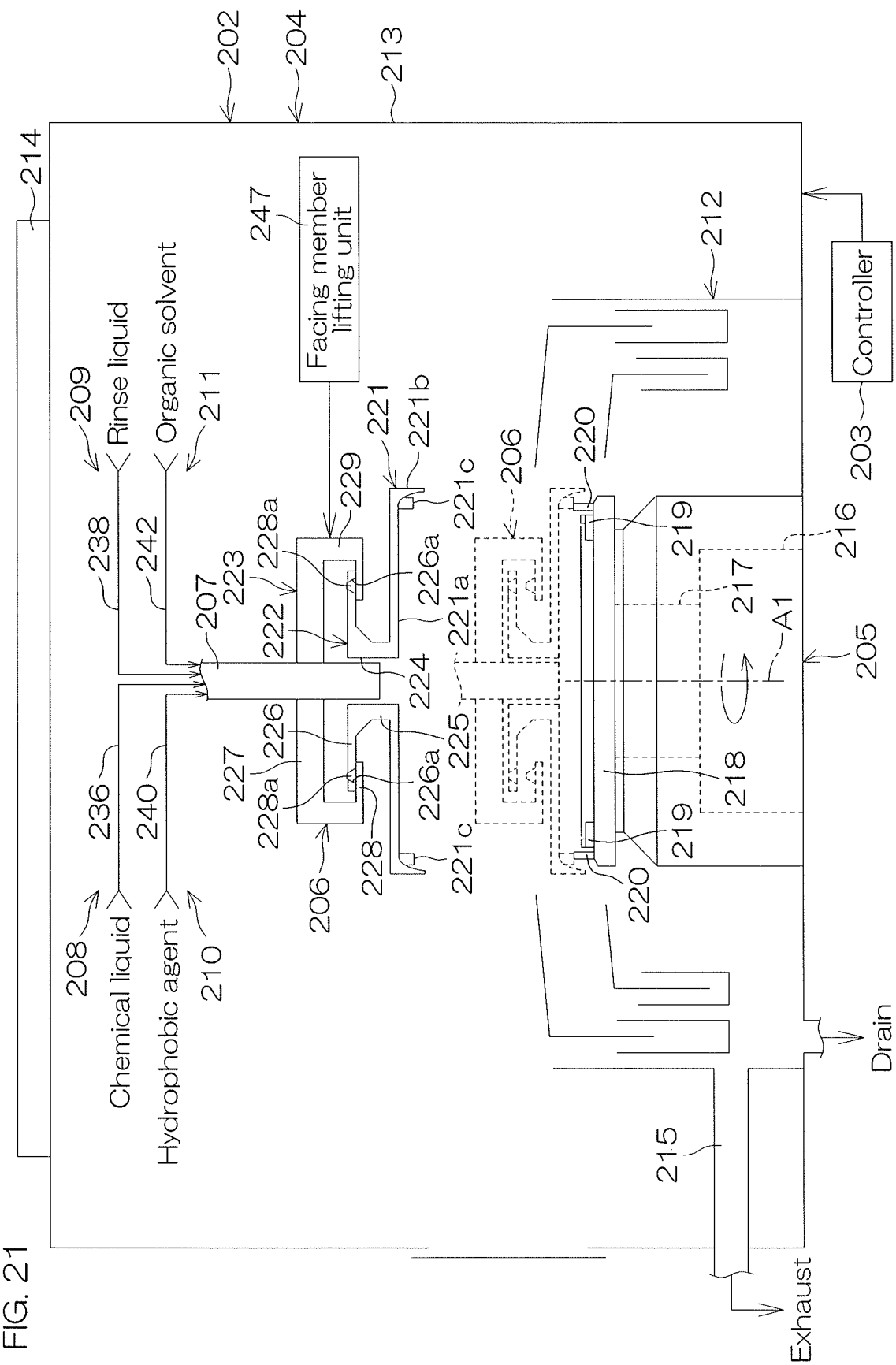
FIG. 21 is an illustrative sectional view which describes an example of arrangement of a processing unit shown in FIG. 20.
Figure 22:
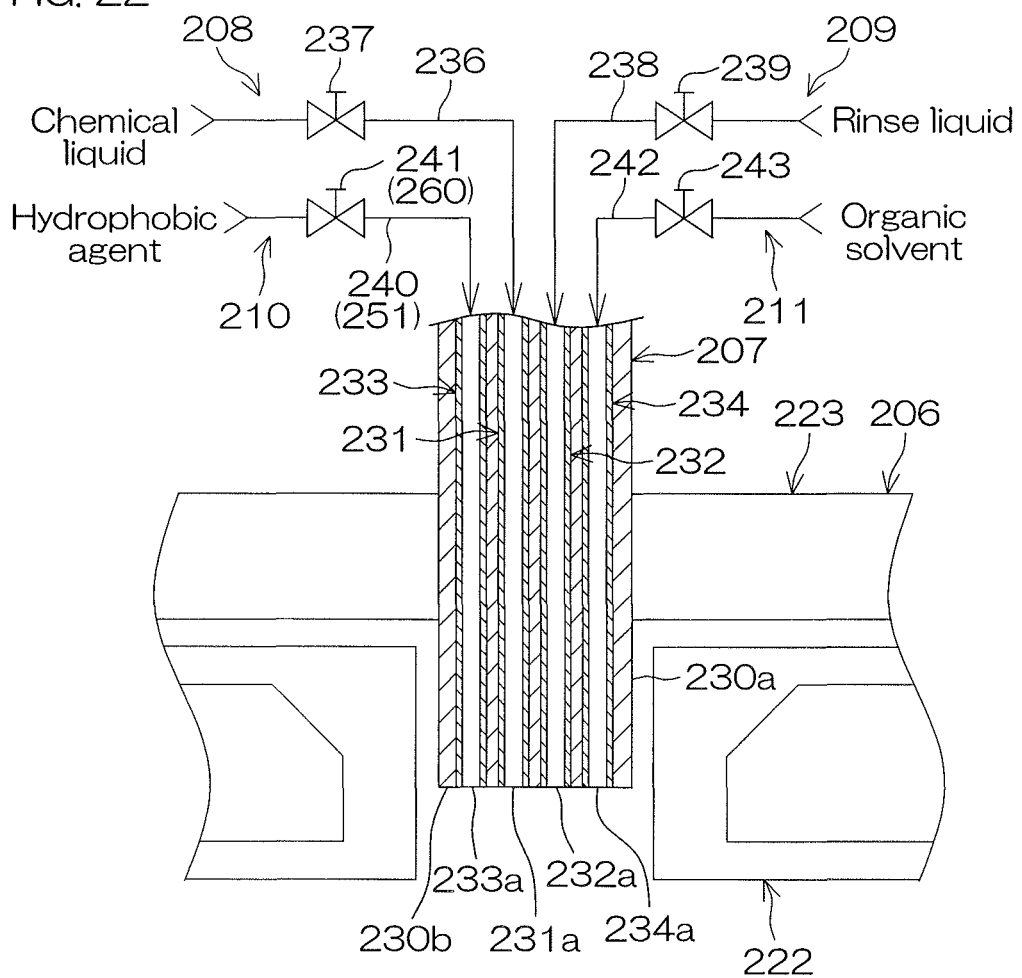
FIG. 22 is a longitudinal sectional view of a central axis nozzle shown in FIG. 21.
Figure 23:
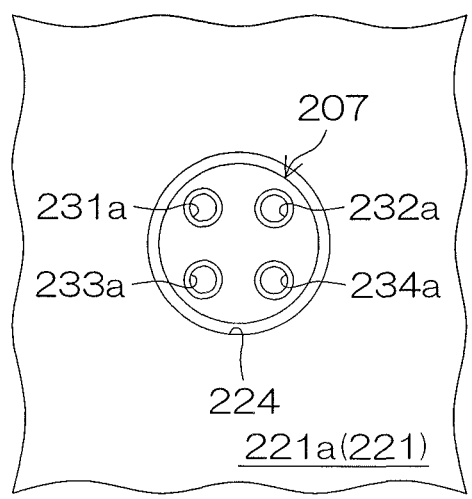
FIG. 23 is a bottom view of the central axis nozzle.

FIG. 21 is an illustrative sectional view for describing an example of the arrangement of the processing unit 202. FIG. 22 is a longitudinal sectional view of a central axis nozzle 207. FIG. 23 is a bottom view of the central axis nozzle 207.

The processing unit 202 includes a box-shaped chamber 204, a spin chuck (substrate holding unit) 205 which holds a single substrate W inside the chamber 204 in a horizontal posture to rotate the substrate W around a vertical rotation axis A1 passing through the center of the substrate W, a facing member 206 which faces an upper surface of the substrate W held by the spin chuck 205, a central axis nozzle 207 which is inserted up and down through the facing member 206 to discharge a processing liquid to a central portion of the upper surface of the substrate W held by the spin chuck 205, a chemical liquid supplying unit 208 which supplies a chemical liquid to the central axis nozzle 207, a rinse liquid supplying unit 209 which supplies a rinse liquid to the central axis nozzle 207, a hydrophobic agent supplying unit 210 which supplies a liquid type hydrophobic agent to the central axis nozzle 207, an organic solvent supplying unit 211 which supplies to the central axis nozzle 207 an organic solvent as a low surface tension liquid which is larger in specific gravity than air and also lower in surface tension than water and a cylindrical processing cup 212 which surrounds the spin chuck 205.

The chamber 204 includes a box-shaped partition wall 213 which houses the spin chuck 205 and a nozzle, an FFU (fan filter unit) 214 as a blower unit feeding clean air (air filtered by a filter) to an interior of the partition wall 213 from an upper portion of the partition wall 213, and an exhaust duct 215 which exhausts a gas inside the chamber 204 from a lower portion of the partition wall 213. The FFU 214 is disposed above the partition wall 213 and mounted on a ceiling of the partition wall 213. The FFU 214 feeds clean air downward to an interior of the chamber 204 from the ceiling of the partition wall 213. The exhaust duct 215 is connected to a bottom portion of the processing cup 212 and leads a gas inside the chamber 204 to exhaust processing equipment provided in a plant where the substrate processing apparatus 201 is installed. Therefore, a downflow (downward flow) flowing downward inside the chamber 204 is formed by the FFU 214 and the exhaust duct 215. The substrate W is processed in a state that the downflow is formed inside the chamber 204.

As the spin chuck 205, a clamping type chuck which clamps a substrate W in a horizontal direction to hold the substrate W horizontally is adopted. Specifically, the spin chuck 205 includes a spin motor 216, a spin shaft 217 which is made integrally with a driving shaft of the spin motor 216 and a disk-shaped spin base 218 which is mounted on an upper end of the spin shaft 217 in a substantially horizontal manner.

A plurality (three or more, for example six) of clamping members 219 are disposed at a peripheral edge portion of an upper surface of the spin base 218. At the peripheral edge portion of the upper surface of the spin base 218, the plurality of clamping members 219 are disposed at suitable intervals on a circumference corresponding to an outer peripheral shape of the substrate W. On the upper surface of the spin base 218, there are disposed a plurality (three or more) of facing member supporting portions 220 for supporting from below the facing member 206 on a circumference at the center of the rotation axis A1. A distance between the facing member supporting portion 220 and the rotation axis A1 is set to be larger than a distance between the clamping member 219 and the rotation axis A1.

Further, the spin chuck 205 is not limited to a clamping type and, for example, there may be instead adopted a vacuum suction type arrangement (vacuum chuck) that vacuum-suctions a rear surface of the substrate W to hold the substrate W in a horizontal posture and further performs rotation around a vertical rotation axis in this state to rotate the substrate W held by the spin chuck 205.

The facing member 206 is a driven type facing member (that is, a shielding member) which rotates following the spin chuck 205. That is, the facing member 206 is supported so that the facing member 206 can rotate integrally with the spin chuck 205 during substrate processing.

The facing member 206 includes a shielding plate 221, an engaging portion 222 which is provided so as to be raised and lowered together with the shielding plate 221 and a supporting portion 223 which is engaged with the engaging portion 222 to support from above the shielding plate 221.

The shielding plate 221 is disk-shaped and larger in diameter than the substrate W. The shielding plate 221 is provided, at its lower surface, a circular substrate facing surface 221a which faces an entirety of the upper surface of the substrate W, a circular annular collar portion 221b which projects downward at a peripheral edge portion of the substrate facing surface 221a, and a spin chuck engaging portion 221c which is provided on the substrate facing surface 221a and arranged to be engaged with the facing member supporting portion 220. A penetrating hole 224 which penetrates up and down through the facing member 206 is formed in a central portion of the substrate facing surface 221a. The penetrating hole 224 is defined by a circular cylindrical inner peripheral surface.

The engaging portion 222 includes a circular cylindrical portion 225 which surrounds a periphery of the penetrating hole 224 on an upper surface of the shielding plate 221 and a flange portion 226 which expands in a radially outer side from an upper end of the circular cylindrical portion 225. The flange portion 226 is positioned higher than a flange supporting portion 228 included in the supporting portion 223 and will be described below. An outer periphery of the flange portion 226 is larger than an inner periphery of the flange supporting portion 228.

The supporting portion 223 includes, for example, a substantially disk-shaped supporting portion main body 227, a horizontal flange supporting portion 228, and a connection portion 229 which connects the supporting portion main body 227 with the flange supporting portion 228.

The central axis nozzle 207 extends in an up/down direction along a vertical axis passing through the center of the shielding plate 221 and the substrate W, that is, the rotation axis A1. The central axis nozzle 207 is disposed above the spin chuck 205 and inserted through an internal space of the shielding plate 221 and that of the supporting portion 223. The central axis nozzle 207 is raised and lowered together with the shielding plate 221 and the supporting portion 223.

The central axis nozzle 207 includes a circular columnar casing 230 extending up and down inside the penetrating hole and a first nozzle piping 231, a second nozzle piping 232, a third nozzle piping 233 and a fourth nozzle piping 234, each of which is inserted up and down through the casing 230. The casing 230 is provided with a circular cylindrical outer peripheral surface 230a and a facing surface 230b which is provided at a lower end portion of the casing 230 and faces a central portion of the upper surface of the substrate W. The first to fourth nozzle pipings 231 to 234 are each an inner tube.

A facing member lifting unit 247 for raising and lowering the supporting portion 223 to raise and lower the facing member 206 is coupled to the supporting portion 223. The facing member lifting unit 247 has an arrangement including a servo motor and a ball screw mechanism.

The facing member lifting unit 247 raises and lowers the facing member 206 and the first to fourth nozzle pipings 231 to 234 together with the supporting portion 223 in a vertical direction. The facing member lifting unit 247 raises and lowers the shielding plate 221 and the first to fourth nozzle pipings 231 to 234 between a proximity position at which the substrate facing surface 221a of the shielding plate 221 comes close to the upper surface of the substrate W held by the spin chuck 205 and a retracted position provided above the proximity position. The facing member lifting unit 247 is able to hold the shielding plate 221 at each position between the proximity position and the retracted position.

The facing member lifting unit 247 is able to raise and lower the supporting portion 223 between a lower position (a position indicated by a broken line in FIG. 21) and an upper position (a position indicated by a solid line in FIG. 21). Thereby, it is able to raise and lower the shielding plate 221 of the facing member 206 between a proximity position (a position indicated by a broken line in FIG. 21) at which the shielding plate comes close to the upper surface of the substrate W held by the spin chuck 205 and a retracted position (a position indicated by a solid line in FIG. 21) at which the shielding plate is retracted significantly above the spin chuck 205.

Specifically, in a state that the supporting portion 223 is positioned at the upper position, the flange supporting portion 228 of the supporting portion 223 is engaged with the flange portion 226, by which the engaging portion 222, the shielding plate 221 and the central axis nozzle 207 are supported by the supporting portion 223. That is, the shielding plate 221 is suspended by the supporting portion 223.

In a state that the supporting portion 223 is positioned at the upper position, the shielding plate 221 is positioned in a peripheral direction with respect to the supporting portion 223 by projections 228a projected from an upper surface of the flange supporting portion 228, engaging with engaging holes 226a formed in the flange portion 226 at intervals in the peripheral direction.

When the facing member lifting unit 247 lowers the supporting portion 223 from the upper position, the shielding plate 221 is also lowered from the retracted position. Thereafter, when the spin chuck engaging portion 221c of the shielding plate 221 comes into contact with the facing member supporting portion 220, the shielding plate 221 and the central axis nozzle 207 are received by the facing member supporting portion 220. Then, when the facing member lifting unit 247 lowers the supporting portion 223, the engagement of the flange supporting portion 228 of the supporting portion 223 with the flange portion 226 is released, and the engaging portion 222, the shielding plate 221 and the central axis nozzle 207 are separated from the supporting portion 223 and supported by the spin chuck 205. In this state, the shielding plate 221 is rotated in conjunction with the rotation of the spin chuck 205 (the spin base 218).

The first nozzle piping 231 includes a vertical portion which extends along a vertical direction. A lower end of the first nozzle piping 231 is opened on the facing surface 230b of the casing 230 to form a first discharge port 231a. A chemical liquid from the chemical liquid supplying unit 208 is supplied to the first nozzle piping 231. The chemical liquid supplying unit 208 includes a chemical liquid piping 236 connected to an upstream end side of the first nozzle piping 231 and a chemical liquid valve 237 interposed in an intermediate portion of the chemical liquid piping 236. When the chemical liquid valve 237 is opened, the chemical liquid is discharged downward from the first discharge port 231a. When the chemical liquid valve 237 is closed, discharge of the chemical liquid from the first discharge port 231a is stopped. The chemical liquid may be, for example, a liquid containing at least one of sulfuric acid, acetic acid, nitric acid, hydrochloric acid, hydrofluoric acid, ammonia water, hydrogen peroxide water, an organic acid (for example, citric acid, oxalic acid, etc.), an organic alkali (for example, TMAH: tetramethylammonium hydroxide, etc.), a surfactant and a corrosion inhibitor.

The second nozzle piping 232 includes a vertical portion which extends along a vertical direction. A lower end of the second nozzle piping 232 is opened on the facing surface 230b of the casing 230 to form a second discharge port 232a. A rinse liquid from the rinse liquid supplying unit 209 is supplied to the second nozzle piping 232. The rinse liquid supplying unit 209 includes a rinse liquid piping 238 which is connected to an upstream end side of the second nozzle piping 232 and a rinse liquid valve 239 which is interposed in an intermediate portion of the rinse liquid piping 238. When the rinse liquid valve 239 is opened, a rinse liquid is discharged downward from the second discharge port 232a. When the rinse liquid valve 239 is closed, discharge of the rinse liquid from the second discharge port 232a is stopped. The rinse liquid is water. In the present preferred embodiment, water is any one of pure water (deionized water), carbonated water, electrolyzed ion water, hydrogen water, ozone water, and ammonia water of dilute concentration of (for example, approximately 10 ppm to 100 ppm).

The third nozzle piping 233 includes a vertical portion which extends along a vertical direction. A lower end of the third nozzle piping 233 is opened on the facing surface 230b of the casing 230 to form a third discharge port 233a. A hydrophobic agent from the hydrophobic agent supplying unit 210 is supplied to the third nozzle piping 233. The hydrophobic agent supplying unit 210 includes a hydrophobic agent piping (processing liquid piping) 240 (the same with a common piping 251 to be described later) connected to an upstream end side of the third nozzle piping 233 and a hydrophobic agent valve 241 (the same with a common valve 260 to be described later) which is interposed in an intermediate portion of the hydrophobic agent piping 240. When the hydrophobic agent valve 241 is opened, a hydrophobic agent is discharged downward from the third discharge port 233a. When the hydrophobic agent valve 241 is closed, discharge of the hydrophobic agent from the third discharge port 233a is stopped. The hydrophobic agent may be a silicon-based hydrophobic agent or a metal-based hydrophobic agent.

The silicon-based hydrophobic agent is a hydrophobic agent that hydrophobizes silicon (Si) itself and a compound that contains silicon. The silicon-based hydrophobic agent is, for example, a silane coupling agent. The silane coupling agent includes, for example, at least one of HMDS (hexamethyldisilazane), TMS (tetramethylsilane), fluorinated alkylchlorosilane, alkyldisilazane, and a non-chloro-based hydrophobic agent. The non-chloro-based hydrophobic agent includes, for example, at least one of dimethylsilyldimethylamine, dimethylsilyldiethylamine, hexamethyldisilazane, tetramethyldisilazane, bis (dimethylamino) dimethylsilane, N, N-dimethylaminotrimethylsilane, N-(trimethylsilyl) dimethylamine, and an organosilane compound.

The metal-based hydrophobic agent is, for example, a solvent which has a high coordinating property and hydrophobizes a metal mainly by coordination bonds. The hydrophobic agent includes, for example, at least one of amine having a hydrophobic group and an organosilicon compound.

The fourth nozzle piping 234 includes a vertical portion which extends along a vertical direction. A lower end of the fourth nozzle piping 234 is opened on the facing surface 230b of the casing 230 to form a fourth discharge port 234a. A liquid-type organic solvent from the organic solvent supplying unit 211 is supplied to the fourth nozzle piping 234.

The fourth nozzle piping 234 includes a vertical portion which extends along a vertical direction. A lower end of the fourth nozzle piping 234 is opened on the facing surface 230b of the casing 230 to form a fourth discharge port 234a. A liquid type organic solvent from the organic solvent supplying unit 211 is supplied to the fourth nozzle piping 234. The organic solvent supplying unit 211 includes an organic solvent piping 242 connected to an upstream end side of the fourth nozzle piping 234 and an organic solvent valve 243 interposed in an intermediate portion of the organic solvent piping 242. When the organic solvent valve 243 is opened, a liquid type organic solvent is discharged downward from the fourth discharge port 234a. When the organic solvent valve 243 is closed, discharge of the liquid type organic solvent from the fourth discharge port 234a is stopped.

In the present preferred embodiment, the organic solvent is, for example, IPA (isopropyl alcohol). As examples of the organic solvent, in addition to IPA, methanol, ethanol, acetone, EG (ethylene glycol) and HFE (hydrofluoroether) can be cited. Further, the organic solvent may not only be that which is constituted with a single component but may also be a liquid mixed with another component. For example, the organic solvent may be a mixed liquid of IPA and acetone or a mixed liquid of IPA and methanol.

As shown in FIG. 21, the processing cup 212 is disposed further outside than the substrate W held by the spin chuck 205 (a direction away from the rotation axis A1). The processing cup 212 surrounds a periphery of the spin base 218. When a processing liquid is supplied to the substrate W in a state that the spin chuck 205 rotates the substrate W, the processing liquid supplied to the substrate W is spun off to a periphery of the substrate W. When the processing liquid is supplied to the substrate W, an upper end portion 212a of the processing cup 212 which is opened upward is disposed higher than the spin base 218. Therefore, the processing liquid (a chemical liquid, a rinse liquid, a hydrophobic agent and an organic solvent) drained in a periphery of the substrate W is received by the processing cup 212. Then, the processing liquid received by the processing cup 212 is fed to recovery equipment or waste liquid treatment equipment which is not shown.

Figure 24:
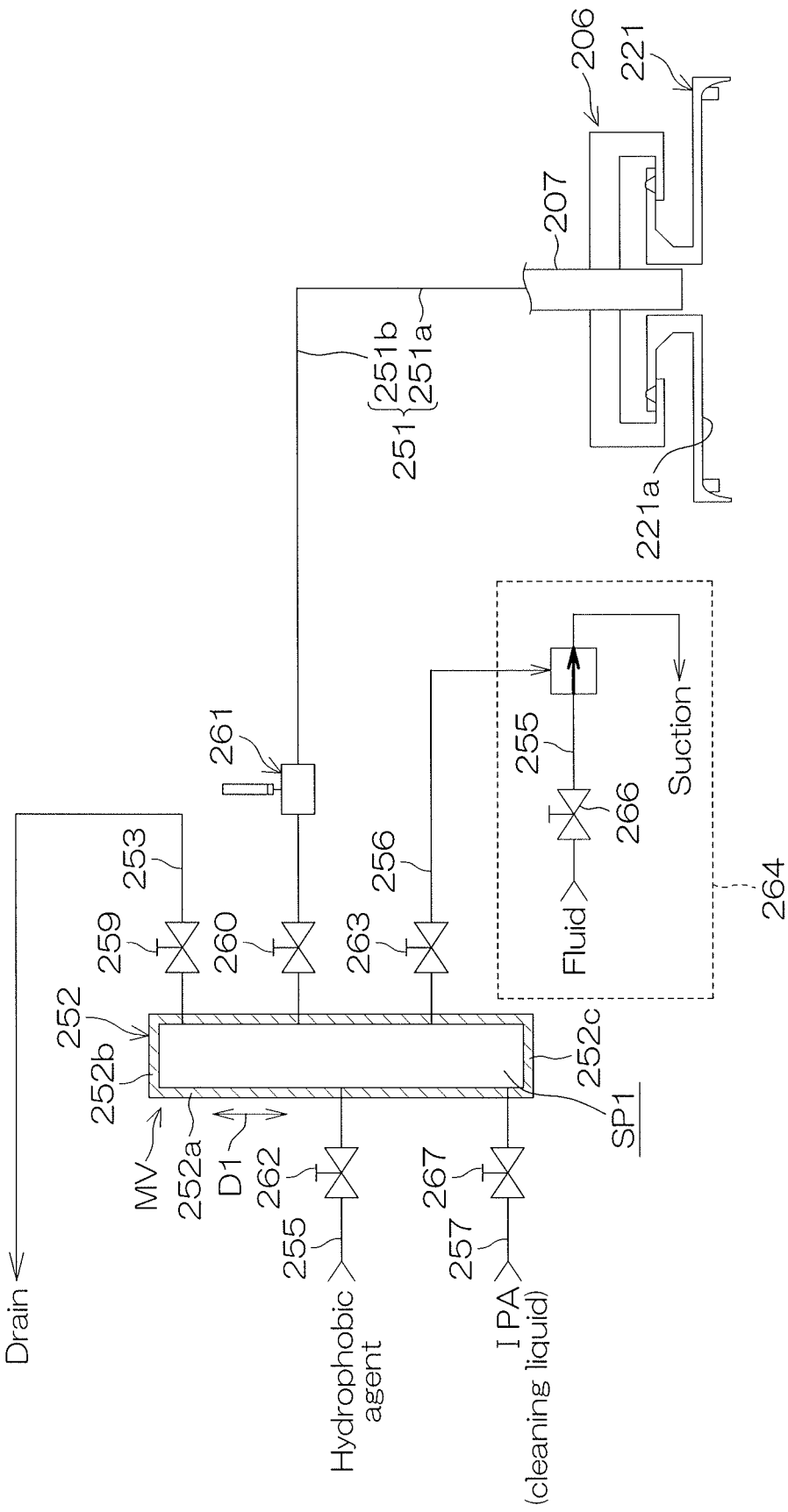
FIG. 24 is a drawing which describes an arrangement of a hydrophobic agent supplying unit shown in FIG. 21.

FIG. 24 is a drawing for describing an arrangement of the hydrophobic agent supplying unit 210 shown in FIG. 21.

The hydrophobic agent supplying unit 210 includes a common piping 251 which is connected to the first nozzle piping 231 and a mixing valve unit MV which is connected to the first nozzle piping 231 via the common piping 251. The mixing valve unit MV includes a connection portion 252 for feeding a liquid to the first nozzle piping 231 and a plurality of valves 259, 260, 262, 263, 267. The plurality of valves 259, 260, 262, 263, 267 are each an opening/closing valve. The mixing valve unit MV further includes a drain piping 253, a hydrophobic agent supplying piping 255, a suction piping 256 and a cleaning liquid supplying piping 257, each of which is connected to the connection portion 252.

The connection portion 252 has a longitudinal side along a predetermined single direction. The connection portion 252 includes a cylindrical side wall 252a extending in a flow direction D1 (for example, a circular cylindrical shape or a rectangular cylindrical shape), one end wall 252b which closes an end portion at one side of the side wall 252a, and another end wall 252c which closes an end portion at another side of the side wall 252a. A flow space SP1 for a liquid to flow through is formed in an interior of the connection portion 252. The flow space SP1 extends along the flow direction D1. The drain piping 253, the common piping 251, the hydrophobic agent supplying piping 255, the suction piping 256 and the cleaning liquid supplying piping 257 are connected in this order from one side (at an upper part in FIG. 24) to the side wall of the connection portion 252.

The common piping 251 has an up/down direction portion 251a and a right/left direction portion 251b. A downstream end of the up/down direction portion 251a is connected to an upstream end of the first nozzle piping 231. A downstream end of the right/left direction portion 251b is connected to an upstream end of the up/down direction portion 251a. An upstream end of the right/left direction portion 251b is connected to the connection portion 252. The common valve 260 for opening and closing the common piping 251 is interposed in the right/left direction portion 251b of the common piping 251. The common valve 260 is an air-operated on-off valve. A diaphragm valve, a butterfly valve, a needle valve, etc., can be cited as examples of the above air-operated on-off valve.

The first suction device 261 is interposed in the right/left direction portion 251b of the common piping 251 downstream from the common valve 260. The first suction device 261 is a diaphragm type suction device. The diaphragm type suction device includes a cylindrical head which is interposed in an intermediate portion of the common piping 251, and a diaphragm which is housed inside the head, and is a suction device such that a volume of a flow passage formed inside the head is changed by driving the diaphragm (refer to Japanese Patent Unexamined Application Publication No. 2016-111306).

The first suction device 261 constituted with the diaphragm type suction device is an air-operated suction device. Air supplied to an interior of the first suction device 261 is stopped to cause a change in shape of the diaphragm and increase a volume inside the head, as a result, the hydrophobic agent present at a portion of the common piping 251 downstream from the first suction device 261 is drawn into the head, and an interior of the downstream portion is suctioned (that is, the hydrophobic agent is suctioned into the head according to input of a discharge stop signal). Thereby, a function of the first suction device 261 is enabled. Further, air is supplied into an interior of the first suction device 261 to cause a change in shape of the diaphragm and decrease a volume inside the head, by which the liquid (a processing liquid) suctioned inside the head is pushed out (that is, the hydrophobic agent inside the head is pushed out according to input of a discharge start signal). Thereby, the function of the first suction device 261 is disabled.

A driving source (for example, a solenoid valve, a second driving source) arranged to drive the common valve 260 and a driving source (for example, a solenoid valve, a first driving source) arranged to drive the first suction device 261 are mutually independent. On the assumption that the driving source arranged to drive the common valve 260 and the driving source arranged to drive the first suction device 261 are common, suction/suction release of the first suction device 261 will be performed in conjunction with opening and closing of the common valve 260. Since the driving source arranged to drive the common valve 260 and the driving source arranged to drive the first suction device 261 are mutually independent, it is possible to perform opening and closing of the common valve 260 and suction/suction release of the first suction device 261 at mutually optimal timings.

The drain valve 259 for opening and closing the drain piping 253 is interposed in the drain piping 253. A downstream end side of the drain piping 253 is connected to external waste liquid treatment equipment.

The hydrophobic agent supplying valve 262 for opening and closing the hydrophobic agent supplying piping 255 is interposed in the hydrophobic agent supplying piping 255. A hydrophobic agent is arranged to be supplied from a hydrophobic agent supplying source to an upstream end side of the hydrophobic agent supplying piping 255.

The suction valve 263 for opening and closing the suction piping 256 is interposed in the suction piping 256. The second suction device 264 is connected to a downstream end of the suction piping 256. The second suction device 264 is an ejector type suction device. The ejector type suction device includes a vacuum generator and an aspirator. The ejector type suction device is stronger in suction force (faster in suction speed) and also greater in flow rate of a liquid that can be suctioned than the diaphragm type suction device and the siphon type suction device.

The second suction device 264 includes a fluid supplying piping 265 and a fluid supplying valve 266 arranged to switch between opening and closing of the fluid supplying piping 265. The fluid supplying valve 266 is, for example, a solenoid valve. In a state that power is supplied to the second suction device 264, the fluid supplying valve 266 is opened and a fluid flows inside the fluid supplying piping 265, by which an interior of the second suction device 264 is depressurized. Thereby, an interior of the suction piping 256 is suctioned. That is, a function of the second suction device 264 is enabled.

The cleaning liquid supplying valve 267 for opening and closing the cleaning liquid supplying piping 257 is interposed in the cleaning liquid supplying piping 257. A cleaning liquid is arranged to be supplied from a cleaning liquid supplying source to an upstream end side of the cleaning liquid supplying piping 257. In the example of FIG. 24, the cleaning liquid is, for example, an organic solvent (for example, IPA). Also, water may be used as a cleaning liquid.

When the common valve 260 and the hydrophobic agent supplying valve 262 are opened in a state that other valves are closed in the hydrophobic agent supplying unit 210, a hydrophobic agent from the hydrophobic agent supplying piping 255 flows into an interior of the connection portion 252. The hydrophobic agent is supplied via the common piping 251 to the first nozzle piping 231, and the hydrophobic agent is discharged downward from the third discharge port 233a.

Further, when the hydrophobic agent supplying valve 262 and the drain valve 259 are opened in a state that other valves are closed in the hydrophobic agent supplying unit 210, a hydrophobic agent from the hydrophobic agent supplying piping 255 flows into the connection portion 252, and the hydrophobic agent is drained through the drain piping 253 outside the connection portion 252 (pre-dispensing step).

Further, when the cleaning liquid supplying valve 267 and the drain valve 259 are opened in a state that other valves are closed in the hydrophobic agent supplying unit 210, a cleaning liquid from the cleaning liquid supplying piping 257 flows into the connection portion 252, and the cleaning liquid is drained through the drain piping 253 outside the connection portion 252 (connection portion cleaning step).

Further, when the cleaning liquid supplying valve 267 and the common valve 260 are opened in a state that other valves are closed in the hydrophobic agent supplying unit 210, a cleaning liquid from the cleaning liquid supplying piping 257 flows into the connection portion 252, and the cleaning liquid is discharged through the common valve 260 from the third discharge port 233a (piping cleaning step).

Further, when a function of the first suction device 261 is enabled in a state that other valves (including the common valve 260) are closed in the hydrophobic agent supplying unit 210, a liquid present at a portion of the common piping 251 downstream from a position in which the first suction device 261 is interposed is suctioned by the first suction device 261 (first suctioning step). At this time, an amount of the suctioned hydrophobic agent is about 0.1 to 1 milliliter.

Still further, when the suction valve 263 and the common valve 260 are opened in a state that a function of the second suction device 264 is enabled by opening of the fluid supplying valve 266, an interior of the suction piping 256 is suctioned, and a liquid inside the connection portion 252 (flow space SP1) and a liquid inside the common piping 251 are suctioned by the second suction device 264 (second suctioning step).

Figure 25:
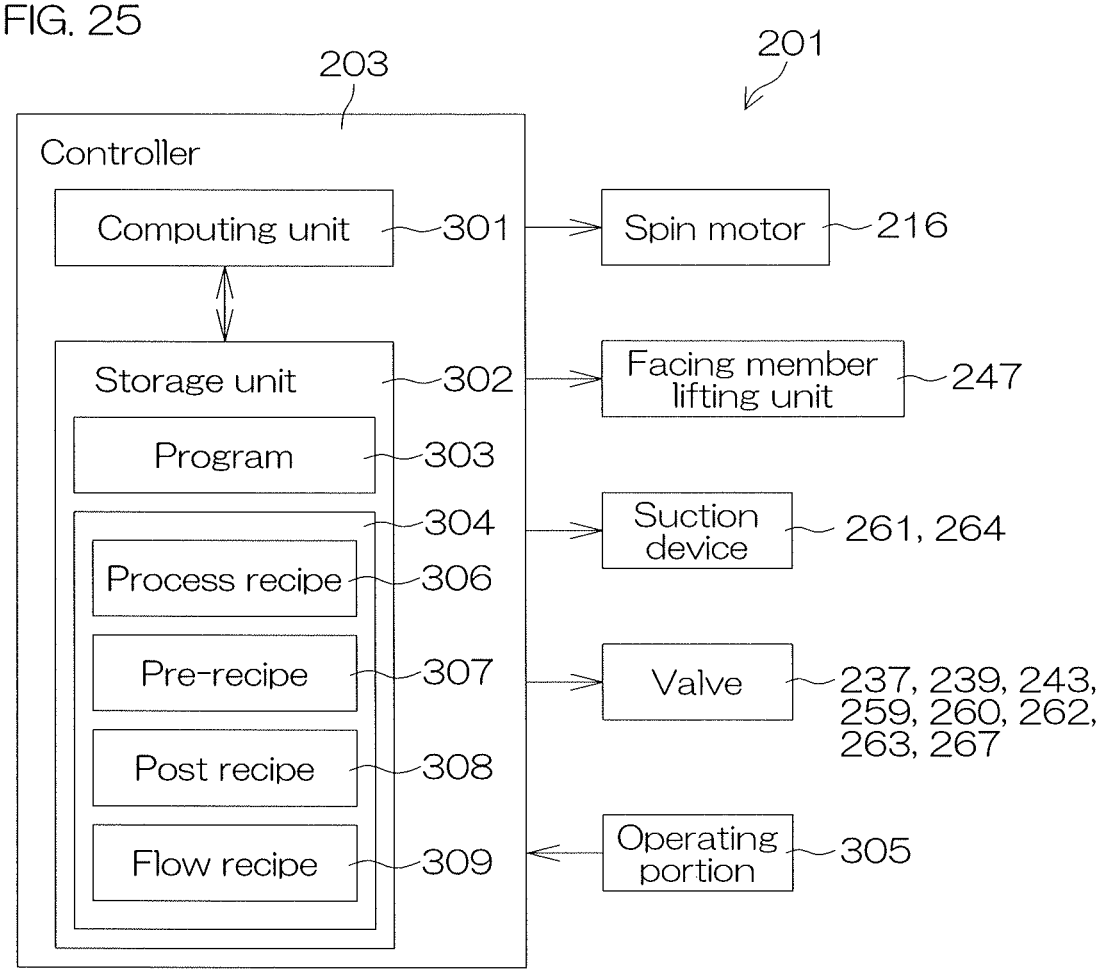
FIG. 25 is a block diagram which describes an electrical arrangement of main portions of the substrate processing apparatus.

FIG. 25 is a block diagram for describing an electrical arrangement of main portions of the substrate processing apparatus 201.

The controller 203 is arranged by using, for example, a microcomputer. The controller 203 has a computing unit 301 such as CPU, etc., a storage unit 302 such as a fixed memory device (not shown), a hard disk drive, etc., and an input/output unit (not shown). A program 303 executed by the computing unit 301 is stored in the storage unit 302.

The storage unit 302 includes a recipe storage portion 304 which stores a recipe for defining contents of various types of processing for a substrate W. The recipe storage portion 304 is composed of a nonvolatile memory which can electrically rewrite data. The recipe storage portion 304 stores a process recipe 306, a pre-recipe 307, a post recipe 308 and a flow recipe 309 which are created by operation of an operating portion 305. The process recipe 306 is arranged to determine processing contents (including procedures and conditions, the same shall be applied hereinafter) of a substrate W. The pre-recipe 307 is an example of a preliminary motion recipe and arranged to determine contents of predetermined pre-processing. The post recipe 308 is an example of a preliminary motion recipe and arranged to determine contents of predetermined post processing. The flow recipe 309 is arranged to determine procedures for execution and the number of times executed with regard to control (process recipe control) in compliance with the process recipe 306, control (pre-recipe control) in compliance with the pre-recipe and control (post recipe control) in compliance with the post recipe.

The predetermined number of substrates W (for example, 25 sheets) which constitute one lot are carried in the substrate housing container C (refer to FIG. 20) of the substrate processing apparatus 201 in a state that they are housed all together. In the substrate processing apparatus 201, one flow recipe 309 is set for each of the substrate housing containers C.

Further, the controller 203 drives the spin motor 216, the facing member lifting unit 247, etc., according to a predetermined program and also enables functions of the first suction device 261, the second suction device 264, etc. Still further, the controller 203 opens and closes the chemical liquid valve 237, the rinse liquid valve 239, the organic solvent valve 243, the drain valve 259, the common valve 260, the hydrophobic agent supplying valve 262, the suction valve 263, the cleaning liquid supplying valve 267, etc.

Figure 26:
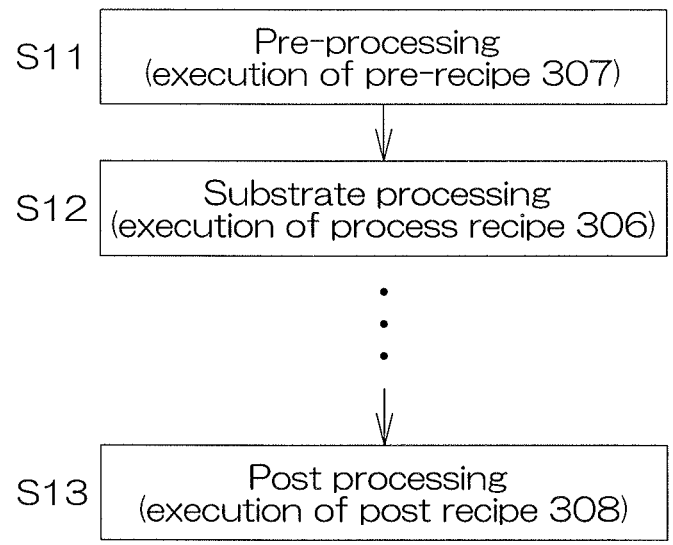
FIG. 26 is a flowchart which describes contents of substrate processing executed by the processing unit.
Figure 27:
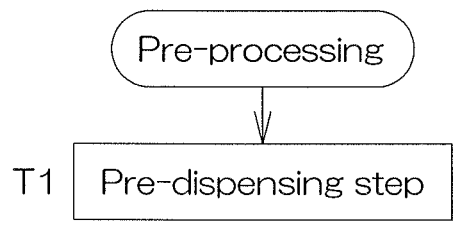
FIG. 27 is a flowchart which shows a flow of pre-processing executed by a pre-recipe in the processing unit.
Figure 30A:
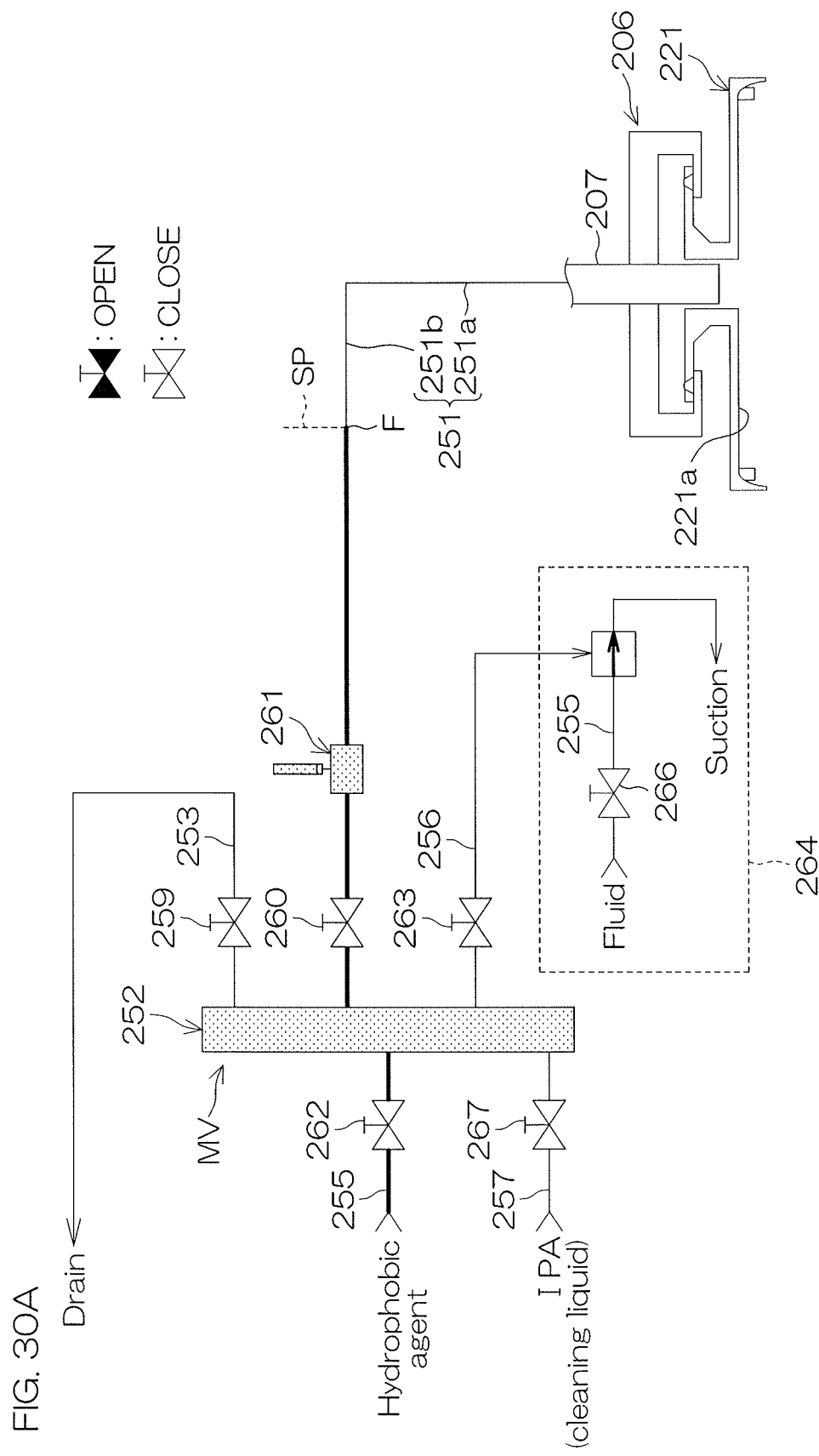
FIG. 30A is a drawing which shows a state of the processing unit before a substrate is carried in the substrate processing apparatus.

FIG. 26 is a flowchart for describing contents of the processing executed by the processing unit 202. FIG. 27 is a flowchart which shows procedures of the pre-processing executed according to the pre-recipe 307 by the processing unit 202. FIG. 28 is a flowchart which shows procedures of the substrate processing executed according to the process recipe 306 by the processing unit 202. FIG. 29 is a flowchart which shows procedures of the post processing executed according to the post recipe 308 by the processing unit 202. FIG. 30A is a drawing which shows a state of the processing unit 202 before carrying a substrate W in the substrate processing apparatus 201. FIG. 30B is a drawing for describing a pre-dispensing step T1. FIG. 31 is a drawing for describing a hydrophobic agent supplying step E6. FIG. 32 is a drawing for describing a first suctioning step executed after the hydrophobic agent supplying step E6. FIG. 33 is a drawing for describing a connection portion cleaning step P1. FIG. 34 is a drawing for describing a piping cleaning step P2. FIG. 35 is a drawing for describing a second suctioning step P3. FIG. 36 is a drawing for describing a filling step P4.

With reference to FIG. 20 to FIG. 29, a description will be given of an example of the substrate processing executed by the processing unit 202. FIG. 30A to FIG. 36 will be referred whenever necessary. Further, the example of substrate processing may be etching processing or cleaning processing.

A plurality of substrates W contained in one lot (a plurality of substrates W housed in one substrate housing container C (refer to FIG. 20)) are processed in one or the plurality of processing units 202. When the substrate housing container C (refer to FIG. 20) is placed at a load port LP (refer to FIG. 20) of the substrate processing apparatus 201, substrate information which shows information on a lot contained in the substrate housing container C is fed from a host computer to the controller 203. The host computer is a computer which manages a plurality of substrate processing apparatuses installed in a semiconductor manufacturing plant. The controller 203 reads out the flow recipe 309 for the lot concerned from the recipe storage portion 304 on the basis of the substrate information sent from the host computer. Then, the pre-recipe control, the process recipe control and the post recipe control are executed sequentially according to the flow recipe 309.

First, in each of the processing units 202 (refer to FIG. 20), control is performed according to the pre-recipe 307 to execute pre-processing S11 (refer to FIG. 26).

Thereafter, the control according to the process recipe 306 is performed repeatedly, by which substrates W housed in one substrate housing container C are continuously carried in the processing unit 202 one after another and subjected to substrate processing S12 (refer to FIG. 26) in the processing unit 202.

Then, the control according to the process recipe 306 is performed by the predetermined number of times equal to the number of the substrates housed in the substrate housing container C. After the end of processing is executed by the predetermined number of times, the control according to the post recipe 308 is performed in each of the processing units 202 to execute post processing S13 (refer to FIG. 26).

Where the number of times of the process recipe 306 executed which is defined according to the flow recipe 309 is one time, the substrate processing S12 is executed only one time between the pre-processing S11 and the post processing S13. However, where the number of times of the process recipe 306 executed is N (N is an integer greater than two), the substrate processing S12 is executed N times between the pre-processing S11 and the post processing S13. That is, the substrate processing S12 is executed continuously (continuous processing).

A description will be given of the pre-processing S11.

After a series of processing for a previous substrate W, as shown in FIG. 30B, a leading end surface F of the hydrophobic agent is disposed at a standby position SP. The standby position SP is a part of a flow direction set in the right/left direction portion 251b of the common piping 251.

In the pre-processing S11, the controller 203 executes the pre-dispensing step T1, as shown in FIG. 30A. The pre-dispensing step T1 is a step in which the hydrophobic agent present at an interior of the hydrophobic agent supplying piping 255 is drained from the hydrophobic agent supplying piping 255. Where a long period of time has elapsed from the end of a series of processing for the previous substrate W, the hydrophobic agent retained in each interior of the hydrophobic agent supplying piping 255 and the connection portion 252 (the flow space SP1 (refer to FIG. 24)) may undergo a change with time (changed in composition (deterioration) or decreased in temperature). Therefore, prior to the substrate processing S12, the hydrophobic agent retained in each interior of the hydrophobic agent supplying piping 255 and the connection portion 252 is drained from each interior of the hydrophobic agent supplying piping 255 and the connection portion 252 and replaced by a new hydrophobic agent. Thereby, the hydrophobic agent which has undergone a change with time is arranged not to be used in the substrate processing S12.

Specifically, where the pre-dispensing step T1 is executed, the controller 203 opens the hydrophobic agent supplying valve 262 and the drain valve 259 in a state that other valves are closed in the hydrophobic agent supplying unit 210. Thereby, a hydrophobic agent from the hydrophobic agent supplying piping 255 flows into the connection portion 252 and is drained through the drain piping 253.

The pre-dispensing step T1 is ended to end the pre-processing S11.

Next, a description will be given of the substrate processing S12 (refer to FIG. 26). With regard to execution of the substrate processing S12, the process recipe 306 read out from the recipe storage portion 304 (refer to FIG. 26) is referred to constantly.

When the substrate processing S12 is executed, a substrate W which is not processed is carried in the chamber 204 (refer to Step E1 in FIG. 28). The hand H of the transfer robot CR which holds the substrate W is allowed to enter into the chamber 204 and, specifically, the substrate W is delivered to the spin chuck 205, with a front surface thereof (device forming surface) directed upward. Thereafter, the substrate W is held by the spin chuck 205.

Thereafter, the controller 203 controls the spin motor 216 to start rotation of the substrate W (Step E2 in FIG. 28). Rotation of the substrate W is raised up to a predetermined liquid processing speed (in a range of about 10 to 1200 rpm, for example, about 1000 rpm) and kept at the liquid processing speed. The controller 203 also controls the facing member lifting unit 247 to dispose the shielding plate 221 at a proximity position.

After the shielding plate 221 has been disposed at the proximity position, the controller 203 then executes a chemical liquid supplying step E3 (refer to FIG. 28) in which a chemical liquid is supplied to an upper surface of the substrate W. The controller 203 opens the chemical liquid valve 237. Thereby, the chemical liquid is discharged from the first discharge port 231a formed on the substrate facing surface 221a of the shielding plate 221 to a central portion of the upper surface of the substrate W. The chemical liquid supplied to the central portion of the upper surface of the substrate W moves to a peripheral edge portion of the substrate W upon receipt of a centrifugal force resulting from rotation of the substrate W. Thereby, the upper surface of the substrate W is processed in its entirety by the chemical liquid.

When a period defined by the process recipe 306 has elapsed from the start of discharge of the chemical liquid from the first discharge port 231a, the controller 203 closes the chemical liquid valve 237.

Then, the controller 203 executes a rinsing step E4 (refer to FIG. 28) in which a rinse liquid is supplied to the upper surface of the substrate W. Specifically, the controller 203 opens the rinse liquid valve 239. Thereby, the rinse liquid is discharged from the second discharge port 232a formed on the substrate facing surface 221a of the shielding plate 221 to a central portion of the upper surface of the substrate W. The rinse liquid supplied to the central portion of the upper surface of the substrate W moves to a peripheral edge portion of the substrate W upon receipt of a centrifugal force resulting from rotation of the substrate W. Thereby, the chemical liquid on the upper surface of the substrate W is replaced by the rinse liquid.

When a period defined by the process recipe 306 has elapsed from the start of discharge of the chemical liquid from the second discharge port 232a and also a predetermined period has elapsed from the start of discharge of the rinse liquid, the controller 203 closes the rinse liquid valve 239. Thereby, discharge of the rinse liquid from the second discharge port 232a is stopped to end the rinsing step E4.

Then, the controller 203 executes a first organic solvent supplying step E5 (refer to FIG. 28) in which the rinse liquid present on the upper surface of the substrate W is replaced by an organic solvent (for example, IPA).

Specifically, the controller 203 opens the organic solvent valve 243 while rotation of the substrate W is kept at a liquid processing speed. Thereby, the organic solvent is discharged from the fourth discharge port 234a formed on the substrate facing surface 221a of the shielding plate 221 to a central portion of the upper surface of the substrate W. The organic solvent supplied to the central portion of the upper surface of the substrate W moves to a peripheral edge portion of the substrate W upon receipt of a centrifugal force resulting from rotation of the substrate W. Thereby, the rinse liquid on the upper surface of the substrate W is replaced by the organic solvent.

When a period defined by the process recipe 306 has elapsed from the start of discharge of the organic solvent from the fourth discharge port 234a, the controller 203 closes the organic solvent valve 243. Thereby, discharge of the organic solvent from the fourth discharge port 234a is stopped to end the first organic solvent supplying step E5.

Then, the controller 203 executes a hydrophobic agent supplying step E6 (refer to FIG. 28) in which the organic solvent present on the upper surface of the substrate W is replaced by a liquid type hydrophobic agent. Specifically, the controller 203 opens the common valve 260 and the hydrophobic agent supplying valve 262, while keeping the shielding plate 221 at the proximity position and closing other valves in the hydrophobic agent supplying unit 210. Before the start of the hydrophobic agent supplying step E6, the leading end surface F of the hydrophobic agent is disposed at the standby position SP.

The hydrophobic agent from the hydrophobic agent supplying piping 255 is supplied via the connection portion 252 to the common piping 251 by opening of the common valve 260 and the hydrophobic agent supplying valve 262. Thereby, as shown in FIG. 31, the hydrophobic agent is discharged from the third discharge port 233a formed on the substrate facing surface 221a of the shielding plate 221 to a central portion of the upper surface of the substrate W. The hydrophobic agent supplied to the central portion of the upper surface of the substrate W moves to a peripheral edge portion of the substrate W upon receipt of a centrifugal force resulting from rotation of the substrate W. Thereby, the organic solvent on the upper surface of the substrate W is replaced by the hydrophobic agent.

Further, the controller 203 supplies air to the first suction device 261. Thereby, a small amount of the hydrophobic agent which has been suctioned in the first suction device 261 is discharged into the common piping 251.

When a period defined by the process recipe 306 has elapsed from the start of discharge of the hydrophobic agent from the third discharge port 233a in the hydrophobic agent supplying step E6, the controller 203 closes the common valve 260 and the hydrophobic agent supplying valve 262. Thereby, as shown in FIG. 32, discharge of the hydrophobic agent from the third discharge port 233a is stopped. Further, the controller 203 enables the first suction device 261. Thereby, there is suctioned an interior of a portion of the common piping 251 (a portion on the side of the central axis nozzle 207) downstream from a portion in which the first suction device 261 is interposed. And, as shown in FIG. 32, the hydrophobic agent remaining inside the downstream portion thereof is drawn into the first suction device 261 (a region expanded by actuation of a diaphragm) (first suctioning step). An amount of the first suction device 261 which is suctioned is determined so that the leading end surface F of the hydrophobic agent will recede to a predetermined standby position SP set inside the right/left direction portion 251b. An amount of the hydrophobic agent which is suctioned at this time is about 0.1 to 1 milliliter. Thereby, the leading end surface F of the hydrophobic agent after being suctioned is disposed at the standby position SP.

The hydrophobic agent supplying step E is ended on the basis of the stop of discharge of the hydrophobic agent from the third discharge port 233a.

Then, the controller 203 executes a second organic solvent supplying step E7 (refer to FIG. 28) in which the hydrophobic agent present on the upper surface of the substrate W is replaced by an organic solvent (for example, IPA).

Specifically, the controller 203 opens the organic solvent valve 243 while keeping rotation of the substrate W at a liquid processing speed. Thereby, the organic solvent is discharged from the fourth discharge port 234a formed on the substrate facing surface 221a of the shielding plate 221 to a central portion of the upper surface of the substrate W. The organic solvent supplied to the central portion of the upper surface of the substrate W moves to a peripheral edge portion of the substrate W upon receipt of a centrifugal force resulting from rotation of the substrate W. Thereby, the hydrophobic agent on the upper surface of the substrate W is replaced by the organic solvent.

When a period defined by the process recipe 306 has elapsed from the start of discharge of the organic solvent from the fourth discharge port 234a and a predetermined period has elapsed from the start of discharge of the rinse liquid, the controller 203 closes the organic solvent valve 243. Thereby, discharge of the organic solvent from the fourth discharge port 234a is stopped to end the second organic solvent supplying step E7.

Then, there is executed a spin drying step E8 (refer to FIG. 28) in which the substrate W is dried. Specifically, the controller 203 controls the spin motor 216 in a state that the shielding plate 221 is disposed at the proximity position to accelerate the substrate W up to a drying rotational speed (for example, several thousand rpm) faster than a rotational speed in each step of the chemical liquid supplying step E3 to the second organic solvent supplying step E7, thereby rotating the substrate W at the drying rotational speed. Thereby, a large centrifugal force is applied to a liquid on the substrate W and the liquid adhered on the substrate W is spun off to a periphery of the substrate W. As described so far, the liquid is removed from the substrate W to dry the substrate W.

When a predetermined period has elapsed from acceleration of the substrate W, the controller 203 controls the spin motor 216 to stop rotation of the substrate W by the spin chuck 205 (Step E9 in FIG. 28). Thereafter, the controller 203 controls the facing member lifting unit 247 to raise the shielding plate 221 and dispose it at the retracted position.

Thereafter, the substrate W is carried out from an interior of the chamber 204 (Step E10 in FIG. 28). Specifically, the controller 203 allows a hand of the transfer robot CR to enter into the chamber 204. Then, the controller 203 holds the substrate W on the spin chuck 205 by using the hand of the transfer robot CR. Thereafter, the controller 203 allows the hand of the transfer robot CR to retract from the chamber 204. Thereby, the substrate W after being processed is carried out from the chamber 204 to end the substrate processing S12.

Next, a description will be given of the post processing S13.

In the post processing S13, the controller 203 executes at first a connection portion cleaning step P1 (refer to FIG. 29).

In the connection portion cleaning step P1, the controller 203 opens the cleaning liquid supplying valve 267 and the drain valve 259 as shown in FIG. 33 in a state that other valves are closed in the hydrophobic agent supplying unit 210. Thereby, a cleaning liquid from the cleaning liquid supplying piping 257 flows into the connection portion 252. After flowing into the connection portion 252, the cleaning liquid is drained into the drain piping 253. Thereby, the hydrophobic agent present inside the connection portion 252 can be pushed outside the connection portion 252 by using the cleaning liquid.

When a predetermined period (for example, 2 to 3 seconds) has elapsed from opening of the cleaning liquid supplying valve 267 and the drain valve 259, the controller 203 closes the drain valve 259 and also opens the common valve 260, as shown in FIG. 34, while keeping opening the cleaning liquid supplying valve 267. Thereby, the cleaning liquid which has flown into the connection portion 252 is guided to the common piping 251. That is, the connection portion cleaning step P1 is ended to start a piping cleaning step P2 (refer to FIG. 29).

In the piping cleaning step P2, the cleaning liquid which has been guided into the common piping 251 passes through an interior of the common piping 251 and is discharged from the third discharge port 233a. The cleaning liquid flows through the interior of the common piping 251, thereby cleaning the interior of the common piping 251. Further, the controller 203 stops actuation of the first suction device 261. Thereby, a small amount of the hydrophobic agent which has been suctioned by the first suction device 261 is discharged to the common piping 261. When a predetermined period has elapsed from opening of the common valve 260, the cleaning liquid supplying valve 267 is closed to end the piping cleaning step P2.

Then, the second suctioning step P3 (refer to FIG. 29) is executed.

In the second suctioning step P3, as shown in FIG. 35, the controller 203 opens the suction valve 263 and the common valve 260 in a state that a function of the second suction device 264 is enabled by opening of the fluid supplying valve 266, thereby suctioning an interior of the suction piping 256. Thereby, the cleaning liquid retained inside the connection portion 252 and the cleaning liquid retained inside the common piping 251 are thoroughly suctioned by the second suction device 264. In the second suctioning step P3, suctioning is performed by using the second suction device 264 composed of an ejector device, etc. Therefore, suctioning can be performed over a long distance and in a short time as well. When a predetermined period has elapsed from opening of the suction valve 263, the cleaning liquid supplying valve 267 is closed.

Then, the controller 203 executes a filling step P4 (refer to FIG. 29). The filling step P4 is a step in which a hydrophobic agent is filled (supplied) in the common piping 251, thereby disposing the leading end surface F at the standby position SP. Specifically, in the filling step P4, the controller 203 opens the common valve 260 and the hydrophobic agent supplying valve 262 in a state that other valves are closed in the hydrophobic agent supplying unit 210. The hydrophobic agent from the hydrophobic agent supplying piping 255 is supplied via the connection portion 252 to the common piping 251 by opening of the common valve 260 and the hydrophobic agent supplying valve 262. When a predetermined period has elapsed from opening of the hydrophobic agent supplying valve 262, the controller 203 closes the hydrophobic agent supplying valve 262. Thereby, as shown in FIG. 36, the leading end surface F of the hydrophobic agent is disposed at the standby position SP.

The post processing S13 is ended when the filling step P4 is ended.

As described so far, according to the second preferred embodiment, in the suctioning step, the hydrophobic agent present inside the common piping 251 is suctioned and the leading end surface F of the hydrophobic agent is allowed to recede. As the suctioning step, there are selectively executed a first suctioning step (refer to FIG. 32) in which the leading end surface F of the hydrophobic agent is disposed at the standby position SP and a second suctioning step P3 in which the leading end surface F of the hydrophobic agent is allowed to recede from an upstream end of the connection portion 252.

An amount of the suctioned hydrophobic agent (an amount thereof to be drained) is decreased further significantly in the first suctioning step than in the second suctioning step P3. Therefore, as compared with a case where the second suctioning step P3 is executed throughout the suctioning step, it is possible to reduce consumption of the hydrophobic agent. The first suctioning step may be executed where the hydrophobic agent inside the common piping 251 can be used in the subsequent substrate processing S12. And, the second suctioning step P3 may be executed where the hydrophobic agent inside the common piping 251 cannot be used in the subsequent substrate processing S12. Thereby, the leading end surface F of the hydrophobic agent inside the common piping 251 is allowed to recede, with the hydrophobic agent reduced in consumption.

As described so far, it is possible to suction the hydrophobic agent inside the common piping 251 while reducing consumption of the hydrophobic agent.

Further, since suctioning is performed by using the first suction device 261 which is a diaphragm type suction device in the first suctioning step (refer to FIG. 32), it is possible to accurately control the leading end surface F of the hydrophobic agent after the suctioning.

Further, in the second suctioning step P3, suctioning is performed by using the second suction device 264 which is composed of an ejector device, etc. Therefore, it is possible to perform suctioning over a long distance and also in a short time as well.

Still further, during continuous processing (the substrate processing S12 is performed continuously), the first suctioning step is executed as a suctioning step. On the other hand, in the post processing S13 which is executed after the continuous processing, the second suctioning step P3 is executed.

During the continuous processing, the substrate processing S12 is executed continuously. Thus, there is no chance that the hydrophobic agent is retained inside the common piping 251 for a long period of time. Therefore, in view of reduction in consumption of the hydrophobic agent and/or in view of suppression of a decrease in throughput, during the continuous processing, the first suctioning step is executed and the leading end surface F of the hydrophobic agent after being suctioned is disposed at the standby position.

On the other hand, there may be a case where a long period of time is needed until the subsequent pre-processing S11 after the post processing S13. If a hydrophobic agent is retained for a long period of time continuously inside the common piping 251 and the connection portion 252, the hydrophobic agent may be changed with time or decreased in temperature. It is impossible to use the hydrophobic agent which undergoes a change with time or the hydrophobic agent which is decreased in temperature in the subsequent substrate processing S12. Thus, suctioning is performed in the post processing S13. As the suctioning, the second suctioning step P3 is executed. Therefore, after the end of the post processing S13, an interior of the common piping 251 and an interior of the connection portion 252 are kept empty.

As described so far, a description has been given of two preferred embodiments of the present invention. The present invention may be further carried out in other preferred embodiments.

For example, in the first preferred embodiment, the second supply/suction unit 15 and the third supply/suction unit 16 may be each provided with a chemical liquid/rinse liquid suction device (suction device) 122 and a flow-rate adjusting valve 123, as with the modified example shown in FIG. 19.

Further, in the first supply/suction unit 14 of the first preferred embodiment, as the first suction device, a diaphragm type suction device may be adopted. In the second and/or the third supply/suction units 15, 16, as the first suction device, a siphon type suction device may be adopted.

A description has been given of a case where the supply/suction units 14, 15, 16 are provided respectively to correspond to the three nozzle pipings 9, 11, 13. However, only one supply/suction unit may be provided on at least one of the three nozzle pipings 9, 11 and 13.

Further, with regard to the first to third supply/suction units 14, 15, 16, a description has been given of an example of the arrangement where the processing liquid supplying units and the processing liquid suction units are connected in parallel respectively via the connection portions 44, 64 and 84. Obviously, the processing liquid supplying units may not be connected in parallel with the suction units.

Further, in the first preferred embodiment, a description has been given of the processing liquid piping where the discharge ports 8, 10, 12 are formed on the substrate facing surface 29. It is possible to install a single nozzle which is not incorporated into the shielding plate 27. In this case as well, it is preferable that a discharge port of the nozzle is arranged to be immovable in a right/left direction (that is, a direction along a front surface of a substrate W).

Further, in the first preferred embodiment, the organic solvent is not limited to IPA but includes at least one of IPA, methanol, ethanol, HFE (hydrofluoroether) and acetone. Still further, the organic solvent may not only be that which is constituted with a single component but may also be a liquid mixed with another component. For example, the organic solvent may be a mixed liquid of IPA and acetone or a mixed liquid of IPA and methanol.

Further, in the second preferred embodiment, a diaphragm type suction device has been cited as the first suction device 261. Instead, a siphon type suction device may be adopted. The siphon type suction device has a piping and suctions (drains) a hydrophobic agent inside the common piping 251 by utilizing the principle of a siphon in a state that an interior of the piping is filled with the liquid. In the siphon type suction device, energy consumption for suction is suppressed.

Further, in the second preferred embodiment, a description has been given of a case where the cleaning step executed prior to the second suctioning step P3 includes both the connection portion cleaning step P1 and the piping cleaning step P2. The cleaning step will be, however, sufficient if at least one of them is included. The cleaning step may not be executed, prior to the second suctioning step P3.

A description has been given of a case where the second suctioning step P3 is executed in the post processing S13. However, the second suctioning step P3 may be executed in the pre-processing S11. In this case, the second suctioning step P3 may be executed before or after the pre-dispensing step T1. In this case, in the pre-processing S11, it is possible to remove a hydrophobic agent remaining inside the common piping 251 and a hydrophobic agent remaining inside the hydrophobic agent supplying piping 255. It is therefore possible to reliably prevent a hydrophobic agent which is changed with time or decreased in temperature from being supplied to a substrate W at the start of the substrate processing S12.

Further, the second suctioning step P3 may be executed both in the post processing S13 and in the pre-processing S11.

Further, in the second preferred embodiment, the process recipe 306 is executed one time, thus making it possible to execute the second suctioning step P3 after each substrate processing S12 or before each substrate processing S12.

Further, in the second preferred embodiment, the second suctioning step P3 may not be executed in the pre-processing S11 defined by the pre-recipe 307 and/or in the post processing S13 defined by the recipe 308, but may be executed in the substrate processing S12 defined by the process recipe 306, instead.

In this case, the first suctioning step may be defined in the suctioning step where the process recipe 306 is executed in such a period that a period from the end of the previous discharge of a hydrophobic agent from the discharge port 233a to the start of the following discharge thereof will be shorter than a predetermined period. Further, the second suctioning step P3 may be defined in the suctioning step where the process recipe 306 is executed in such a period that a period from the end of the previous discharge of a hydrophobic agent from the discharge port 233a to the start of the following discharge will be longer than a predetermined period.

Further, in the second preferred embodiment, the chemical liquid supplying unit 208, the rinse liquid supplying unit 209 and the organic solvent supplying unit 211 may be arranged so as to be similar to the hydrophobic agent supplying unit 210 as shown in FIG. 24. Then, in this case, the units 208, 209, 211 may execute selectively the first suctioning step and the second suctioning step P3. That is, the processing liquid to be suctioned is not limited to a hydrophobic agent but may be other processing liquids (a chemical liquid, a rinse liquid, an organic solvent, etc.). Further, as the cleaning liquid, there is adopted a liquid type corresponding to the processing liquid to be suctioned.

Further, in the second preferred embodiment, a description has been given of the common piping with the discharge ports (discharge ports 231a to 234a) which are formed on the substrate facing surface 21a. It is also possible to provide a single nozzle which is not incorporated into the shielding plate 221. In this case as well, if the discharge port of the nozzle is arranged to be immovable in a right/left direction (that is, a direction along a front surface of a substrate W), the nozzle can be favorably used in the present invention.

Further, in the previously described preferred embodiment, a description has been given of the substrate processing apparatus 1 or 201 which is an apparatus for processing a disk-shaped substrate W. The substrate processing apparatus 1 or 201 may be an apparatus for processing polygonal substrates such as glass substrates for liquid crystal display devices.

The present application corresponds to each of Japanese Patent Application No. 2016-184085 filed on Sep. 21, 2016 in the Japan Patent Office and Japanese Patent Application No. 2017-129559 filed on Jun. 30, 2017 in the Japan Patent Office, and the entire disclosure of these applications are incorporated herein by reference.

REFERENCE SIGNS LIST

1: Substrate processing apparatus
3: Controller
5: Spin chuck (substrate holding unit)
8: First discharge port (discharge port)
9: First nozzle piping
10: Second discharge port (discharge port)
11: Second nozzle piping
12: Third discharge port
13: Third nozzle piping
14: First suction unit (processing liquid supplying unit, suction unit)
15: Second suction unit (processing liquid supplying unit, suction unit)
16: Third suction unit (processing liquid supplying unit, suction unit)
55: First chemical liquid/rinse liquid suction device (first suction device)
57: Second chemical liquid/rinse liquid suction device (second suction device)
75: First organic solvent suction device (first suction device)
77: Second organic solvent suction device (second suction device)
95: First front surface improving agent suction device (first suction device)
97: Second front surface improving agent suction device (second suction device)
122: First chemical liquid/rinse liquid suction device (first suction device)
122: Chemical liquid/rinse liquid suction device
123: Flow-rate adjusting valve (suction force adjusting unit)
201: Substrate processing apparatus
203: Controller
208: Chemical liquid supplying unit
209: Rinse liquid supplying unit
210: Hydrophobic agent supplying unit
221: Shielding plate
221a: Substrate facing surface
231a: First discharge port
232a: Second discharge port
233a: Third discharge port
234a: Fourth discharge port
251: Common piping
252: Connection portion
255: Hydrophobic agent supplying piping
256: Suction piping
261: First suction device
264: Second suction device
SP1: Flow space
W: Substrate

What is claimed is:

1. A substrate processing method which is executed by a substrate processing apparatus including a processing liquid piping that is communicatively connected with a discharge port,
the substrate processing method comprising:
a processing liquid supplying step which supplies a processing liquid to the processing liquid piping in order to discharge the processing liquid from the discharge port; and
a suctioning step which suctions a processing liquid present inside the processing liquid piping; wherein
the suctioning step includes a first suctioning step in which a leading end surface of the processing liquid is allowed to recede, thereby disposing the leading end surface of the processing liquid after being suctioned at a predetermined standby position inside the processing liquid piping and a second suctioning step in which the leading end surface of the processing liquid is allowed to recede substantially further than the standby position,
the first suctioning step is a step which is executed where a period from an end of discharge of the processing liquid from the discharge port to a start of the following discharge is shorter than a predetermined period, and
the second suctioning step is a step which is executed where a period from an end of discharge of the processing liquid from the discharge port to a start of the following discharge is longer than a predetermined period.

2. The substrate processing method according to claim 1 in which the substrate processing apparatus further includes a connection portion that is connected to the processing liquid piping and provided internally with a flow space through which a liquid flows, wherein
the second suctioning step includes a step in which the leading end surface of the processing liquid is allowed to recede from an upstream end of the connection portion.

3. The substrate processing method according to claim 1, wherein
the first suctioning step includes a step which suctions the processing liquid inside the processing liquid piping by a predetermined suction force, and
the second suctioning step includes a step which suctions the processing liquid inside the processing liquid piping by a suction force greater than that of the first suctioning step.

4. The substrate processing method according to claim 1, wherein
the first suctioning step is a step which is executed during a continuous processing in which substrate processing continues on a plurality of substrates by using the processing liquid discharged from the discharge port, and
the second suctioning step is a step which is executed before the continuous processing and/or after the continuous processing.

5. The substrate processing method according to claim 1, wherein
the first suctioning step is a step which is executed by using the processing liquid discharged from the discharge port during a single substrate processing which is a substrate processing on a single substrate, and
the second suctioning step is a step which is executed before the single substrate processing and/or after the single substrate processing.

6. The substrate processing method according to claim 1 which further includes an elapsed period measurement step which measures an elapsed period of the stop of discharge of the processing liquid from the discharge port, wherein
the first suctioning step is a step which is executed where the elapsed period is shorter than the predetermined period, and
the second suctioning step is a step which is executed where the elapsed period is longer than the predetermined period.

7. A substrate processing method which is executed by a substrate processing apparatus including a processing liquid piping that is communicatively connected with a discharge port,
the substrate processing method comprising:
a processing liquid supplying step which supplies a processing liquid to the processing liquid piping in order to discharge the processing liquid from the discharge port; and
a suctioning step which suctions a processing liquid present inside the processing liquid piping; wherein
the suctioning step includes a first suctioning step in which a leading end surface of the processing liquid is allowed to recede, thereby disposing the leading end surface of the processing liquid after being suctioned at a predetermined standby position inside the processing liquid piping and a second suctioning step in which the leading end surface of the processing liquid is allowed to recede substantially further than the standby position,
wherein the first suctioning step is a step which is executed during a continuous processing in which substrate processing continues on a plurality of substrates by using the processing liquid discharged from the discharge port, and
the second suctioning step is a step which is executed before the continuous processing and/or after the continuous processing.

8. The substrate processing method according to claim 7 in which the substrate processing apparatus further includes a connection portion that is connected to the processing liquid piping and provided internally with a flow space through which a liquid flows, wherein
the second suctioning step includes a step in which the leading end surface of the processing liquid is allowed to recede from an upstream end of the connection portion.

9. The substrate processing method according to claim 7, wherein
the first suctioning step includes a step which suctions the processing liquid inside the processing liquid piping by a predetermined suction force, and
the second suctioning step includes a step which suctions the processing liquid inside the processing liquid piping by a suction force greater than that of the first suctioning step.

* * * * *